US005589802A

United States Patent [19]
O'Shaughnessy et al.

[11] Patent Number: 5,589,802
[45] Date of Patent: Dec. 31, 1996

[54] CIRCUIT FOR DETECTING THE ABSENCE OF AN EXTERNAL COMPONENT

[75] Inventors: Timothy G. O'Shaughnessy, Blackforest, Colo.; David G. Brown, Pocatello, Id.

[73] Assignee: American Microsystems, Inc., Pocatello, Id.

[21] Appl. No.: 479,302

[22] Filed: Jun. 7, 1995

[51] Int. Cl.$^6$ .......................... G01R 27/14; G01R 27/26; H03K 3/0231; H03B 5/20

[52] U.S. Cl. .............................. 331/44; 331/65; 331/111; 331/143; 324/548; 324/549

[58] Field of Search .............................. 331/44, 111, 143, 331/65; 324/537, 548, 549

[56] References Cited

U.S. PATENT DOCUMENTS

| | | | |
|---|---|---|---|
| 4,998,075 | 3/1991 | Patton, III et al. | 331/2 |
| 5,017,919 | 5/1991 | Hull et al. | 341/136 |
| 5,175,859 | 12/1992 | Miller et al. | 395/800 |

OTHER PUBLICATIONS

S. M. Sze, "Physics of Semiconductor Devices", ©1969, Fig. 20. John Wiley & Sons, New York.

Primary Examiner—Siegfried H. Grimm
Attorney, Agent, or Firm—Skjerven, Morrill, MacPherson, Franklin & Friel; Ken J. Koestner

[57] ABSTRACT

A component detector circuit operates to detect the presence or absence of a circuit component, such as an external component. A resistor detecting circuit includes a biasing circuit connected to the resistor. The biasing circuit generating a bias current. The resistor detecting circuit also includes a bias current threshold detector connected to the biasing circuit and a circuit connected to the bias current threshold detector which generates a signal indicative that the bias current is lower than threshold. A capacitor detecting circuit includes a circuit connected to a resistor and configured to be connected to a capacitor which establishes a time constant proportional to an RC product of the resistor and capacitor. The capacitor detecting circuit also includes a circuit which determines whether the time constant is within a range of appropriate time constants and a circuit which generates a signal indicative that the time constant is outside the range of appropriate time constants, which indicates that the capacitor is disconnected.

30 Claims, 32 Drawing Sheets

| FIG. 5A-1 | FIG. 5A-2 |

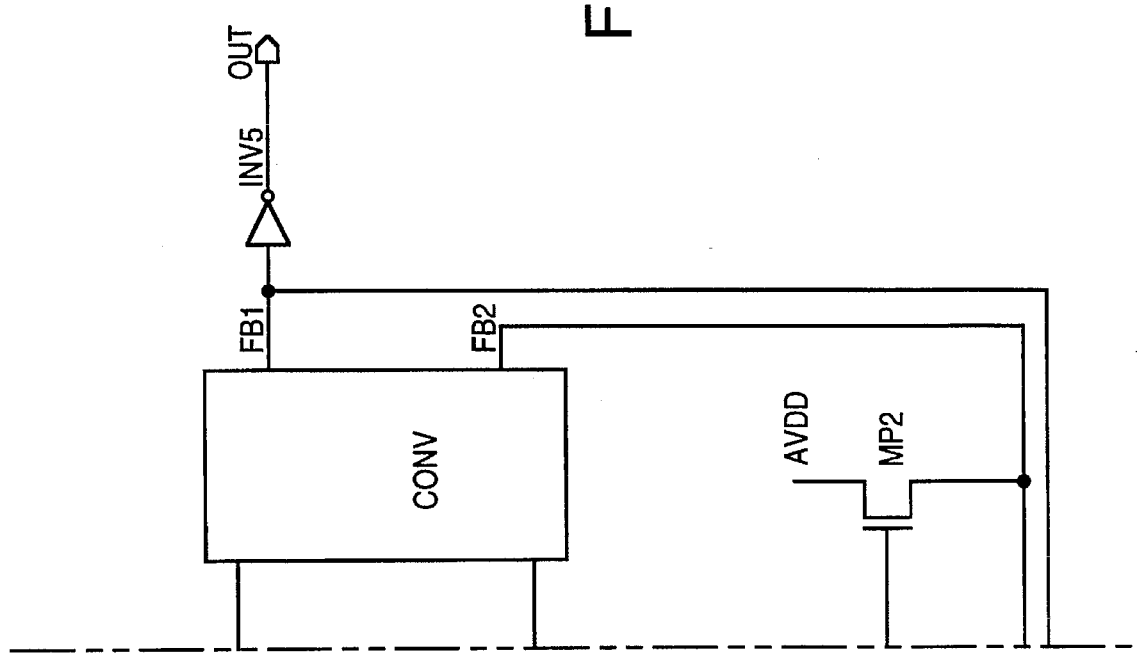

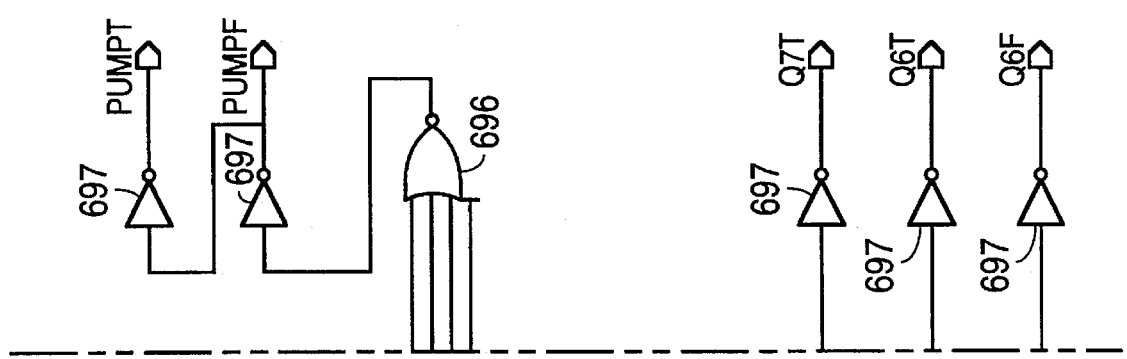

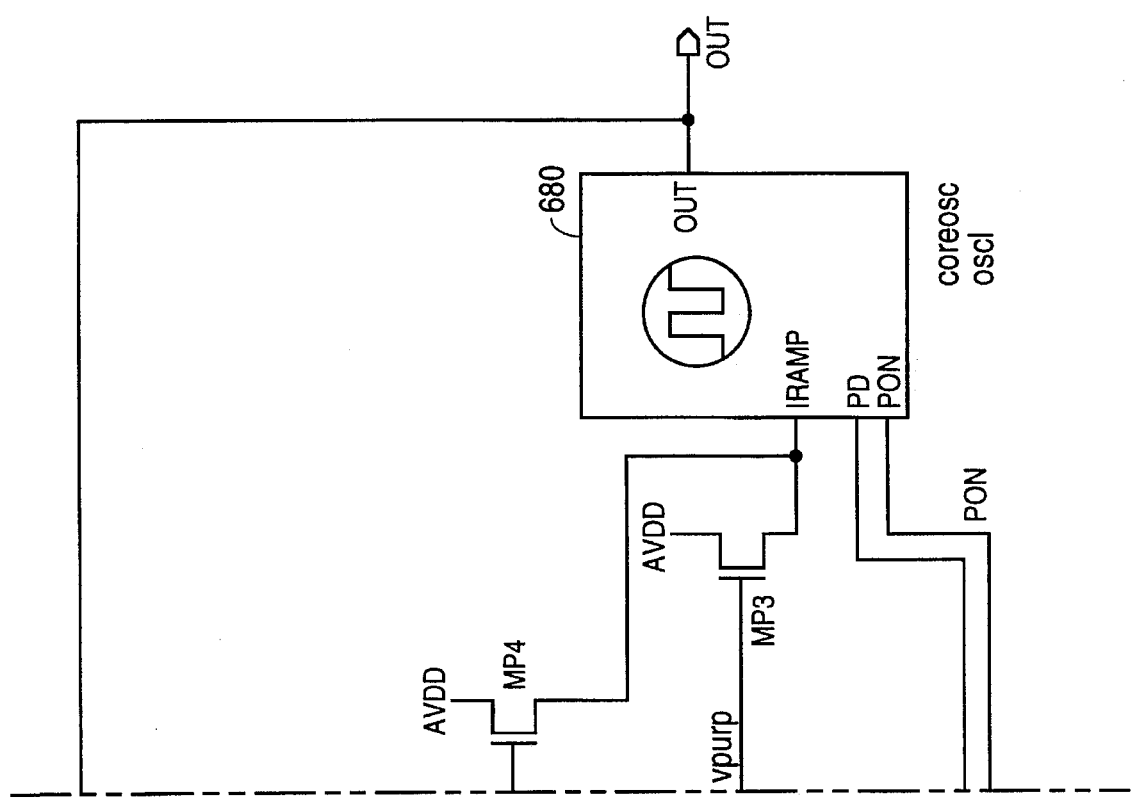

CIRCUIT FOR DETECTING THE ABSENCE OF AN EXTERNAL COMPONENT

RELATED PATENT APPLICATIONS

The present invention is related to subject matter which is disclosed in:

U.S. patent application Ser. No. 08/479,304 filed on the same day as the present patent application (Timothy G. O'Shaughnessy and David Brown, "A Self-Calibrating RC Oscillator", Attorney Docket Number M-3173), U.S. patent application Ser. No. 08/479,303 filed on the same day as the present patent application (Timothy G. O'Shaughnessy and David Brown, "A Low Power RC Oscillator Using a Low Voltage Bias Circuit", Attorney Docket Number M-3340), U.S. patent application Ser. No. 08/479,301 filed on the same day as the present patent application (Timothy G. O'Shaughnessy and David Brown, "A Circuit for Externally Overdriving an Internal Clock", Attorney Docket Number M-3342), U.S. patent application Ser. No. 08/479,300 filed on the same day as the present patent application (Timothy G. O'Shaughnessy and David Brown, "A Timing Circuit with Rapid Initialization on Power-up", Attorney Docket Number M-3343), U.S. patent application Ser. No. 08/479,299 filed on the same day as the present patent application (Timothy G. O'Shaughnessy and David Brown, "A Digitally-Tuned Oscillator Including a Self-Calibrating RC Oscillator Circuit", Attorney Docket Number M-3344), and U.S. patent application Ser. No. 08/479,298 filed on the same day as the present patent application (Timothy G. O'Shaughnessy and David Brown, "Multiple Stage Tracking Filter using a Self-Calibrating RC Oscillator Circuit", Attorney Docket Number M-3345).

FIELD OF INVENTION

The present invention relates to the field of electronic circuits such as integrated circuits and more particularly to circuits for detecting the presence or absence of a circuit component.

BACKGROUND OF THE INVENTION

Many electronic circuits, such as integrated circuits, include various external components which are connected to the circuits during fabrication of a device. External components are often used, for example, to furnish selectivity of device performance. In other circumstances, an integrated circuit utilizes external components because integrated components cannot furnish suitable parametric values such as resistances and capacitances. Furthermore, some devices employ adjustable components which cannot be supplied in an integrated device.

A problem arises when an external component is not connected to the circuit. This problem can occur when an external component fails or when an external component is inadvertently omitted from connection to the device.

When an external component is missing, the circuit generally fails to operate in the intended manner. In some conditions, an external component may cause a circuit to fail. Occasionally, a dangerous condition arises when a component is missing.

What is needed is a circuit that detects the presence or absence of a component and generates a signal indicative of the absence of the component.

SUMMARY OF THE INVENTION

In accordance with a first embodiment of the invention, a resistor detecting circuit includes a biasing circuit connected to the resistor. The biasing circuit generating a bias current. The resistor detecting circuit also includes a bias current threshold detector connected to the biasing circuit and a circuit connected to the bias current threshold detector which generates a signal indicative that the bias current is lower than threshold.

In accordance with a second embodiment of the invention, a capacitor detecting circuit includes a circuit connected to a resistor and configured to be connected to a capacitor which establishes a time constant proportional to an RC product of the resistor and capacitor. The capacitor detecting circuit also includes a circuit which determines whether the time constant is within a range of appropriate time constants and a circuit which generates a signal indicative that the time constant is outside the range of appropriate time constants so that the capacitor is disconnected.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
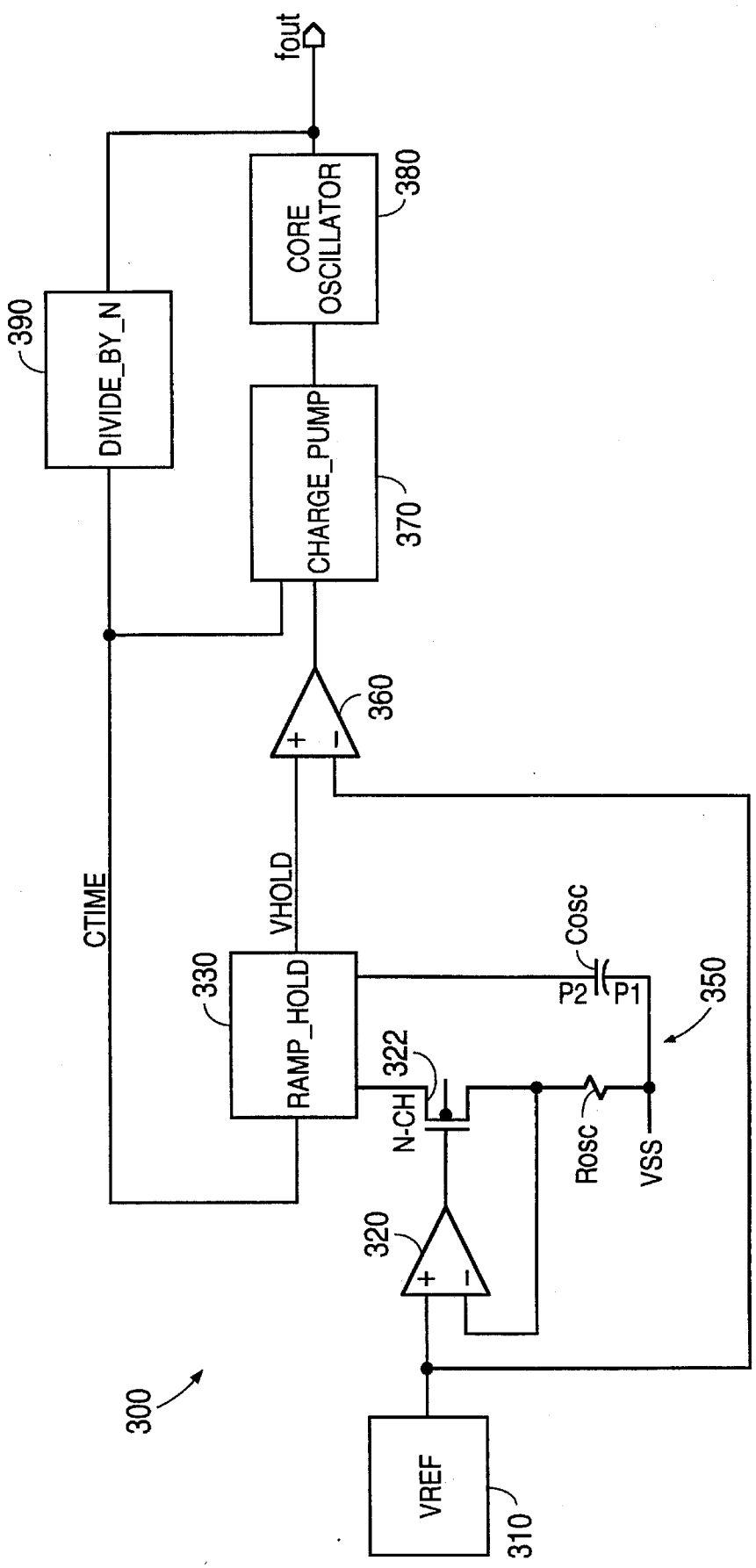
FIG. 1 illustrates a functional block diagram of an embodiment of a self-calibrating RC oscillator circuit.

Referring to FIG. 1, a functional block diagram of an embodiment of a self-calibrating RC oscillator circuit 300 includes a voltage reference block 310, an operational amplifier 320, a ramp and hold circuit 330, an RC network 350, a comparator 360, a charge pump circuit 370, a core oscillator 380 and a divide-by-N binary counter 390. The RC network 350 includes a resistor Rosc and a capacitor Cosc. The RC oscillator circuit 300 has no phase comparator and, thus, fundamentally differs from a phase-locked loop (PLL). Furthermore, the RC oscillator circuit 300 uses no input frequency reference signal and, therefore, is not a frequency-locked loop (FLL).

The RC oscillator circuit 300 is constructed on an integrated circuit chip. In some embodiments, the RC oscillator circuit 300 includes multiple lines for controlling the oscillator to precisely trim the current to a desired accuracy. The voltage reference block 310 applies a voltage reference VREF to a noninverting input terminal of the operational amplifier 320. An output terminal of the operational amplifier 320 is connected to the gate of an N-channel MOS transistor 322, which has a source terminal connected through the resistor Rosc of the RC network 350 to a VSS (ground) reference. The source terminal of the N-channel MOS transistor 322 is connected to an inverted input terminal of the operational amplifier 320. Connected in this manner, operational amplifier 320 drives the N-channel MOS transistor 322 which, when connected in series with the resistor Rosc, forms a voltage-to-current converter having a current applied to the ramp and hold circuit 330.

The ramp and hold circuit 330 is connected to a control line Ctime from divide-by-N binary counter 390 and generates an output analog signal Vhold which is applied to the noninverting input terminal of analog comparator 360. Furthermore, ramp and hold circuit 330 has one terminal connected to the voltage-to-current converter formed by N-channel CMOS transistor 322 and resistor Rosc. The ramp and hold circuit 330 has a second terminal connected to capacitor Cosc for charging capacitor Cosc. The ramp and hold circuit 330 operates essentially as a current mirror which mirrors a current equal to VREF/Rosc to the capacitor Cosc, causing capacitor Cosc to charge in a substantially linear manner with time in accordance with the equation dV/dt=I/C. Thus, for a particular amount of charging time, capacitor Cosc is charged to a voltage having a particular value. The charging time is controlled by a time duration signal on control line Ctime and applied to the ramp and hold circuit 330 by the divide-by-N binary counter 390. The divide-by-N binary counter 390 receives a timing signal from the core oscillator 380 and derives the time duration signal on control line Ctime by counting clock pulses of the timing signal and dividing down this count by a preselected denominator. When a selected time duration has transpired, Ctime signal stops the charging of the capacitor Cosc. Generally, if the frequency of the core oscillator 380 decreases, capacitor Cosc charges for a longer time duration to higher voltages. If the core oscillator 380 frequency increases, capacitor Cosc charges for a shorter time to a lower voltage. The ramp and hold circuit 330 applies the voltage on capacitor Cosc to the analog comparator 360. Analog comparator 360 compares the Vhold voltage to the reference voltage VREF, which is received from the voltage reference block 310 at the inverting terminal of the analog comparator 360.

The analog comparator 360 generates a high or low value which is applied to the charge pump circuit 370. The signal from the analog comparator 360 ultimately depends on the frequency of operation of core oscillator 380 and is used to determine whether to pump up or pump down the charge pump circuit 370. The analog comparator 360 and charge pump circuit 370 act in combination to adjust the core oscillator 380 in a self-correcting manner using negative feedback. A voltage signal generated by the charge pump circuit 370 drives the core oscillator 380.

The core oscillator 380 generates the output signal of the RC oscillator 300 on frequency output line Fout and drives the divide-by-N binary counter 390. In the illustrative embodiment, the core oscillator 380 is a voltage-controlled oscillator (VCO). In other embodiments, a current-controlled oscillator (CCO) is utilized. A suitable CCO is better disclosed in U.S. patent application No. 08/379,049, entitled "A FREQUENCY CONVERTER UTILIZING A FEEDBACK CONTROL LOOP", O'Shaughnessy, T. G. et al., filed Jan. 27, 1995 (Attorney docket Number M-3174), which is herein incorporated by reference in its entirety. With respect to one aspect, the VCO embodiment is preferred because the output signal of the charge pump 370 is a voltage so that a CCO implementation would require an additional voltage to current converter circuit.

Thus, RC oscillator circuit 300 functions by comparing two voltages - a reference voltage which is supplied as an input signal and a frequency-derived voltage signal indicative of the operating frequency of the core oscillator 380. The core oscillator 380 produces a timing signal of pulses which oscillates at a determined frequency. The timing signal of pulses is frequency-divided by the divide-by-N binary counter 390. The frequency-divided timing signal from the binary counter 390 drives the ramp and hold circuit 330 and the integrating charge pump 370. The ramp and hold circuit 330 generates a current signal which is proportional in amplitude to the reference voltage. The current signal is mirrored to the capacitor Cosc.

Following initialization, the capacitor Cosc charges until the start of a "hold" interval which is controlled by the time duration signal on control line Ctime. If the frequency of the timing signal generated by the core oscillator 380 is low, the capacitor Cosc charges to a "hold" voltage Vhold that exceeds the reference voltage Vref. The output signal of analog comparator 360 then activates the charge pump 370 to increase the input voltage to the core oscillator 380. The core oscillator 380 then increases the frequency of the timing signal of pulses. A high frequency of the VCO-generated timing signal produces a low "hold" voltage. The comparator 360 activates the charge pump 370 to decrease the input voltage to the core oscillator 380.

The RC oscillator circuit 300 is ratiometric so that: (1) the current Iramp charging the capacitor Cosc, (2) the ramp rate dV/dt, (3) the resulting "hold" voltage Vhold, and (4) the oscillator frequency Fosc are derived in accordance with the following equations:

$$Iramp = m \times (Vref/Rosc) \quad (1)$$

$$dV/dt = (m \times Vref)/(Rose * Cosc) \quad (2)$$

$$Vhold = (m \times Vref \times Tramp)/(Rosc * Cosc) \quad (3)$$

$$Fosc = (M \times N)/(Rose * Cosc) \quad (4)$$

where Iramp is the current charging the capacitor Cosc, m is the current mirror ratio, Rosc and Cosc are, respectively, the resistance and capacitance which are predefined for usage in the RC oscillator circuit 300 for setting the operating frequency. Furthermore, Vref is the internal reference voltage, Vhold and Tramp are, respectively, the hold voltage and time of the charging interval of the ramp and hold circuit 330, N is the divide-by ratio of the binary counter 390 and Fosc is the output frequency of the core oscillator 380.

The voltage reference VREF generated by the voltage reference block 310 is used for two functions. First, VREF is used to produce the current for charging the capacitor Cosc. Second, VREF is applied to the inverting input terminal of the analog comparator 360 for comparing to the Vhold signal in the RC oscillator 300 feedback loop. Notice in equation (3) above that Vhold is obtained from multiplying VREF with a parameter. Thus in the comparison of Vhold to VREF by analog comparator 360, VREF cancels so that the circuit is theoretically independent of the value of the reference voltage for purposes of determining the frequency of the RC oscillator 300. This theoretical lack of constraints on the value of VREF allows some circuit simplification. However, in practice, the analog comparator 360 has some offset voltage which contributes an additive error voltage to the input voltage level VREF. Thus, VREF is set to a sufficiently large amplitude to overwhelm the offset error.

The frequency of the core oscillator 380 establishes a "hold" voltage at the output terminal of the ramp and hold circuit 330. The hold voltage and a reference voltage from the voltage reference block 310 are applied to the input of the analog comparator 360. If the hold voltage is less than the reference voltage, the frequency is high. The comparator output then drives the charge pump 370 to produce a lower voltage for application to the input terminal of the core oscillator 380, which reduces the frequency of the core oscillator 380. If the frequency of the core oscillator 380 is low, the hold frequency increases, the comparator 360 drives the charge pump 370 to produce a larger voltage at the input terminal of the core oscillator 380, which increases the oscillator frequency.

RC oscillator circuit 300 samples its operating clock period, compares the sampled clock period to the sample period of RC network 350, and generates a negative feedback signal that corrects for variations in delay which result from changes in temperature, power supply voltage and variable process parameters.

RC oscillator circuit 300 includes several features that facilitate high performance. For example, the analog signal processing within the RC network 350, the analog comparator 360 and the charge pump circuit 370 operate under control of timing signals applied at a divided frequency of Fosc/N. This lower-frequency operation allows adequate settling time for transient signals within these analog circuits and, therefore, permits a very accurate comparison between the Vhold and Vref voltages.

In addition, scaling of the frequency by the binary counter 390 makes the time constant of the capacitor Cosc relatively larger with respect to the timing interval of the RC oscillator circuit 300. As a result, the capacitor Cosc becomes sufficiently large to be insensitive to charge injection and parasitic capacitances.

Various embodiments of the RC oscillator circuit 300 include different implementations of the RC network 350. For example, some embodiments of the RC oscillator circuit 300 are fully monolithic, having no external elements. In a completely monolithic embodiment, no pins are furnished for connection to external elements and the RC oscillator circuit 300 uses a polysilicon resistor array (not shown) that is trimmed to set the operating frequency. In a one-pin embodiment of the RC oscillator circuit 300, the capacitor Cost is furnished using the chip dielectric of the integrated circuit. The one-pin RC oscillator 300 uses an external resistor Rosc and furnishes an option to trim out process variations of capacitance. In a two-pin embodiment of the RC oscillator 300, both the resistance of resistor Rosc and the capacitance of capacitor Cost are furnished by external frequency-setting elements. The RC oscillator circuit 300 automatically corrects for changes in circuit delay resulting from variability in temperature, power supply voltage and MOS process parameters.

Figure 2:
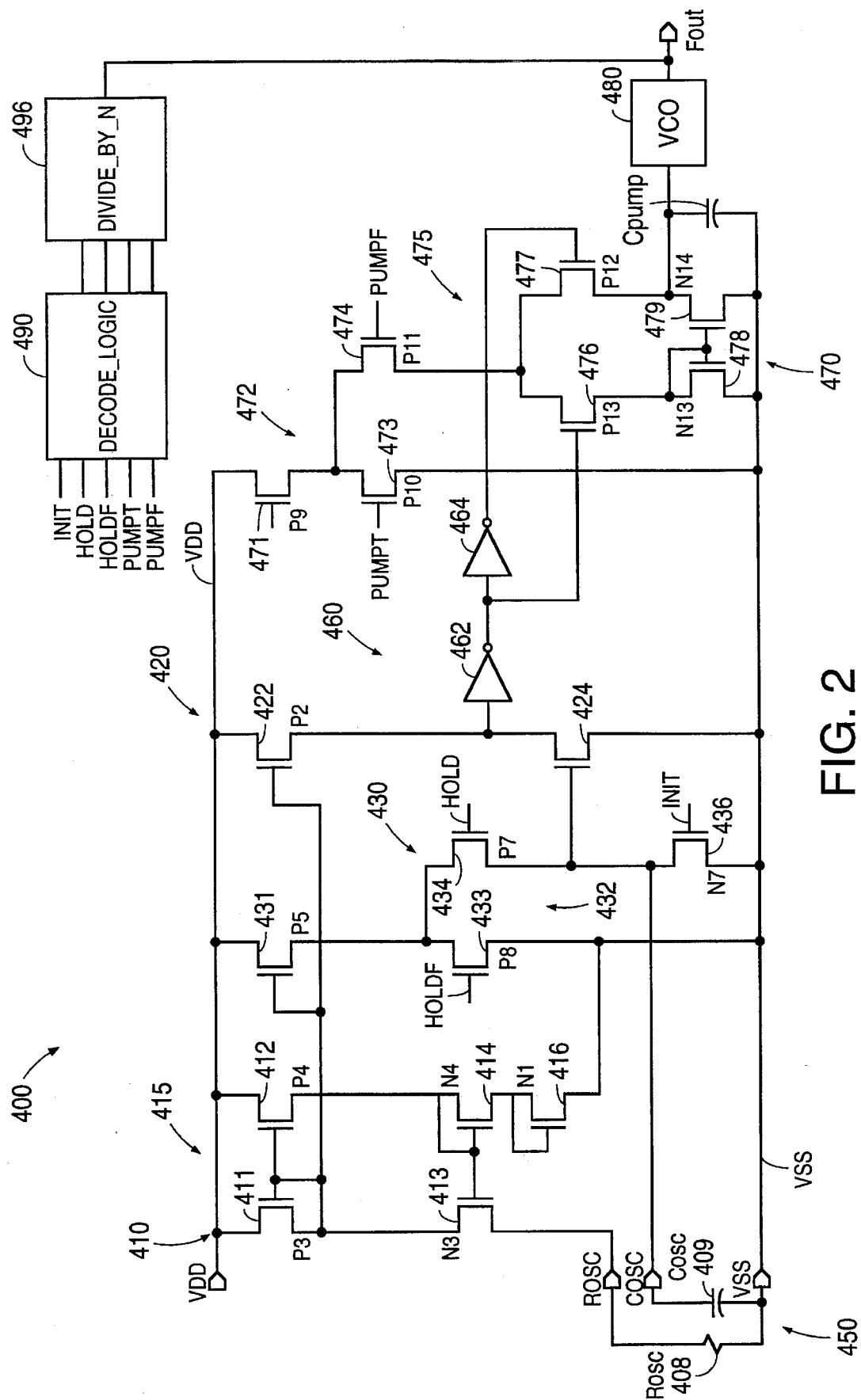
FIG. 2 depicts a transistor-level schematic diagram of an embodiment of the self-calibrating RC oscillator circuit.

Referring to FIG. 2, a transistor-level schematic diagram of an embodiment of the self-calibrating RC oscillator circuit 400 shows a bias circuit 410, an inverter 420, a ramp and hold circuit 430, an RC network 450, an analog comparator 460, a charge pump circuit 470, a voltage-controlled oscillator (VCO) 480, a decode logic circuit 490 and a divide-by-N circuit 496.

The bias circuit 410 generates a reference current conducting through resistor Rosc 408 that is equal to VREF/Rosc and is therefore functionally similar to the voltage reference block 310 and operational amplifier 320 shown in FIG. 1. Single input analog comparator 460 includes input inverter 420 and CMOS inverter 462 and 464. Input inverter 420 includes a P-channel MOS transistor (P2) 422 and an N-channel MOS transistor (N2) 424. The single input terminal of inverter 420 is the gate of N-channel MOS transistor (N2) 424. The output terminal of inverter 420 is the drain of N-channel MOS transistor (N2) 424. The switching threshold of inverter 420 is a function of the current conducted through P-channel MOS transistor (P2) 422 so that an increase in current increases the switching threshold voltage. However, the switching voltage is widely variable, differing by up to several hundreds of millivolts, under varying process and temperature conditions although a particular switching voltage is very consistent within the same integrated circuit.

The inverter 420 is connected to the bias circuit 410 to duplicate the reference current through resistor Rosc 408. Bias circuit 410 includes a first current mirror P-channel MOS transistor (P3) 411, a second current mirror P-channel MOS transistor (P4) 412, a N-channel MOS transistor (N3) 413, a matched N-channel MOS transistor (N4) 414 and an N-channel MOS transistor (N1) 416. First current mirror P-channel MOS transistor (P3) 411 and second current mirror P-channel MOS transistor (P4) 412 form a current mirror 415 so that the current drawn off the drain of first current mirror P-channel MOS transistor (P3) 411 is mirrored to second current mirror P-channel MOS transistor (P4) 412. The drain terminals of first current mirror P-channel MOS transistor (P3) 411 and second current mirror P-channel MOS transistor (P4) 412 are respectively connected to the drain terminals of N-channel MOS transistor (N3) 413 and matched N-channel MOS transistor (N4) 414. Furthermore, N-channel MOS transistor (N3) 413 and matched N-channel MOS transistor (N4) 414 are matched and receive the same current from the current mirror 415 so that their gate to source voltages are virtually identical.

N-channel MOS transistor (N1) 416 has a drain terminal and a gate terminal connected to the source terminal of matched N-channel MOS transistor (N4) 414 and a source terminal connected to the ground reference source VSS. Connected in this manner, N-channel MOS transistor (N1) 416 generates a gate to source voltage $V_{GSN1}$ which is equal to the voltage across the resistor Rose 408 in accordance with the equation:

$$V_{Rosc} = V_{GSN1}$$

so that the current $i_{Rosc}$ conducted through the resistor Rosc 408 is determined according to the equation:

$$i_{Rosc} = V_{GSN1}/ROSC.$$

The current $i_{Rosc}$ charges the capacitor Cosc 409 through the operation of the ramp and hold circuit 430.

The bias circuit 410 described with respect to FIG. 2 includes five transistors 411, 412, 414, 416 and 413 and performs functions which are analogous to the functions of voltage reference generator 310, operational amplifier 320 and MOS transistor 322 shown in FIG. 1. The RC oscillator 400 is advantageously a simplified circuit which does not utilize an operational amplifier or a differential comparator.

The ramp and hold circuit 430 includes a ramp and hold input P-channel MOS transistor (P5) 431, a ramp and hold differential switch 432, and a ramp and hold N-channel transistor (N7) 436. The ramp and hold differential switch 432 includes a first ramp and hold differential switch P-channel MOS transistor (P6) 433 and a second ramp and hold differential switch P-channel MOS transistor (P7) 434. Ramp and hold input P-channel MOS transistor (P5) 431 has a source terminal connected to the power supply source VDD, a drain terminal connected to the ramp and hold differential switch 432 and a gate terminal connected to the gate terminals of first current mirror P-channel MOS transistor (P3) 411 and second current mirror P-channel MOS transistor (P4) 412. First ramp and hold differential switch P-channel MOS transistor (P6) 433 has a source terminal connected to the drain terminal of ramp and hold input P-channel MOS transistor (P5) 431, a drain terminal connected to the ground reference source VSS and a gate terminal connected to a HOLDF (hold false) control line from the decode logic 490. Second ramp and hold differential amplifier P-channel MOS transistor (P7) 434 has a source terminal connected to the drain terminal of ramp and hold input P-channel MOS transistor (P5) 431 and a gate terminal connected to a HOLD control line from the decode logic 490. Ramp and hold N-channel transistor (N7) 436 has a source terminal connected to the ground reference source VSS, a drain terminal connected to the drain terminal of second ramp and hold differential amplifier P-channel MOS transistor (P7) 434 and to capacitor Cosc 409 and a gate terminal connected to an INIT line from the decode logic 490. Due to the extensive transistor matching and current mirroring in the bias circuit 410, the current conducting through P-channel MOS transistors (P3) 411 and (P4) 412 and N-channel MOS transistors (N3) 413, (N4) 414 and (N1) 416 are essentially the same and equal to $i_{Rosc}$. Ramp and hold input N-channel MOS transistor (P5) 431 also forms a current mirror with first current mirror P-channel MOS transistor (P3) 411 so that nearly the same current $i_{Rosc}$ passes through the drain of ramp and hold input N-channel MOS transistor (P5) 431, through second ramp and hold differential amplifier P-channel MOS transistor (P7) 434, thereby charging the capacitor Cosc 409. The current $i_{Rosc}$ generated by the bias circuit 410 produces a voltage across the resistor Rosc 408 having a value that can be arbitrarily set in a wide range of voltages and for this arbitrary voltage a corresponding arbitrary proportional current charges the capacitor Cosc 409. In addition, N-channel MOS transistor (N2) 424 is matched to N-channel MOS transistor (N1) 416 so that the gate to source voltage $V_{GSN1}$ is very precisely equal to the switching voltage of the CMOS input inverter 420 of P-channel MOS transistor (P2) 422 and N-channel MOS transistor (N2) 424.

The output signal of the CMOS inverter 420 is passed from the drain terminals of P-channel MOS transistor (P2) 422 and N-channel MOS transistor (N2) 424 to the input terminal of analog comparator 460, which includes inverters 462 and 464.

Figure 3:
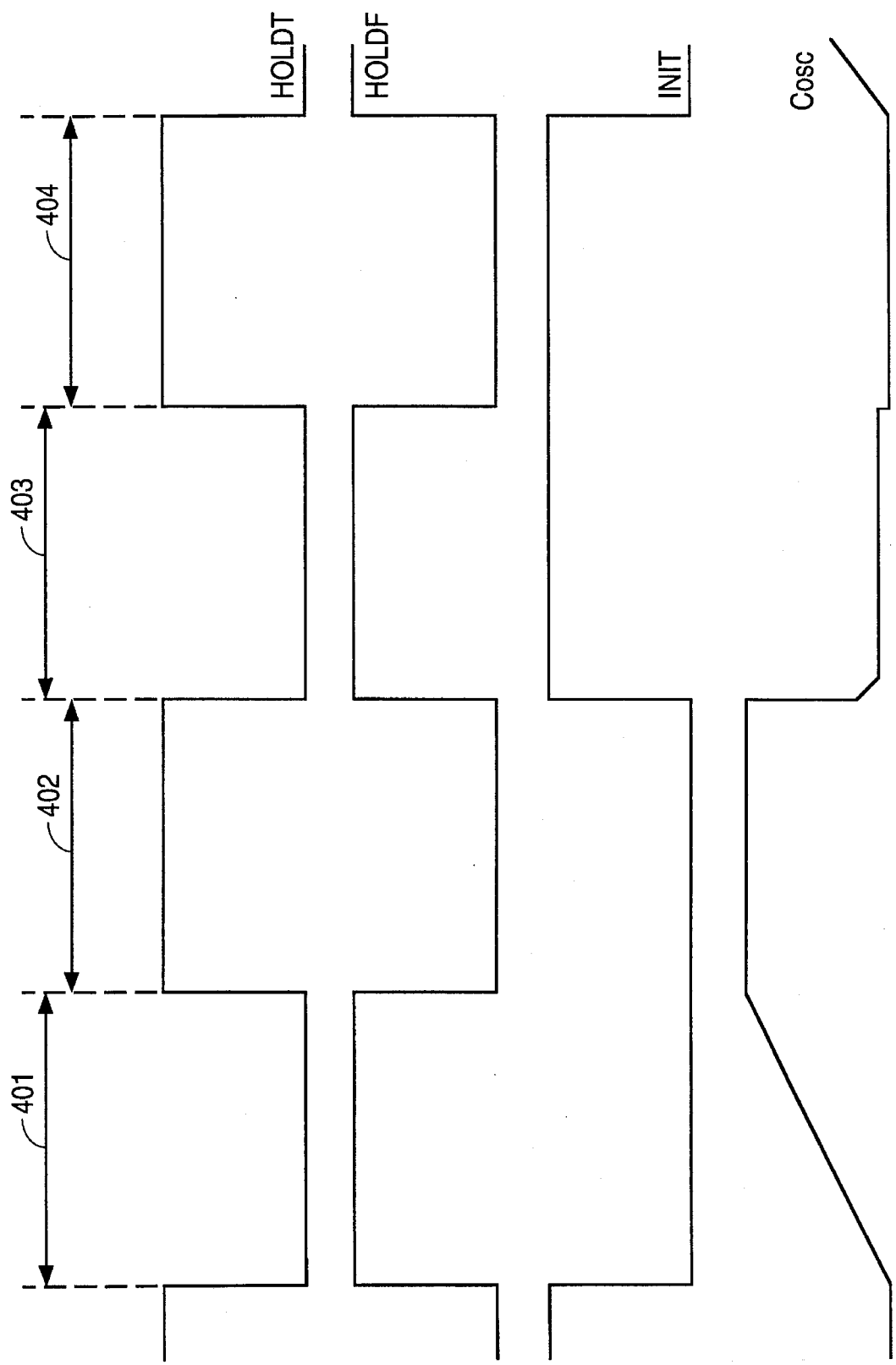
FIG. 3 is a timing diagram which illustrates the operation of the RC oscillator shown in FIG. 2.

Operation of the RC oscillator 400 is described with reference to the timing diagram shown in FIG. 3 in conjunction with FIG. 2. Decode logic 490 controls a four phase timing cycle 405 including phases T1 401, T2 402, T3 403 and T4 404. During a charge ramping interval of phase T1 401, the capacitor Cosc 409 is charged as the decode logic 490 sets the hold signal on line HOLD to a low logic level and sets the hold false signal on line HOLDF to a high logic level, respectively making second ramp and hold differential switch P-channel MOS transistor (P7) 434 conductive and first ramp and hold differential switch P-channel MOS transistor (P6) 433 nonconductive. Accordingly, the current $i_{Rosc}$ from ramp and hold input N-channel MOS transistor (P5) 431 is steered to capacitor Cosc 409 and the charge across the capacitor Cosc 409 steadily increases or "ramps up".

During a voltage hold phase T2 402, the charge on capacitor Cosc 409 is held constant as the decode logic 490 sets the hold signal on line HOLD to a high logic level and sets the hold false signal on line HOLDF to a low logic level, respectively making second ramp and hold differential switch P-channel MOS transistor (P7) 434 nonconductive and first ramp and hold differential switch P-channel MOS transistor (P6) 433 conductive. The current $i_{Rosc}$ from ramp and hold input N-channel MOS transistor (P5) 431 remains the same but is steered to ground reference source VSS. Also during interval T2 402, the comparison of the voltage on capacitor Cosc 409 is made. While the charge on capacitor Cosc 409 is held for the entire interval T2 402, the comparison of the voltage on capacitor Cosc 409 may last the duration of interval T2 402 or may last only a fraction of interval T2 402. Some advantages arise if the compare operation endures for only a fraction of the interval. These advantages are discussed hereinafter in a discussion of the charge pump circuit 470. Thus, the overall result of the operations of bias circuit 410, input inverter 420 and ramp and hold circuit 430 is that if the capacitor Cost 409 is charged to a voltage greater than the gate to source voltage $V_{GSN1}$ of N-channel MOS transistor (N1) 416 then the output voltage of N-channel MOS transistor (N2) 424 signifies a logic zero. Otherwise, the gate voltage of N-channel MOS transistor (N2) 424 is insufficient to sink the current from P-channel MOS transistor (P2) 422 so that N-channel MOS transistor (N2) 424 generates a logic one signal. CMOS inverters 462 and 464 have sufficient voltage gain, that rail-to-rail CMOS logic levels are produced to the respective input terminals of charge pump 475.

Thus, time intervals T1 401 and T2 402 respectively time the ramping and holding operations of the ramp and hold circuit 430. These operations are similar to the sample and hold operations of a sample and hold circuit but differ in that no external voltage is sampled, but rather an internal charge on the capacitor Cosc 409 is measured.

During time interval T3 403, capacitor Cosc 409 is discharged. Ramp and hold N-channel transistor (N7) 436 is activated under control of decode logic 490 which sets an initialized signal on line INIT to a logic one from a previous value of logic zero and thereby renders ramp and hold N-channel transistor (N7) 436 conductive to discharge capacitor Cosc 409. The initialized signal on the INIT line is high during time intervals T3 and T4 and low during intervals T1 and T2. At the rising edge of the signal on the INIT line, decode logic 490 produces a falling edge on the HOLD line so that the current from ramp and hold input N-channel MOS transistor (P5) 431 is conducted through both second ramp and hold differential switch P-channel MOS transistor (P7) 434 and ramp and hold N-channel transistor (N7) 436. As ramp and hold N-channel transistor (N7) 436 becomes conductive and operates in the ohmic region, capacitor Cosc 409 is discharged to a small offset voltage, the voltage level of the "on voltage" of ramp and hold N-channel transistor (N7) 436 (for example, approximately 50 mV). This discharging of capacitor Cosc 409 may be considered a "predischarge" operation to a much lower voltage than the "hold" voltage.

During time interval T4 404, any residual charge is discharged from capacitor Cosc 409. Decode logic 490 sets the hold signal on HOLD line high and the hold false signal on HOLDF line low. The initialized signal on INIT line remains high so that ramp and hold N-channel transistor (N7) 436 remains conductive. No additional current from ramp and hold input P-channel MOS transistor (P5) 431, other than a possible small leakage current, is conducted to ramp and hold N-channel transistor (N7) 436 because the current is steered down the drain of first ramp and hold differential switch P-channel MOS transistor (P6) 433. Thus, ramp and hold N-channel transistor (N7) 436 is operating in the ohmic region and conducting only a leakage current from second ramp and hold differential amplifier P-channel MOS transistor (P7) 434. Only a very small residual voltage of approximately 50 µV, essentially zero, remains on the capacitor Cosc 409. At the end of interval T4 404, capacitor Cosc 409 is very completely discharged to a precise initial condition of zero volts and again is ready to repeat the charging interval 401.

Charge pump circuit 470 includes a charge pump current source P-channel MOS transistor (P9) 471, a charge pump control differential switch 472, a charge pump signal differential amplifier 475, and a charge pump capacitor Cpump. Charge pump current source P-channel MOS transistor (P9) 471 has a source terminal connected to power supply source VDD and a drain terminal connected to charge pump control differential switch 472. Charge pump current source P-channel MOS transistor (P9) 471 has a W/L ratio which is reduced from the ratio of first current mirror P-channel MOS transistor (P3) 411 so that the charge pump sourced current $i_{pump}$ is made much smaller than current $i_{Rosc}$. Charge pump control differential switch 472 includes a pump true P-channel MOS transistor (P10) 473 and a pump false P-channel MOS transistor (P11) 474. Pump true P-channel MOS transistor (P10) 473 has a source terminal connected to the drain terminal of charge pump current source P-channel MOS transistor (P9) 471, a drain terminal connected to ground reference source VSS and a gate control terminal connected to decode logic 490 via a PUMPT line. Pump false P-channel MOS transistor (P11) 474 has a source terminal connected to the drain terminal of charge pump current source P-channel MOS transistor (P9)) 471, a drain terminal connected to charge pump signal differential amplifier 475 and a gate control terminal connected to decode logic 490 via a PUMPF line. Charge pump current source P-channel MOS transistor (P9) 471 and charge pump control differential switch 472 source current to the charge pump differential amplifier 475. Charge pump differential amplifier 475 includes a charge pump first P-channel MOS transistor (P13) 476, a charge pump second P-channel MOS transistor (P12) 477, a charge pump first N-channel MOS transistor (N13) 478 and a charge pump second N-channel MOS transistor (N14) 479. Charge pump first P-channel MOS transistor (P13) 476 has a source terminal connected to the drain terminal of pump false P-channel MOS transistor (P11) 474, a drain terminal, and a control gate terminal connected to the output terminal of inverter 462 of analog comparator 460. Charge pump P-channel MOS transistor (P12) 477 has a source terminal connected to the drain terminal of pump false P-channel MOS transistor (P11) 474, a drain terminal connected to the charge pump capacitor Cpump of charge pump circuit 470 and to the control input of VCO 480, and a control gate terminal connected to the output terminal of inverter 464 of analog comparator 460. Charge pump N-channel MOS transistor (N13) 478 has a source terminal connected to the ground reference VSS and a drain and gate terminal connected to the drain terminal of charge pump P-channel MOS transistor (P13) 476. Charge pump N-channel MOS transistor (N14) 479 has a source terminal connected to the ground reference VSS, a gate terminal connected to the gate terminal of charge pump N-channel MOS transistor (N13) 478 and a drain terminal connected to the drain terminal of charge pump P-channel MOS transistor (P12) 477.

Decode logic 490 controls the charge pump circuit 470 to acquire the logic signal at the output of analog comparator 460 by controlling a pump true signal on a PUMPT line and a pump false signal on a PUMPF line which is complementary to the PUMPT line. At the time within interval T2 402 when the comparison of capacitor Cosc 409 is sufficiently complete, then decode logic 490 sets the pump true signal high and the pump false signal low so that pump true P-channel MOS transistor (P10) 473 is nonconductive and pump false P-channel MOS transistor (P11) 474 conducts the current $i_{pump}$ from the drain terminal of charge pump current source P-channel MOS transistor (P9) 471 through the source and drain of pump false P-channel MOS transistor (P11) 474 to begin charging the current sources of charge pump P-channel MOS transistors (P13) 476 and (P12) 477. The state of the analog comparator 460 controls the current flow in charge pump signal differential amplifier 475.

When differential amplifier second P-channel MOS transistor (P12) 477 has a low signal on the gate terminal and is therefore conductive and differential amplifier first P-channel MOS transistor (P13) 476 has a high signal on the gate terminal and is nonconductive, the drain current of pump false P-channel MOS transistor (P11) 474 is transmitted to linearly charge the pump capacitor Cpump. The voltage on the capacitor Cpump changes linearly because the capacitor Cpump is charged with a fixed current. When charge pump second P-channel MOS transistor (P12) 477 has a high signal on the gate terminal and is nonconductive and charge pump first P-channel MOS transistor (P13) 476 has a low signal on the gate terminal and is conductive, the drain current of pump false P-channel MOS transistor (P11) 474 is conducted to the ground reference VSS. At the end of the T2 402 interval the charge on the charge pump capacitor Cpump is held as decode logic 490 sets the pump true signal low and the pump false signal high so that pump true P-channel MOS transistor (P10) 473 is conductive and passes the drain current of pump false P-channel MOS transistor (P11) 474 to ground reference VSS.

Otherwise differential amplifier second P-channel MOS transistor (P12) 477 has a high signal on the gate terminal and is nonconductive and charge pump first P-channel MOS transistor (P13) 476 has a low signal on the gate terminal and is conductive, the drain current of pump false P-channel MOS transistor (P11) 474 is steered to N13. N13 forms a current mirror with N14 so that N14 duplicates the current of N13, which allows the charge pump circuit 470 to discharge a unit of charge from the capacitor Cpump, linearly decreasing the charge on capacitor Cpump because the current is fixed. Accordingly, the charge pump circuit 470 either charges or discharges the charge pump capacitor Cpump with the charge and discharge amounts being substantially equivalent. Thus the voltage across the pump capacitor Cpump may have the form of a stairstep function either charging or discharging the pump capacitor Cpump depending on whether the VCO 480 is high in frequency or low in frequency. Eventually the frequency of the VCO 480 reaches a steady-state, balanced condition in which the voltage across the capacitor Cosc 409 substantially matches the threshold voltage $V_{GSN1}$ so that the voltage across the pump capacitor Cpump toggles between charging and discharging for each successive T2 402 timing interval to the next. Each adjustment causes the oscillating frequency to deviate slightly from the ideal oscillating frequency determined by the RC network 450, slightly overcompensating for the previous adjustment in the opposite direction. The charge pump circuit 470 continues to alternately charge and discharge the pump capacitor Cpump until a change in operating conditions such as initialization, a quantum charge, a parasitic leakage or the like occurs which causes readjustment of the charge pump. In this manner, the charge pump circuit 470 generates an error voltage that causes the feedback loop of the RC oscillator circuit 400 to self-correct so that the average frequency is precisely the correct frequency of oscillation. This condition is called a "dither" and the average oscillating frequency is extremely accurate.

In accordance with the function of charge pump circuit 470, RC oscillator 400 is frequency-modulated with the amount of frequency modulation determined by the size of the pump capacitor Cpump and the amount of current $i_{pump}$ conducting through the drain of charge pump current source P-channel MOS transistor (P9) 471. More frequency modulation results for a larger current $i_{pump}$ and for a smaller pump capacitor Cpump. Likewise, less frequency modulation occurs for a smaller value of pump current $i_{pump}$ and also for a larger pump capacitor Cpump.

The decode logic circuit 490 and divide-by-N circuit 496 in RC oscillator 400 implement a divide-by-N operation in which N is an integer multiple of four, and N has a minimum value of four. N is at least four to count the four-phase timing cycle 405 shown in FIG. 3. The four-phase timing cycle includes two phases ("on" and "off" phases) of the initialized signal on the INIT line for each cycle, and four phases (two cycles) of the hold true and hold false signals on the HOLD and HOLDF lines. N is increased to a number greater than four to improve performance of RC oscillator 400 since it is advantageous to control the pump true and false signals on the PUMPT and PUMPF lines for a shorter interval of time than the hold true and hold false signals. The pump true and false signals operate at the same frequency as the initialized signal on the INIT line but at a lower duty cycle. Thus, increasing the N count of the divide-by-N circuit 496 higher than four avoids nonideal loop dynamics that occurs when steering current to the pump capacitor Cpump and the frequency changes. Increasing the N count allows the comparator more time to settle before sampling and permits the sampling interval to be shortened, avoiding the nonideal correction of the loop that results from adjusting the oscillator frequency over a large fraction of the evaluation interval.

Figure 4:
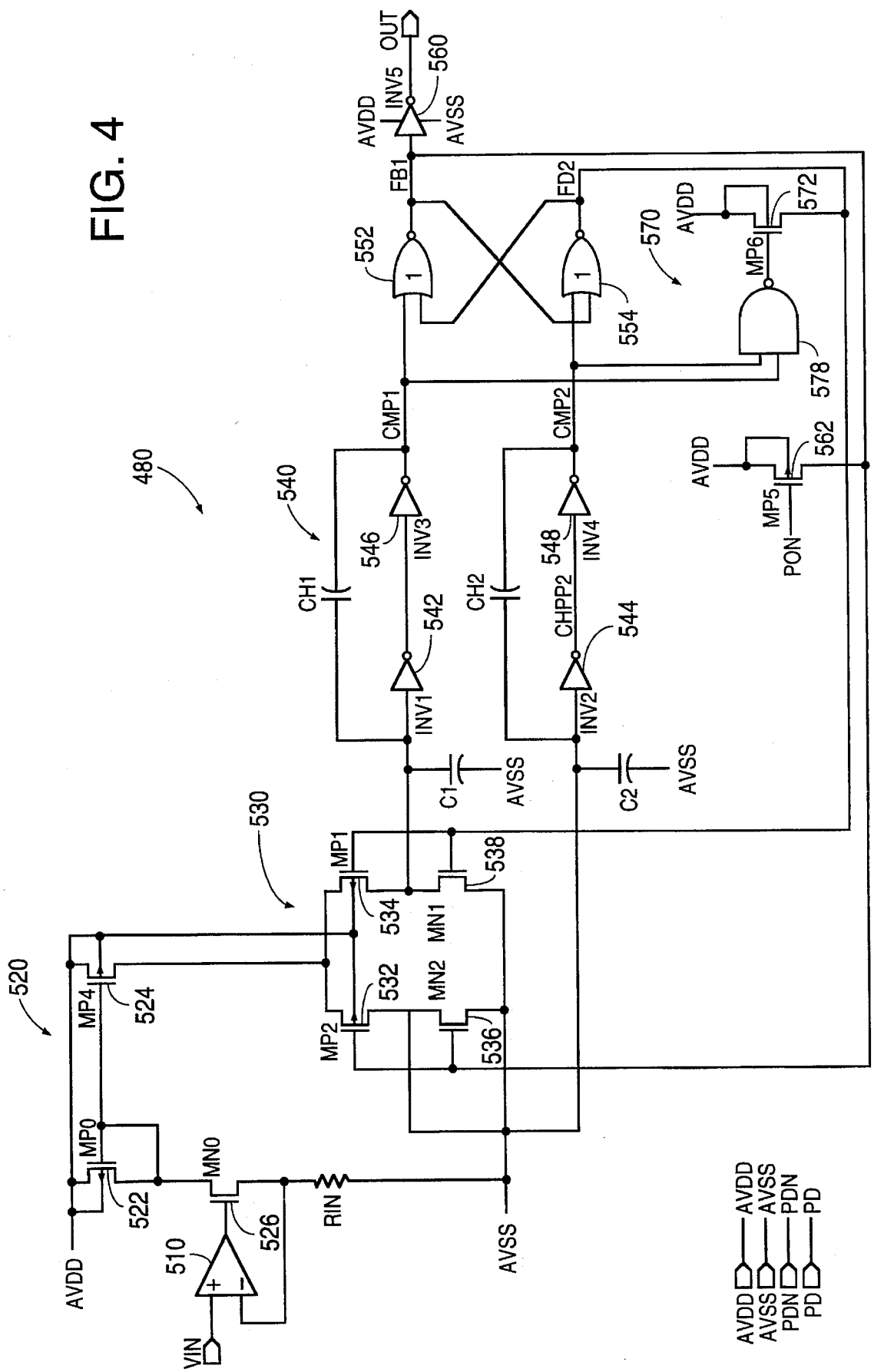
FIG. 4 illustrates a schematic circuit diagram of a voltage-controlled oscillator (VCO) in the RC oscillator circuit shown in FIG. 2.

Referring to FIG. 4, the VCO 480 includes an operational amplifier 510, a current mirror 520, a quadripole network 530, capacitors C1 and C2, inverter network 540, and NOR gates 552 and 554. The inverter network 540 includes inverters 542, 544, 546 and 548.

An input voltage VIN, the voltage across the pump capacitor Cpump of the charge pump circuit 470, is applied to the noninverting input terminal of operational amplifier 510, which is configured in a negative feedback loop having the inverting input terminal of the operational amplifier 510 connected to a resistor RIN. As the voltage VIN is continuously applied, the operational amplifier 510 eventually reaches a steady state condition in which the signals applied to the noninverting and inverting input terminals of operational amplifier 510 are equal. In this steady state condition, the current of resistor RIN is substantially equal to the input voltage divided by the resistance of resistor RIN. This current is conducted through a MOS N-channel transistor (MN0) 526 to the current mirror 520. The current mirror 520 includes P-channel transistors (MP0) 522 and (MP4) 524.

Current from the current mirror 520 feeds the quadripole network 530 which includes P-channel transistors (MP1) 534 and (MP2) 532 and N-channel transistors (MN1) 538 and (MN2) 536. The quadripole network 530 is controlled by NOR gates 552 and 554, which have mutually complementary output states, one gate having a logic 1 value and the other having a logic 0 value, to establish that only one transistor of N-channel transistors (MP1) 534 and (MP2) 532 is conductive at one time. For example, when a logic 0 is applied to the gate of transistor (MP1) 534, the transistor is conductive so that current conducting through P-channel transistor (MP4) 524 charges capacitor C1. The logic 0 also appears at the gate of N-channel transistor (MN1) 538, making the transistor nonconductive. When a logic 0 is applied to the gates of transistors 534 and 538, a logic 1 is simultaneously applied to the gates of transistors 532 and 536 since the output signals of NOR gates 552 and 554 are mutually complementary. Therefore, capacitor C2 is discharging when capacitor C1 is charging. Capacitor C1 charges linearly towards the threshold voltage of inverter 542. When the switching threshold of inverter 542 is exceeded, the logic signal of inverter 546 goes high, charging capacitor CH1 and reinforcing the signal to inverter 542. Positive feedback through capacitor CH1 ensures that the output voltage of inverter 546 goes essentially to the rail of the positive power supply terminal VDD. A suitable voltage transition of inverter 546, assures that the logic signal to NOR gate 552 has a range capable of crossing the threshold of NOR gate 552. As a logic 1 signal is applied to NOR gate 552, the output logic signal of NOR gate 552 goes low.

As capacitor C1 is charged, capacitor C2 is discharged. Thus, as the charge ramp is applied to the input terminal of inverter 542, the input terminal of inverter 544 is held at a logic 0 level and is not ramping. Therefore, the output logic state of inverter 548 is held at a logic 0 level. Once the output logic level of inverter 546 starts to go high due to the charging of capacitor C1, a logic 1 level is applied to the input terminal of NOR gate 552, causing the output terminal of the NOR gate 552 to transition to a logic 0 level. The output terminal of NOR gate 552 is connected to the input terminal of NOR gate 554 so that two logic 0 levels are applied to the input terminal of NOR gate 554, setting the output terminal of NOR gate 554 to a logic 1. This reinforces the original logic 1 level from the output terminal of inverter 546. The change of state in the output logic level of NOR gate 552 to a logic 0 and change of state in the output logic level of NOR gate 554 to a logic 1 is fed back to input terminals of the quadripole network 530 via feedback lines FB1 and FB2. Feedback line FB1 controls the gate of P-channel transistor (MP2) 532 with a logic 0 level so that transistor (MP2) 532 becomes conductive. Thus capacitor C2 is then charged with the linear ramp signal. As capacitor C2 is charged, the output condition of NOR gate 554 is a logic 1, which is applied to the gates of N-channel transistor (MN1) 538 and P-channel transistor (MP1) 534. Accordingly, P-channel transistor (MP1) 534 is turned off and N-channel transistor (MN1) 538 is turned on, discharging capacitor C1. As the voltage across capacitor C1 decreases, the threshold of inverter 542 is crossed. Inventor 546 transitions to a logic 0, reinforcing the discharge of capacitor C1. NOR gates 552 and 554 are cross coupled and, thus, the logic state is held until the output of inverter 548 transitions to a logic 1.

The same process occurs with respect to capacitor C2. When the charge on capacitor C2 crosses the threshold of inverter 544, a logic 1 value is applied to the NOR gate 554 in a repeating oscillatory process. Thus the VCO 480 forms an astable multivibrator in which the current to feed the two capacitors C1 and C2 alternately ramps in a linear manner to the threshold voltage of inverters 542 and 544 respectively.

The period of oscillation of VCO 480 is the time for the current passing through transistor (MP4) 524 to charge the capacitors C1 and C2 to the threshold voltage of inverters 542 and 544 respectively. A very precise timing cycle having nearly a 50% duty cycle is achieved by matching of capacitors C1 and C2 since the same charging current is applied to both capacitors. The frequency of oscillation is set by selection of the resistance RIN and selection of the current mirror ratio of current mirror 520.

The VCO 480 circuit also includes a fault detector 570 which includes NAND gate 578 and P-channel transistor (MPS) 572. In the absence of a fault detector, a fault might occur in case of a logic 1 condition of inverters 546 and 548 which causes application of logic 1 conditions to both input terminals of NOR gates 552 and 554. Thus NOR gates 552 and 554 simultaneously have a logic 0 condition so that both capacitors C1 and C2 charge to a voltage greater than the threshold voltages of inverters 542 and 544. Oscillation of the VCO 480 would therefore stop.

Fault detector 570 prevents such a fault condition by detecting a simultaneous logic 1 input logic level to the NOR gates 552 and 554. The input signals to NOR gates 552 and 554 are applied to the input terminals of NAND gate 578 so that P-channel transistor 572 becomes conductive in case of simultaneous logic 1 levels. When P-channel transistor 572 becomes conductive, it produces a signal the line to the gates of P-channel transistor (MP1) 534 and N-channel transistor (MN1) 538 causing capacitor C1 to discharge to restore an oscillatory operating condition.

The voltage-controlled oscillator (VCO) 480 has two input terminals, one output terminal and two power supply terminals. The input terminals include a VCO voltage input terminal VIN and a power down input terminal PD. The output terminal is a VCO frequency output terminal VCOOUT to the frequency output line Fout shown in FIG. 2 which produces an output frequency signal having a range from approximately 4 kHz to 4 MHz. The power supply terminals include an analog positive supply terminal VDD and an analog negative power supply terminal VSS. VCO 480 produces an output frequency that is substantially monotonic relative to the input voltage at voltage input terminal VIN. VCO 480 produces an output frequency signal fout that drives an input frequency signal to the divide-by-N circuit 496. A binary counter of the divide-by-N circuit 496, in turn, drives an input signal to the decode logic 490. The binary counter (divide by N) 496 and decode logic 490 generate digital control timing signals INIT, HOLD, HOLDF, PUMPT, and PUMPF. Detailed descriptions of the counter and decode logic are disclosed hereinafter.

Referring now to FIGS. 5(a) through 5(f), there is shown a schematic block diagram of RC oscillator circuit 600 which improves low power performance. Low power RC oscillator 600, shown in FIG. 5(a) includes a bias circuit 610, a ramp and hold circuit 630, a comparator 650, a charge pump 670, an oscillator 680 and a frequency counter 690. In contrast to the embodiments shown in FIGS. 1 and 2, the ramp and hold circuit 630 uses a bias circuit 610 rather than an operational amplifier to establish the current flowing through a resistor. The "hold" voltage, which is generated by the ramp and hold circuit 630, is applied to the input terminal of a CMOS inverter. The switching threshold of the CMOS inverter is a gate-to-source voltage Vgs of a transistor. If the frequency is low, the hold voltage exceeds Vgs, the comparator 650 drives the charge pump 670 to produce a larger voltage at the input terminal of the oscillator 680 which increases the oscillator frequency. If the frequency is high, the hold voltage decreases to a level below Vgs, the comparator 650 drives the charge pump 670 to produce a smaller voltage at the input terminal of the oscillator 680 which decreases the oscillator frequency.

Figures 1, 5A:
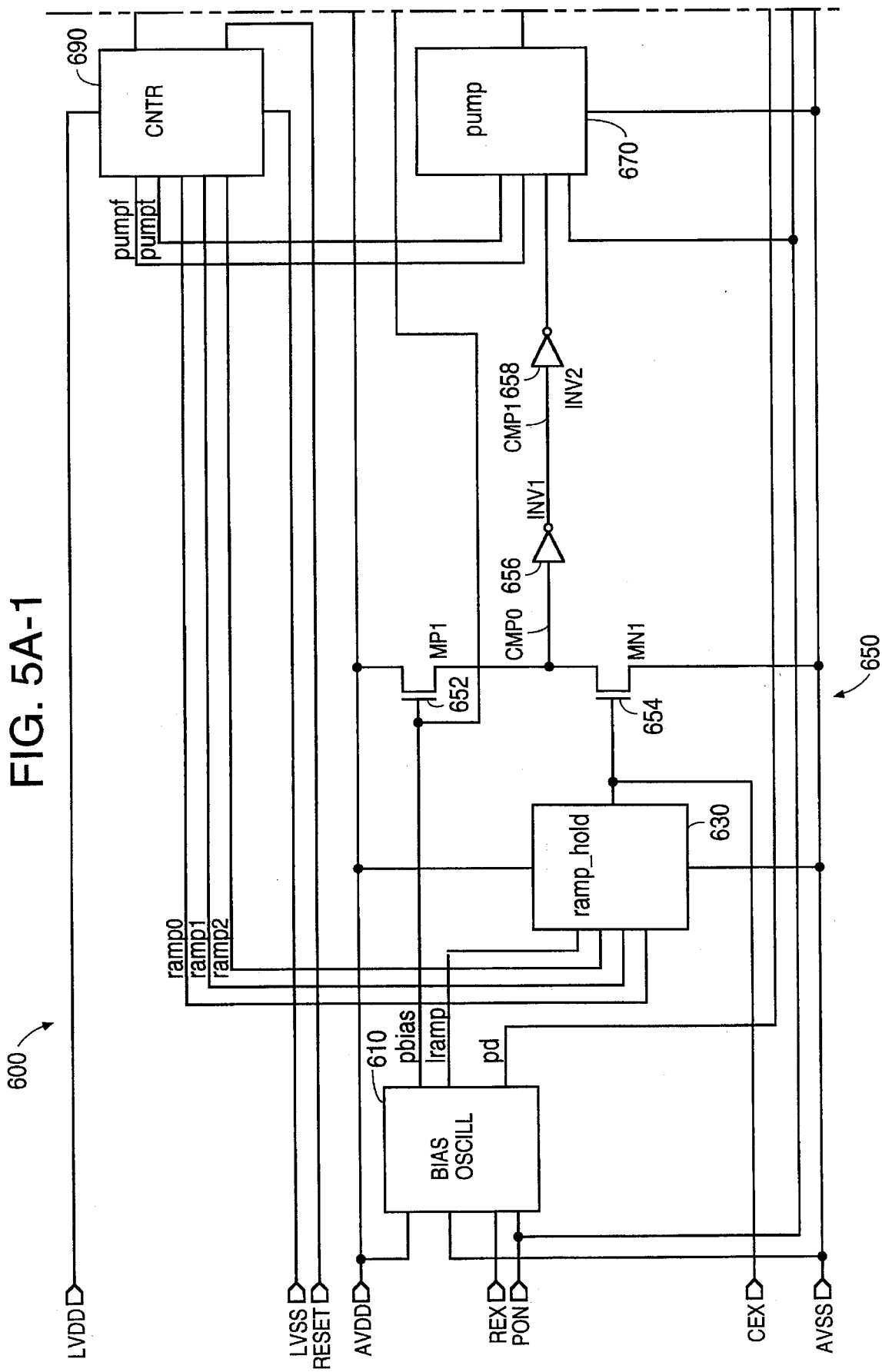
FIGS. 5(a) through 5(f) illustrate a schematic circuit diagram of an additional embodiment of a self-calibrating RC oscillator circuit which is optimized for low power operation.
Figures 2, 5A:
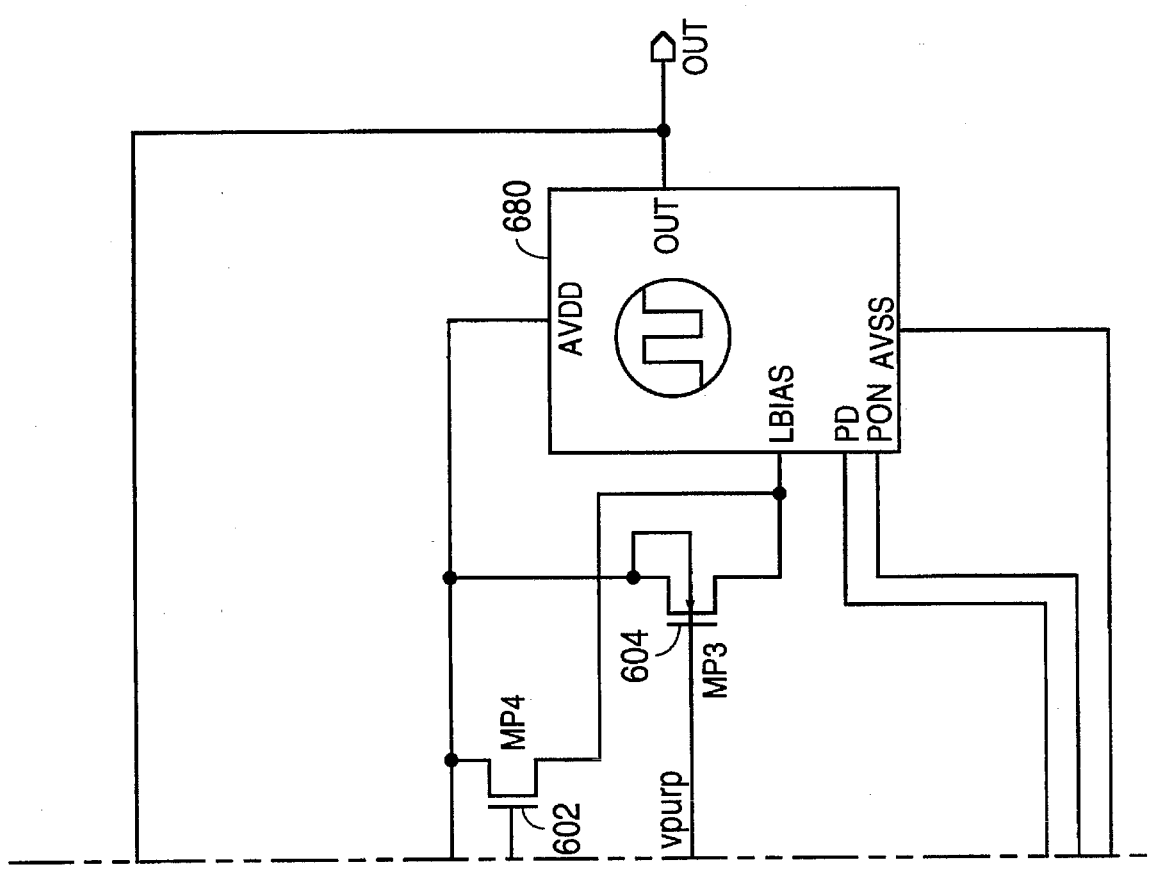
Figure 5B:
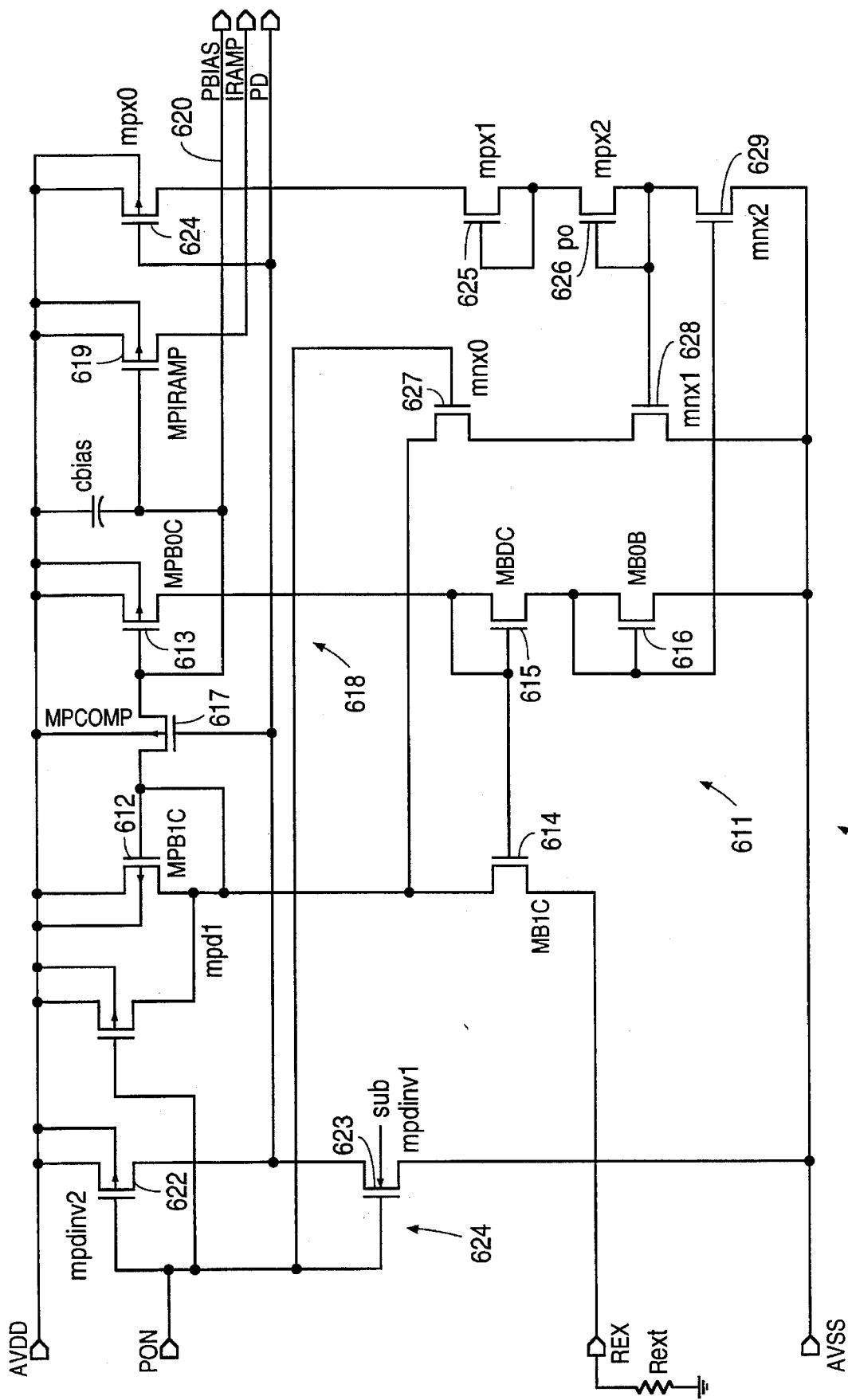

Referring to FIG. 5(b), the bias circuit 610 functions in a manner which is similar to that of bias circuit 410, shown in FIG. 2. In particular, bias circuit 610 has a bias structure 611 including P-channel MOS transistors (MPB1C) 612 and (MPBOC) 613 and N-channel MOS transistors (MB1C) 614, (MBOC) 615 and (MBOB) 616. Bias structure 611 generates a voltage across external resistor Rext, which is substantially equal to the gate-to-source voltage Vos of the N-channel MOS transistor (MBOB) 616, as the N-channel MOS transistors (MBOB) 616 and (MBOC) 615 raise the voltage two gate-to-source voltages from a ground reference source VSS and the N-channel MOS transistor (MB1C) 614 drops the voltage one voltage $V_{GS}$. A current mirror is formed by diode-connected P-channel MOS transistor (MPB1C) 612 and P-channel MOS transistor (MPBOC) 613. The drain current of MOS transistor 614 becomes Vgs/Rext. This drain current is mirrored by P-channel MOS transistors (MPBIC) 612 and (MPBOC) 613, which, in turn, furnishes drain current to N-channel MOS transistors (MBOC) 615 and (MBOB) 616. MOS transistors (mpx1) 625, (mpx2) 626, (mnx0) 627, (mnx1) 628, and (mnx2) 629 supply a start-up current to the chain of P-channel MOS transistor (MPBIC) 612. The start-up current generated at the drain of MOS transistor (mnx1) 628 is turned off when the bias voltage VGS exceeds the threshold of MOS transistor (mnx2) 629.

In addition to the transistors of bias structure 611 which furnish a functionality which is similar to that of bias circuit 410, the bias circuit 610 also includes a common P-bias line P-channel MOS transistor (MPCOMP) 617, forming a source-drain path between the gate of P-channel MOS transistor (MPB1C) 612 and a P-bias line 620, and a bias capacitor CBIAS. The gate of the P-bias line P-channel transistor (MPCOMP) 617 is shown connected to a common drain connection of inverter P-channel MOS transistor 622 and inverter N-channel MOS transistor 623 of an inverter 621. The inverter 621 furnishes a static potential that causes activation of P-bias line P-channel transistor (MPCOMP) 617. In other embodiments, the gate of P-bias line P-channel transistor (MPCOMP) 617 is connected to other static potential sources such as the power supply source VDD or the ground reference VSS. The P-bias line P-channel transistor (MPCOMP) 617 is configured as half a transmission gate which isolates the diode-connected P-channel MOS transistor (MPB1C) 612 from other MOS transistors connected to the P-bias line 620, including a P-channel MOS transistor (MP1) 652 of comparator 650 and a P-channel MOS transistor (MP4) 602 shown in FIG. 5(a). The P-bias line P-channel MOS transistor (MPCOMP) 617 acts as a large-valued resistor, having a resistance which increases as the transistor length dimension (L) is increased and width dimension (W) is decreased. Thus, P-bias line P-channel MOS transistor (MPCOMP) 617 serves as a resistor between the gate and drain connection of P-channel MOS transistor (MPB1C) 612 and the common gate connection of P-channel MOS transistor (MPBOC) 613 and a ramp N-channel MOS transistor (MP1RAMP) 619. The bias capacitor CBIAS is connected between the P-bias line 620 and the power supply source VDD. The common P-bias line P-channel MOS transistor (MPCOMP) 617 and bias capacitor CBIAS form a low-pass RC filter 618 which performs three functions.

First, the low-pass RC filter 618 increases the stability of the bias structure 611 to counteract any parasitic capacitance that occurs across the external resistor Rext. The external resistor Rext may have an excessive amount of parasitic capacitance which forms a relaxation oscillator at some critical value of capacitance and tends to reduce the stability of the bias structure 611. Low-pass RC filter 618 suppresses oscillation of the bias structure 611.

Second, although a unity DC gain is an advantage of the bias circuit 610, stability is further improved by reducing AC gain below unity. Therefore, the P-bias line 620 is a common gate connection among MOS transistors in the forward path of the bias circuit 610 and has the same DC potential as the gate of the diode-connected P-channel MOS transistor (MPB1C) 612 but is attenuated with respect to AC characteristics due to the resistance of common P-bias line P-channel MOS transistor (MPCOMP) 617 and the capacitance of bias capacitor CBIAS. Thus, the AC gain of the bias circuit 610 is attenuated to improve stability as larger values of capacitance are placed across the external resistor Rext.

Third, the bias capacitor CBIAS furnishes a relatively large capacitance which serves as a noise reduction capacitor for stray noise that couples onto the P-bias line 620, overpowering any parasitic or packaging coupling capacitance with the larger bias capacitor CBIAS.

Referring again to FIG. 5(a), comparator 650 includes the P-channel MOS transistor (MP1) 652, an N-channel MOS transistor (MN1) 654, a first inverter 656 and a second inverter 658. P-channel MOS transistor (MP1) 652 has a source connected to the power supply source VDD, a drain connected to a drain node cmp0 and a gate controlled by the P-bias line 620. N-channel MOS transistor (MN1) 654 has a source connected to the ground reference VSS, a drain connected to the drain node cmp0 and a gate controlled by the ramp and hold circuit 630. A signal on the drain node cmp0 is applied to the input terminal of the first inverter 656 and passes through second inverter 658. The two inverters 656 and 658 supply more gain to comparator 650. P-channel MOS transistor (MP1) 652 and P-channel transistors (MPB1C) 612 and (MPBOC) 613 of bias circuit 610 are all matched, having current mirror ratios of 1:1.

Figure 5C:
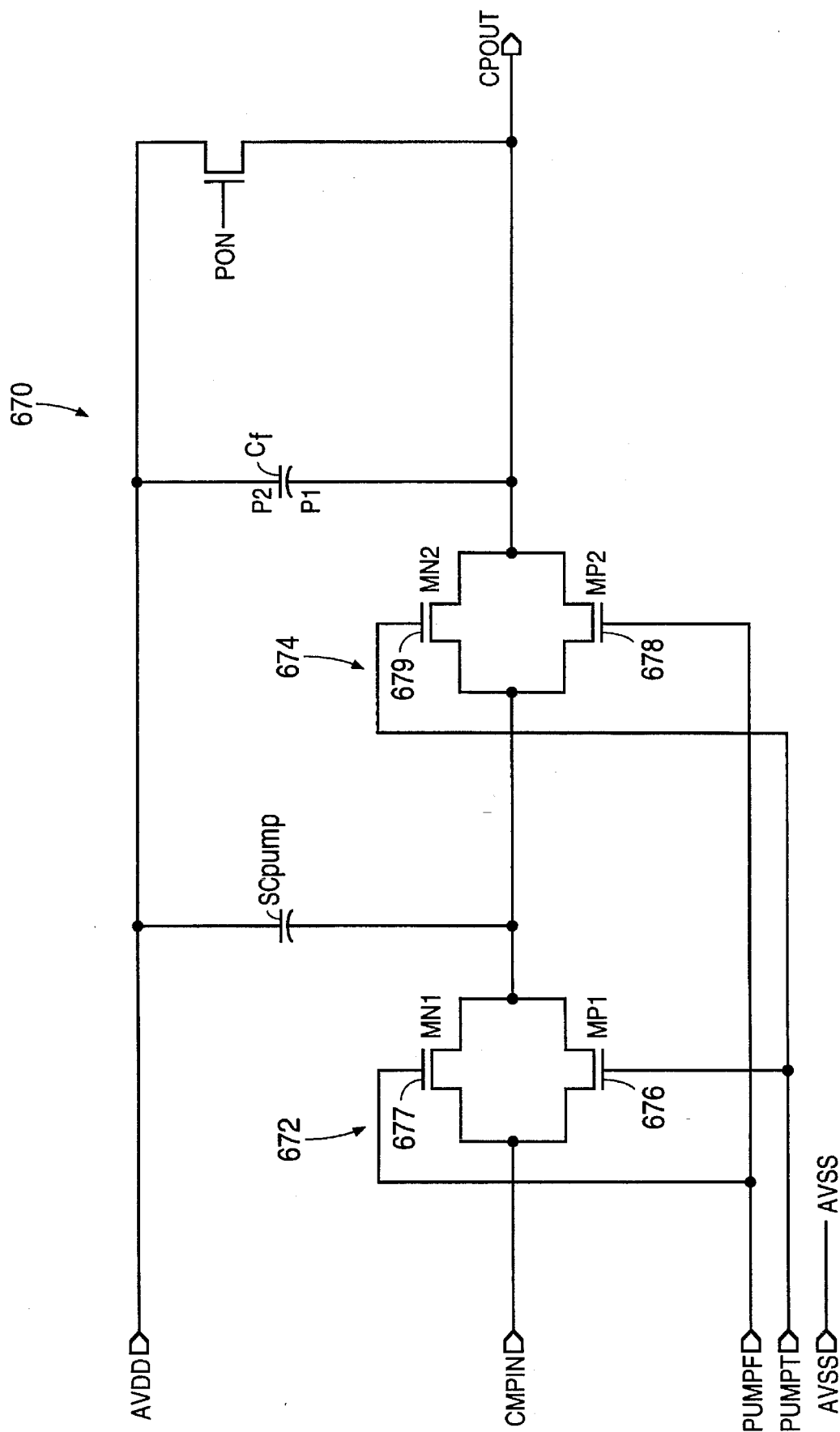

Referring now to FIG. 5(c), RC oscillator 600 utilizes a switched capacitor charge pump 670 which includes two transfer gates 672 and 674 and two capacitors—a charge pump capacitor Cpump and a output capacitor $C_{OUT}$. First transfer gate 672 includes P-channel MOS transistor 676 and an N-channel MOS transistor 677. P-channel MOS transistor 676 has a source connected to an input signal from comparator 650, a drain connected to the second transfer gate 674 and a gate controlled by a pump true PUMPT signal. N-channel MOS transistor 677 has a source to drain pathway connected across P-channel transistor 676 and a gate controlled by a pump false PUMPF signal. The charge pump capacitor Cpump is connected on one side between the first and second transfer gates 672 and 674 and connected on the other side to the power supply source VDD. Second transfer gate 674 includes P-channel MOS transistor 678 and an N-channel MOS transistor 679. P-channel MOS transistor 678 has a source connected to the first transfer gate 672, a drain supplying the charge pump output signal CPOUT and a gate controlled by a pump false PUMPF signal. N-channel MOS transistor 679 has a source to drain pathway connected across P-channel transistor 678 and a gate controlled by a pump true PUMPT signal. The output capacitor $C_{OUT}$ is connected on one side to the charge pump output line CPOUT and connected on the other side to the power supply source VDD. In an alternative embodiment, capacitors Cpump and $C_{OUT}$ are connected to the ground reference VSS rather than to the power supply reference Vdd.

The first transfer gate 672 charges the charge pump capacitor Cpump to either VDD or VSS under control of the control signal output from the second inverter 658 of comparator 650. Charge pump capacitor Cpump is charged substantially to the rail of either VDD or VSS due to the high gain supplied by inverters 656 and 658. Switched capacitor charge pump 670 receives the output voltage of comparator 650 and precharges the pump capacitor Cpump close to VDD or VSS voltage during a first pump signal phase when PUMPF signal is high and PUMPT signal is low. Charge pump 670 receives the PUMPF and PUMPT signals from a frequency counter 690. In a second pump signal phase, PUMPF is low and PUMPT is high and the logic 1 or logic 0 output voltage of comparator 650 is disconnected from charge pump capacitor Cpump while the second transfer gate 674 is reconnected and the charge from charge pump capacitor Cpump is dumped to output capacitor $C_{OUT}$ to set the charge pump voltage to either a high level VDD or a low level VSS. Output capacitor $C_{OUT}$ is a larger capacitor than charge pump capacitor Cpump. Output capacitor $C_{OUT}$ is charged to a voltage which is applied to drive oscillator 680. Thus a small quantum step of voltage, the step size being determined by the size ratio of capacitor Cpump to capacitor $C_{OUT}$. For example, in one embodiment the Cpump capacitor has a capacitance of 1% of the charge pump output capacitance Cout. It is advantageous that the quantum step size is determined by the ratio of capacitances. In the charge pump circuit 470 shown in FIG. 2 the quantum step is set by the drain current of charge pump current source P-channel MOS transistor (P9) 471, which depends on the dimensions of charge pump transistor (P9) 471, a parameter which is more difficult to control than capacitor sizing.

This transfer gate implementation permits the RC oscillator 600 to operate at a very low power supply voltage because the transfer gates 672 and 674 use less voltage to switch charge than does the differential switch in charge pump 470 to make pump true and pump false P-channel MOS transistors 676 and 678 turn on and off.

Transistors 676, 677, 678 and 679 are small transistors because they are used for merely transferring charge from capacitor Cpump to capacitor $C_{OUT}$ and not for supplying gain. Typically, the first pump signal phase exists much longer than the second pump signal phase (for example, 31 to 1) so that most of the cycle is used for precharging the charge pump capacitor Cpump.

The switched capacitor charge pump 670 thus is a capacitive voltage divider from the power supply source VDD to the ground reference VSS. Switched capacitor charge pump 670 is preferential for high temperature operation because leakage arises only with respect to two transistors—the transistors that form the second transfer gate 674. Also, small transistors are utilized and thus junction leakage at high temperatures is correspondingly less. In a charge pump embodiment such as charge pump circuit 470 shown in FIG. 2, which does not utilize transfer gates, transistors are necessarily larger and leakage of the transistors causes drift to occur on the pump voltage stored on the charge pump capacitor Cpump. This voltage drift produces frequency changes during the ramp interval, introducing error in the self-calibration process.

Figures 1, 5D:
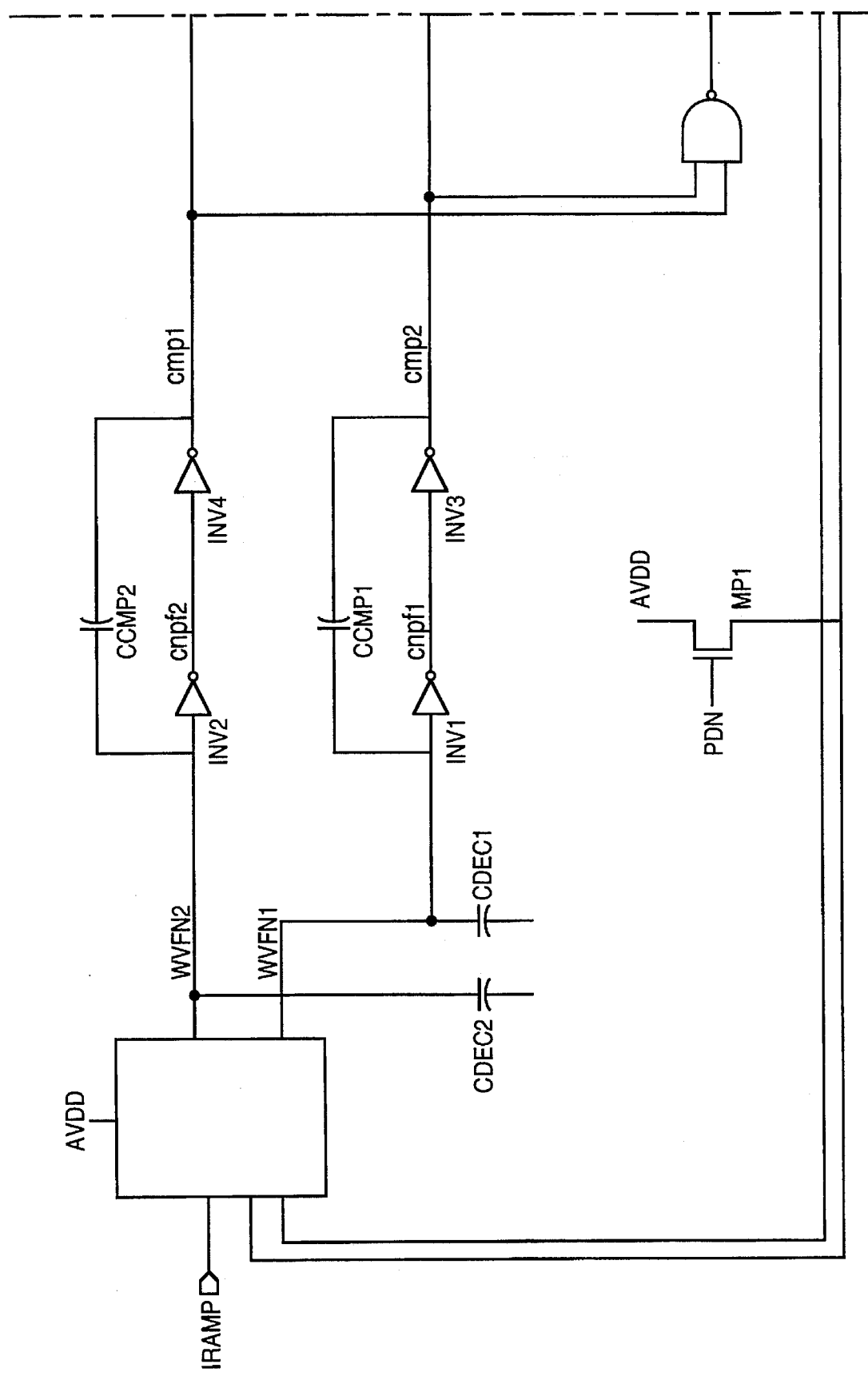

Referring again to FIG. 5(a), the signal on the charge pump output line CLOUT is applied to the gate of P-channel MOS transistor (MP3) 604 to control the current passing through the source to drain pathway from power supply source VDD to a ramp input signal IRAMP of oscillator 680. Referring to FIG. 5(d), a schematic circuit diagram of an oscillator 680 is shown. Oscillator 680 is similar to the VCO 480 shown in FIG. 4 except that the oscillator 680 is generally simplified by removing a voltage-to-current converter and a current mirror, neither of which is utilized since the oscillator 680 receives a current directly from P-channel MOS transistor (MP3) 604. In accordance with the operation of the switched capacitor charge pump circuit 670 described hereinbefore relating to FIG. 5(c), the current passed to oscillator 680 through P-channel MOS transistor (MP3) 604 is adjusted by the switched capacitor charge pump circuit 670 to produce the amount of current for driving the oscillator 680 to oscillate at a selected frequency. Elimination of the voltage-to-current converter and current mirror results in a nonlinear but monotonic transfer characteristic between the charge pump 670 and the frequency of the oscillator 680. However, this nonlinear characteristic does not impair performance if the capacitor ratio of $C_{pump}$ to Cout is sufficiently small.

The ramp input signal IRAMP of oscillator 680 is also supplied by a current passing through the source to drain pathway of P-channel MOS transistor (MP4) 602 from power supply source VDD under control of the P-bias line 620 from the bias circuit 610. P-channel MOS transistor (MP4) 602 supplies a relatively small amount of current to activate the oscillator 680 when power is first applied to the RC oscillator 600. Transistor 602 is necessary to guarantee a minimum frequency, because if the voltage on CPOUT is close to VDD, the frequency of oscillator 680 is zero. Then the overall circuit remains in lockup.

Figure 5E:
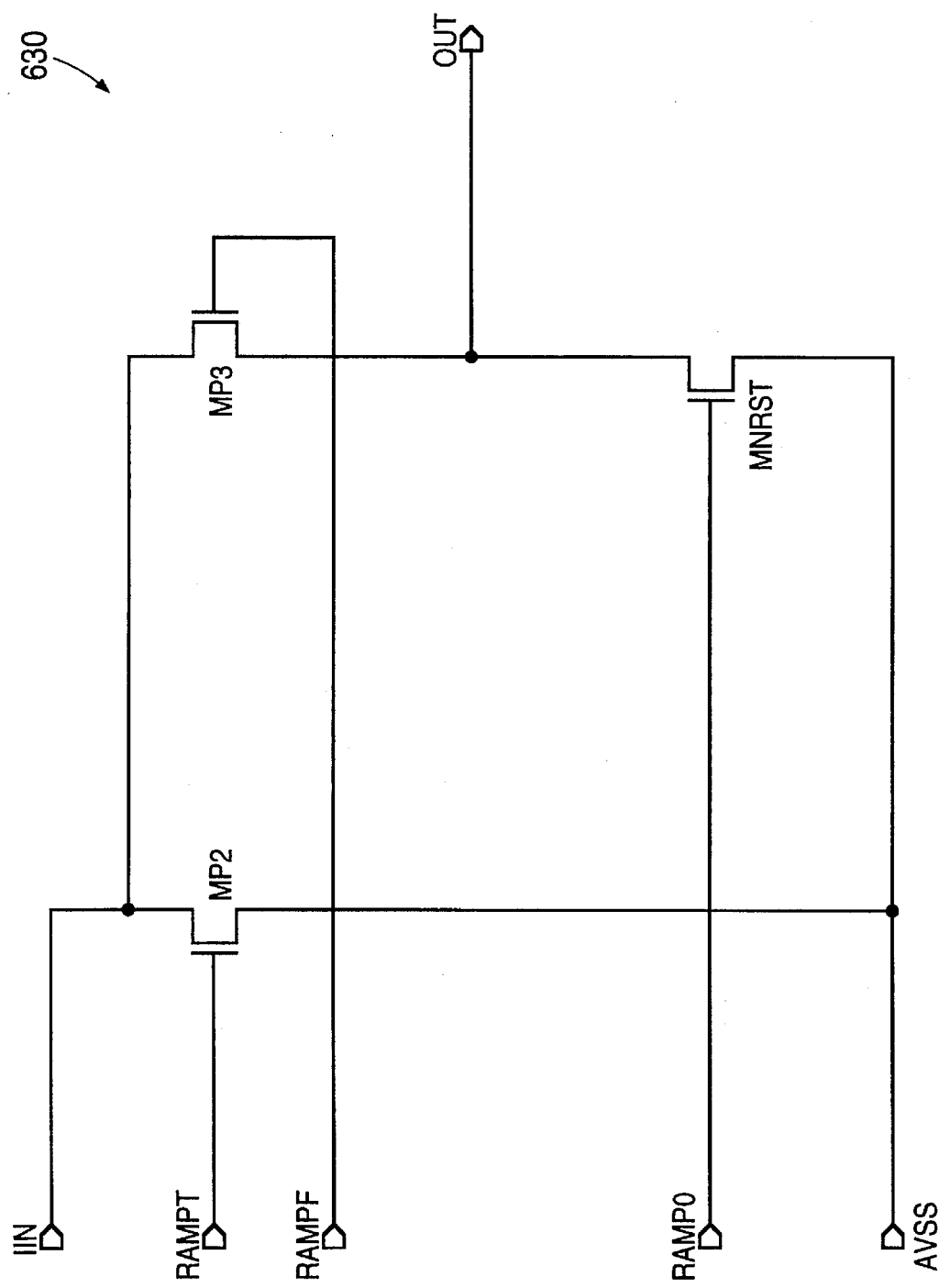

Referring to FIG. 5(e), there is shown a current-steering ramp and hold circuit 630 which is substantially equivalent in structure and function to the ramp and hold circuit shown in FIG. 2. The ramp and hold circuit 630 advantageously extends over only a small area.

Figures 1, 5F:
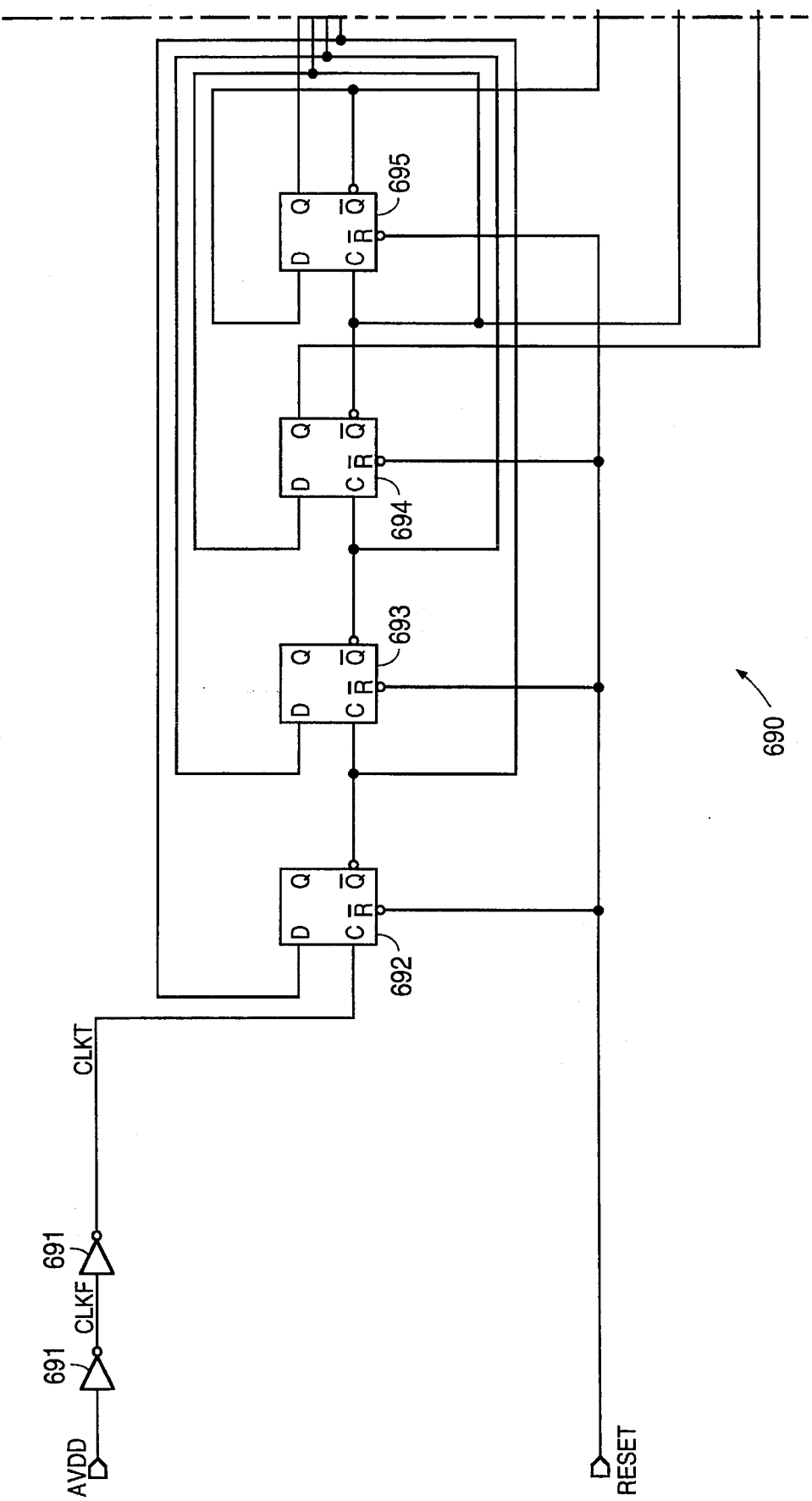

In FIG. 5(f), frequency counter 690 is a 16-count nonsynchronous (ripple) counter which includes two input inverters 691, four D-type flip-flops 692, 693, 694 and 695, a four-input NOR gate 696, and five output inverters 697.

An input clock signal on clock signal line CLKIN is applied from the oscillator 680 sequentially through the two input inverters 691 to double buffer the clock signal, thereby squaring the edges of the signal. The squared clock signal is applied to a C-input terminal of a first D flip-flop 692. First D flip-flop 692 also has a $\overline{Q}$-output terminal and a D-input terminal which is connected to the $\overline{Q}$-output terminal in a typical toggle flip-flop configuration so that on every positive edge of the squared clock signal, the first D flip-flop 692 changes state. Each succeeding D flip-flop 693, 694 and then 695 is similarly interconnected so that the C-input terminal is connected to the $\overline{Q}$-output terminal of the immediately preceding D flip-flop and the D input-terminal and $\overline{Q}$-output terminal of each D flip-flop are interconnected. Configured in this manner, the frequency counter 690 generates a first stage clock signal at a frequency of half the input clock signal frequency, a second stage clock signal at a frequency of one-quarter the input clock signal frequency, a third stage clock signal at a frequency of one-eighth the input clock signal frequency and a fourth stage clock signal at a frequency of one-sixteenth the input clock signal frequency. The complementary Q and $\overline{Q}$ output terminals of the third D flip-flop 694 are connected to output inverters 697 to respectively generate a ramp false signal on RAMPF line and a ramp true signal on RAMP line. The $\overline{Q}$ output terminal of the fourth D flip-flop 695 is connected to an output inverter 697 to generate a capacitor discharge signal on RAMP0 line. NOR gate 696 receives an output signal from each of the D flip-flops 692, 693, 694 and 695. In the embodiment illustrated in FIG. 5(f), the $\overline{Q}$-output terminals of D flip-flops 692, 693 and 694 and the Q-output terminal of D flip-flop 695 are applied to the four-input NOR gate 696. The connection of D flip-flop output terminals is generally arbitrary so that any selected state of the four D flip-flops may be used to activate the pump true signal on PUMPT line and the pump signal on PUMPF line. The output line of the four-input NOR gate 696 is applied to a first output inverter 697 to generate the pump false signal on PUMPF line. The pump false signal on the PUMPF line is applied to a second output inverter 697 to generate the pump true signal on PUMPT line. The number of D flip-flops in the counter determines the duty cycle of the pump true and pump false signals so that an increased number of D flip-flops furnishes a shorter pump interval. A short pump signal duty cycle allows better resolution of parameter measuring and reading times so that the pump capacitor is not charging while it is read. Low resolution of measuring and reading cause a risk of oscillator instability due to operation in a continuous time feedback loop.

In general, the number of D flip-flops utilized in a frequency counter is determined according to timing constraints of particular circuit element embodiments of an RC oscillator. Various RC oscillator embodiments include different combinations of digital and analog elements. Typically, analog operations are performed at low frequency to improve accuracy and digital operations are performed at a high frequency to extend operation of the loop to high frequencies. Additional D flip-flops are used to increase precision of timing interval resolution. Although, the frequency counter 690 is depicted as a nonsynchronous (ripple) counter other suitable frequency counter embodiments employ a synchronous counter.

Referring to FIGS. 6(a) through 6(g), there is shown a schematic block diagram of a digitally-tuned oscillator circuit 702, which includes an RC oscillator circuit 700 and a capacitor digital to analog converter (DAC) 704.

Figure 6A:
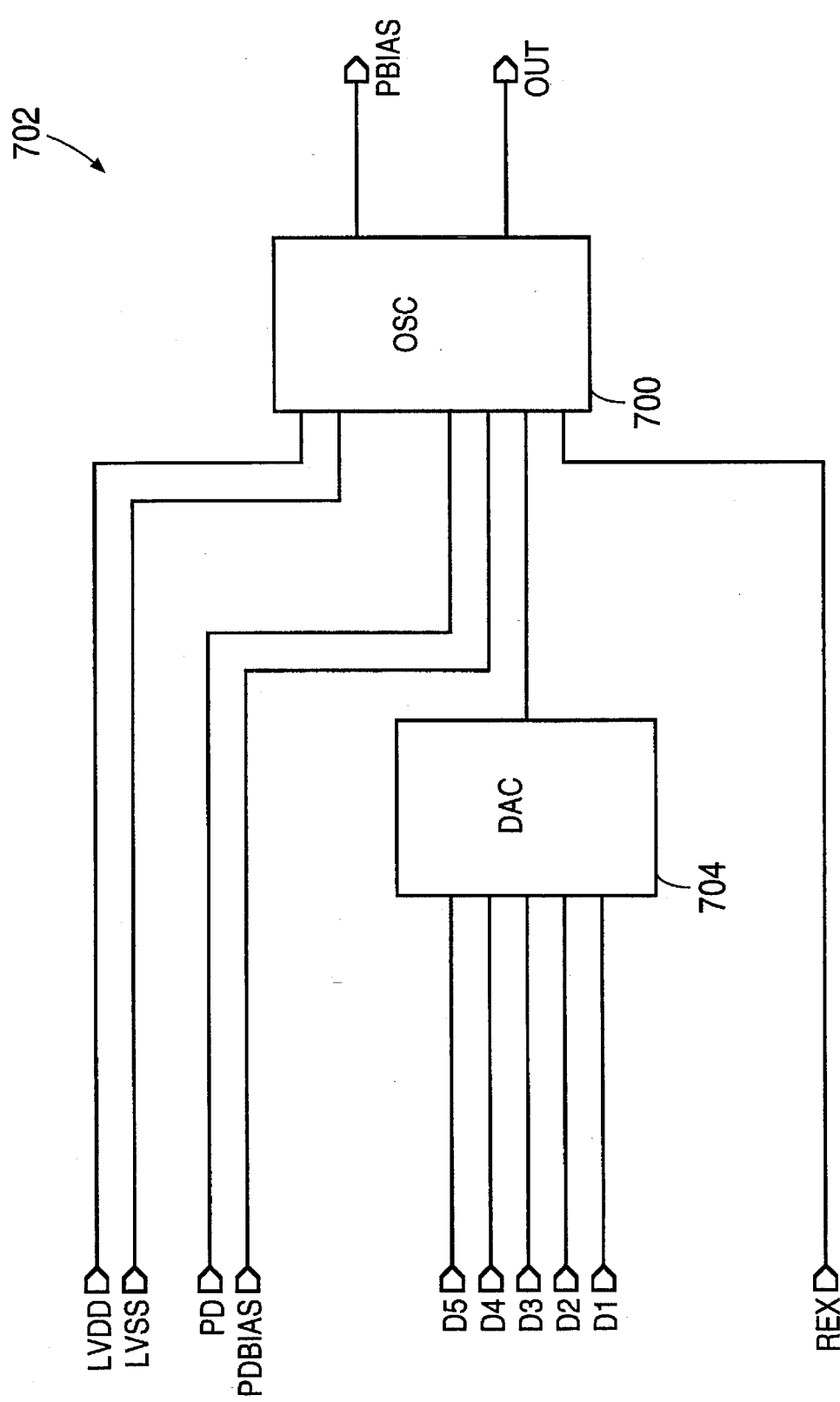
FIGS. 6(a) through 6(g) show a schematic circuit diagram of a digitally-tuned oscillator circuit.
Figures 1, 6B:
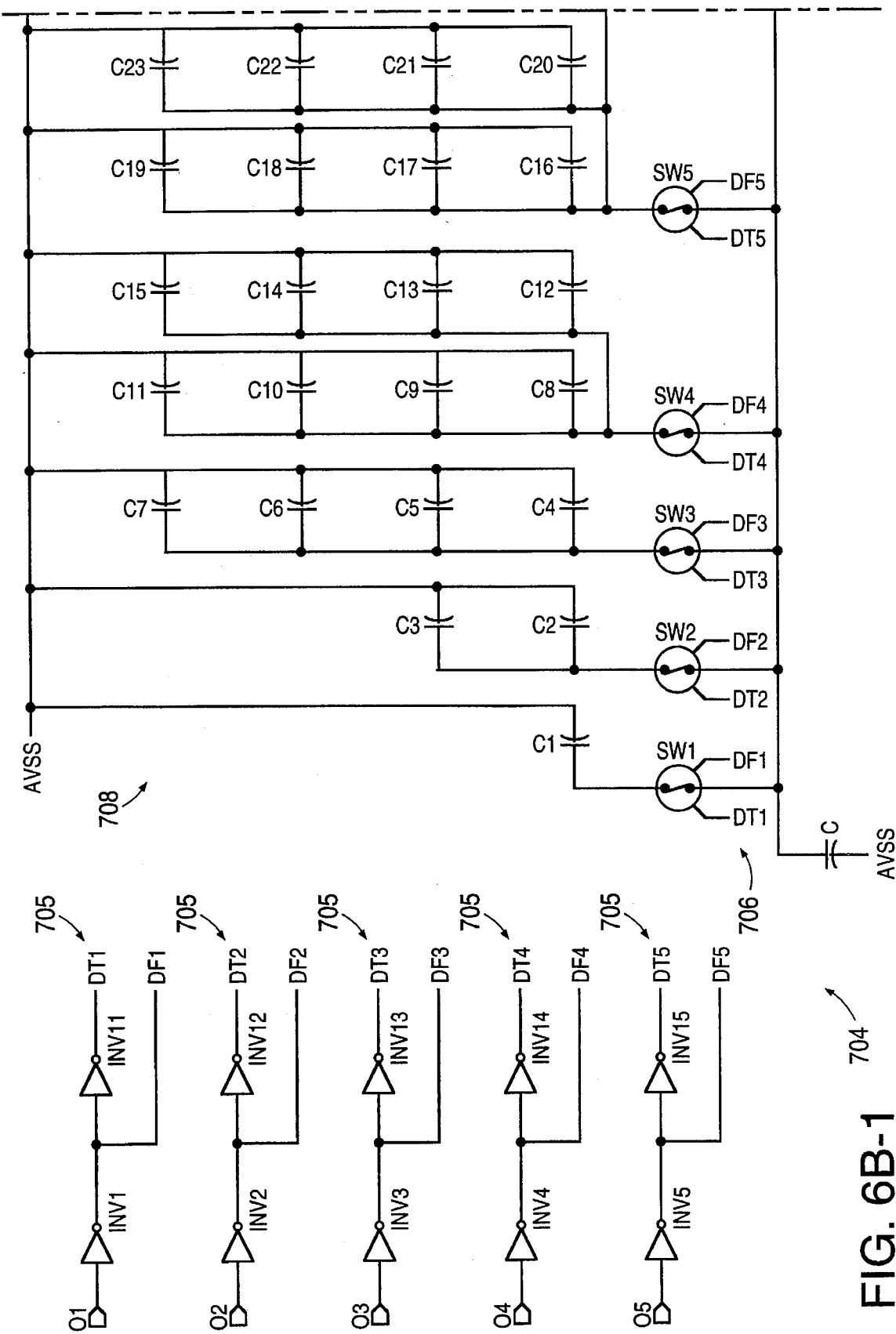
Figure 6B:
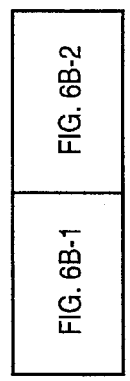
Figure 2:
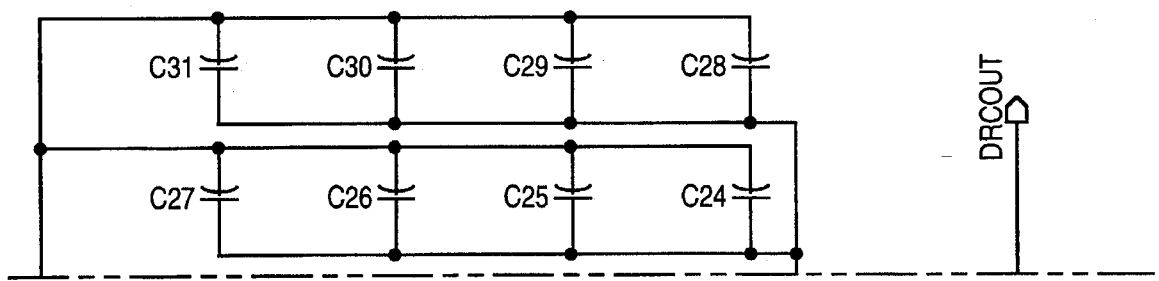

The capacitor DAC 704 shown in FIG. 6(b) includes five digital data input lines D1–D5, five pairs of serially-connected inverters 705, five switches 706 receiving signals from the inverter pairs and a binary array of capacitors 708. Each digital data input line is connected to a pair of serially-connected inverters so that each of the digital data input lines D1–D5 is double buffered. Complementary signals for each digital data input line are furnished at a "true" signal output terminal connected following the second inverter of the pair of inverters and at a "false" signal output terminal connected following the first inverter of the pair. A first pair of serially-connected inverters 705 applies complementary binary control signals to a first switch which connects a first capacitor array of one capacitor unit between a DAC output terminal DACOUT and a ground reference VSS. A second pair of serially-connected inverters 705 applies complementary binary control signals to a second switch which connects a second capacitor array of two capacitor units, between the DAC output terminal DACOUT and ground reference VSS. Similarly, a third pair of inverters 705 connects a third array of four capacitor units, a fourth pair of inverters connects a fourth array of eight capacitor units, and a fifth pair of inverters connects a fifth array of sixteen capacitor units. In addition an additional capacitor CMIN is connected between VSS and DACOUT to furnish a minimum capacitance when no switches are closed. Capacitor CMIN sets the maximum frequency of the digitally-tuned oscillator 702 and additional capacitors 708 are switched into the capacitor DAC circuit 704 by switches 706 to increase the capacitance and decrease the operating frequency of the digitally-tuned oscillator 702. Each switch includes a P-channel transistor and an N-channel transistor connected on a transfer gate.

Figures 1, 6C:
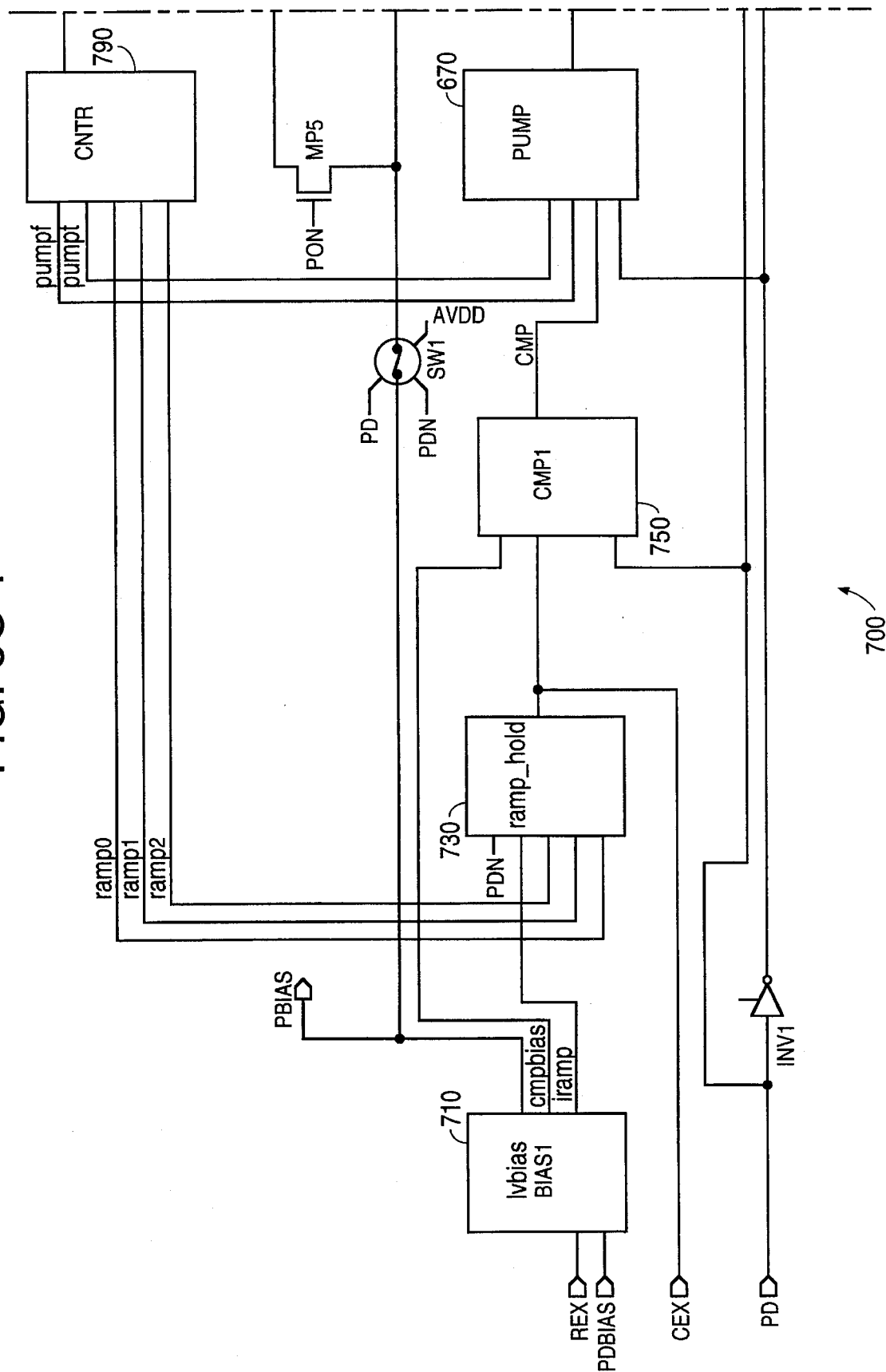

RC oscillator circuit 700, shown in FIG. 6(c) includes a low voltage bias circuit 710, a ramp and hold circuit 730, a comparator 750, a charge pump 670, an oscillator 680 and a frequency counter 790. The low voltage bias circuit 710 is a special low voltage bias circuit which generates a bias current in a substantially similar manner to that of the bias circuit 610 shown in FIG. 5(b) and makes this bias current sensitive to an external resistor Rext. The bias circuit 710 provides two bias voltages, a CMP bias for the comparative and a P-bias for all other functions. The transfer-gate based ramp and hold circuit 730 differs from the current-steering ramp and hold circuit 630 shown in FIG. 5(e) and utilizes full transfer gates, which operate with less power supply voltage than a ramp and hold using a differential current switch. This transfer gate implementation reduces some of the error introduced by charge injection in the circuit. The charge pump 670, oscillator 680 and P-channel MOS transistors (MP4) 602 and (MP3) 604 of the RC oscillator circuit 600 of FIGS. 5(a) through 5(f) are sufficiently low-voltage circuits without modification and, thus are duplicated in the digitally-tuned oscillator 702.

Figure 6D:
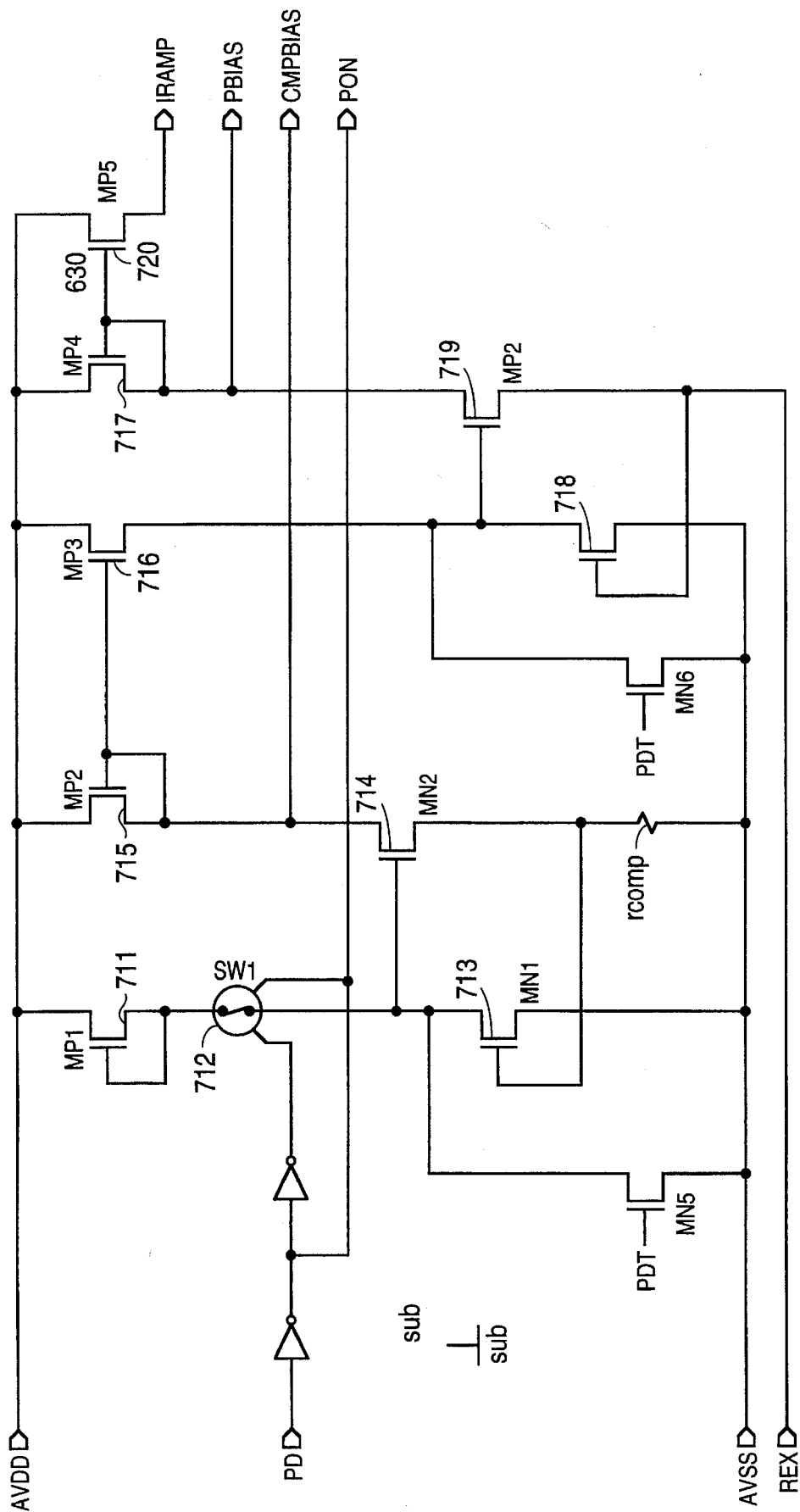

Referring to FIG. 6(d), the low voltage bias circuit 710 is similar to the bias circuit 610 in function and structure but includes modifications to improve performance in low voltage operations. A P-channel MOS transistor (MP1) 711 is a diode-connected field effect transistor (FET) and thus typically produces a non-linear current/voltage characteristic. Transistor (MP1) 711 has long gate length and a narrow gate width, causing a reduction in the amount of current produced so that a small current is generated for a voltage applied to the gate. Thus, transistor (MPl) 711 functions as a resistor but advantageously does not require the large area of a resistor. The small current generated by the P-channel MOS transistor (MP1) 711 passes through a transfer gate 712 to charge the drain capacitance of an N-channel MOS transistor (MN1) 713 and the gate to source capacitance of an N-channel MOS transistor (MN2) 714.

N-channel MOS transistor (MN1) 713 has a gate terminal that is connected to ground reference VSS through a resistor RCMP and therefore is initially turned off. As the drain capacitance of N-channel MOS transistor (MN1) 713 is charged, the transistor remains off but the drain voltage increases. Similarly, as the gate to source capacitance of N-channel MOS transistor (MN2) 714 is charged, the transistor turns on and the gate to source voltage increases so that transistor (MN2) 714 forms a source follower which raises the voltage on resistor RCMP. The voltage across resistor RCMP increases until an equilibrium condition arises in which the drain current on transistor (MN1) 713 is equal to the drain current of P-channel MOS transistor (MP1) 711. An equilibrium condition is achieved since any current imbalance continues to charge or discharge the gate of MOS device (MN2) 714 until equilibrium occurs.

Thus, a steady state DC voltage is formed across resistor RCMP having a magnitude substantially equal to the gate to source voltage of N-channel MOS transistor (MN1) 713 that arises when the drain current from P-channel MOS transistor (MP1) 711 passes through the source to drain pathway of N-channel MOS transistor (MN1) 713. The magnitude of this DC voltage is typically above threshold of the transistor (MN1) 713.

When the steady-state voltage across resistor RCMP becomes greater than the threshold voltage of transistor (MN1) 713, then a current passes through resistor RCMP. That current necessarily arises from a P-channel MOS transistor (MP2) 715 which provides the only DC current path to resistor RCMP. The magnitude of the current passing through resistor RCMP is determined by the threshold voltage of transistor (MN1) 713 and the amount of gate drive sufficient to sink the current from P-channel MOS transistor (MP1) 711. Thus the voltage across resistor RCMP is equal to the gate to source voltage of transistor (MN1) 713 and the current through resistor RCMP is passed to transistor (MP2) 715. A current mirror is formed by a P-channel MOS transistor (MP3) 716 and transistor (MP2) 715.

An arrangement of transistors including P-channel MOS transistors (MP3) 716 and (MP4) 717 and N-channel MOS transistors (MN3) 718 and (MN4) 719 is substantially the same in structure and function as the transistor structure of P-channel MOS transistors (MP1) 711 and (MP2) 715 and N-channel MOS transistors (MN1) 713 and (MN2) 714 except that the source of N-channel MOS transistor (MN2) 714 is connected to on-chip resistor RCMP while the source of N-channel MOS transistor (MN2) 719 is connected to external resistor Rext which sets the frequency of the RC oscillator 700.

N-channel MOS transistor (MN3) 718 operates in a steady-state in substantially the same manner as transistor (MN1) 713 so that the gate to source voltage of N-channel MOS transistor (MN3) 718 reaches a magnitude, typically slightly above threshold, which is sufficient to activate N-channel MOS transistor (MN3) 718 and to sink the current coming from P-channel MOS transistor (MP3) 716. A steady-state current flows through P-channel MOS transistor (MP3) 716 and N-channel MOS transistor (MN3) 718 also in a self-biasing arrangement. The gate voltage of N-channel MOS transistor (MN4) 719 continues to charge until the drain current of N-channel MOS transistor (MN3) 718 is substantially equal to the drain current of P-channel MOS transistor (MP3) 716. The voltage across external resistor Rext is slightly greater than the threshold of N-channel MOS transistor (MN3) 718. The voltage across external resistor Rext is equal to the gate to source voltage of transistor (MN3) 718 and the current through external resistor Rext is passed to transistor (MP4) 717. A current mirror is formed by a P-channel MOS transistor (MP5) 720 and transistor (MP4) 717.

P-channel MOS transistor (MP5) 720 generates a ramp current IRAMP which is proportional to the current passing through P-channel MOS transistor (MP4) 717. The proportionality ratio of the current depends on the sizes of the transistors (MP4) 717 and (MP5) 720. In one embodiment, the gate width of transistor (MP4) 717 is 160 microns and the gate width of transistor (MP5) 720 is 20, so that the current mirror is an 8:1 attenuating current mirror and the ramp current IRAMP is divided by 8. Ramp current IRAMP is connected to the ramp and hold circuit 730, which is modified for low voltage operation as compared to ramp and hold circuits described hereinbefore. Low voltage bias circuit 710 also generates a comparator bias signal on a CMPBIAS line, which is connected to the comparator 750. The comparator bias signal is supplied at a node connecting the common drain terminals of P-channel MOS transistor (MP2) 715 and N-channel MOS transistor (MN2) 714.

Low voltage bias circuit 710 is inherently lower in operating voltage than the bias circuit 610 shown in FIG.

5(b). However, this improvement is achieved at the cost of duplicating some circuitry. The low operating voltage is useful in battery-powered laptop computer applications where a very low current draw is advantageous. The low operating voltage is also useful in systems using submicron CMOS integrated circuits which must use supply voltage of 3 V or less to avoid hot carrier degradation.

Figure 6E:
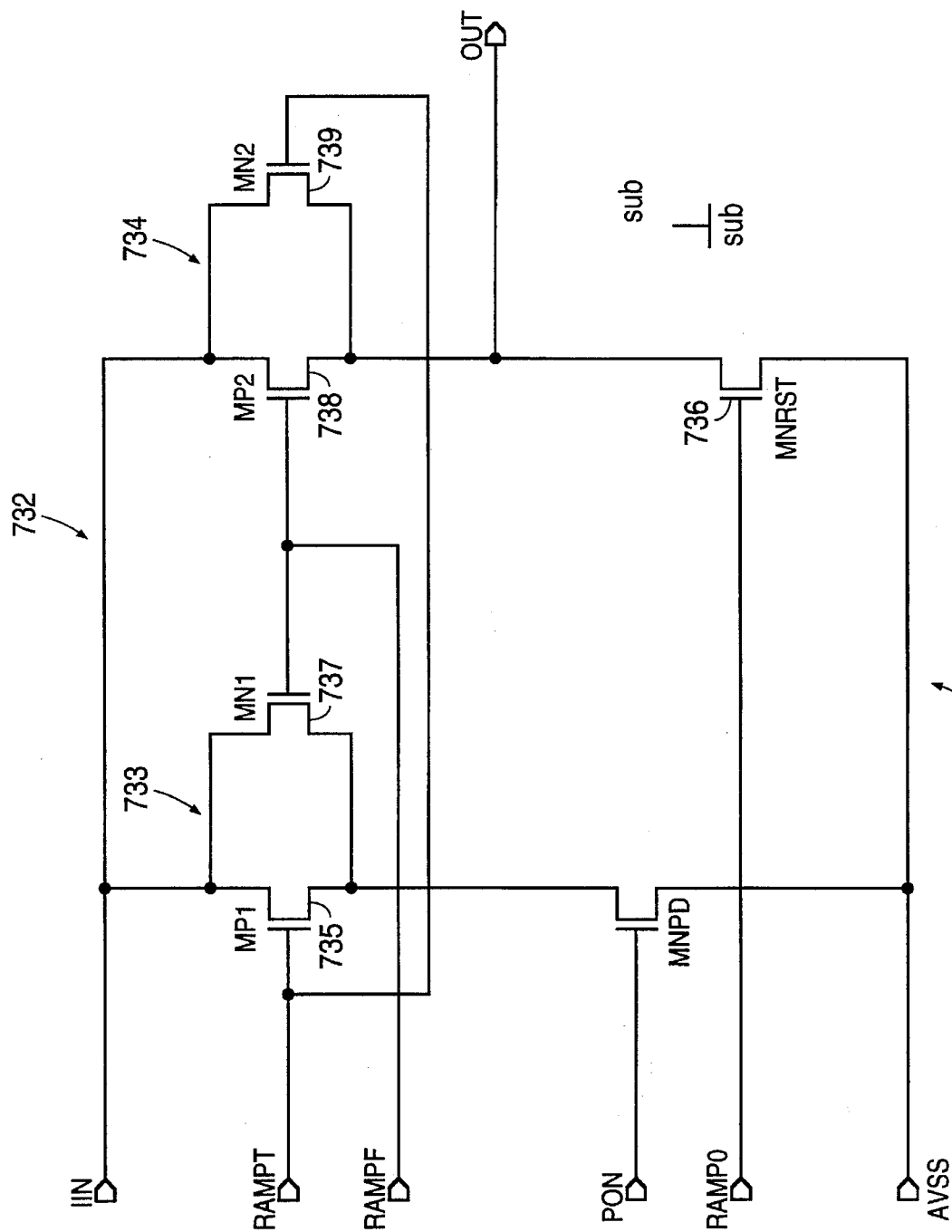

Referring to FIG. 6(e), there is shown a ramp and hold circuit 730 which is similar to the ramp and hold circuit shown in FIG. 5(e) except that ramp and hold circuit 730 includes additional transistors for improved performance in low-voltage applications. Ramp and hold circuit 730 includes a ramp and hold differential switch 732 and a ramp and hold N-channel transistor (MNRST) 736. The ramp and hold differential switch 732 includes a first transfer gate structure 733 having a first transfer gate P-channel MOS transistor (MP1) 735 and a first transfer gate N-channel MOS transistor (MN1) 737, and a second transfer gate structure 734 having a second transfer gate P-channel MOS transistor (MP2) 738 and a second transfer gate N-channel MOS transistor (MN2) 739. First and second transfer gate N-channel MOS transistors (MN1) 737 and (MN2) 739 are respectively connected across P-channel MOS transistors (MP1) 735 and (MP2) 738. The gates of first transfer gate P-channel MOS transistor (MP1) 735 and second transfer gate N-channel MOS transistor (MN2) 739 are connected to a ramp true signal line RAMFT. The gates of first transfer gate N-channel MOS transistor (MN1) 737 and second transfer gate P-channel MOS transistor (MP2) 738 are connected to a ramp false signal line RAMPF.

The two P-channel transistors (MP1) 735 and (MP2) 738 operate as switches for controlling conduction of a ramp current IIN from the bias circuit 710, which acts as a constant current source. Ramp true signal line RAMP and ramp false signal line RAMPF are applied to the gate terminals of the transistors 735, 737, 738 and 739 to steer the current from the bias circuit 710 through the first and second transfer gates 733 and 734.

The first and second transfer gates 733 and 734 improve RC oscillator 700 performance in low voltage applications, in which the voltage across the source to drain pathway of P-channel transistors (MP1) 735 and (MP2) 738 is small, and for further reduced voltages, a nonzero source-to-drain voltage drop across the transistors 735 and 738 forms. Without the transfer gates, at very low voltages the drain voltage of current source transistor (MP5) 720 supplying ramp current IRAMP is no longer less than the gate voltage of that transistor. As such, the current source transistor (MP5) 720 in the bias circuit 710 no longer operates in saturation and begins ohmic region operation, substantially impairing performance of the RC oscillator 700. To avoid this condition, the voltage drop across the P-channel transistors (MP1) 735 and (MP2) 738 is reduced to a minimum value through the operation of the transfer gate structures 732 and 734 to steer the current from the bias circuit 710 rather than driving the current through the operation of P-channel transistors alone.

Figure 6F:
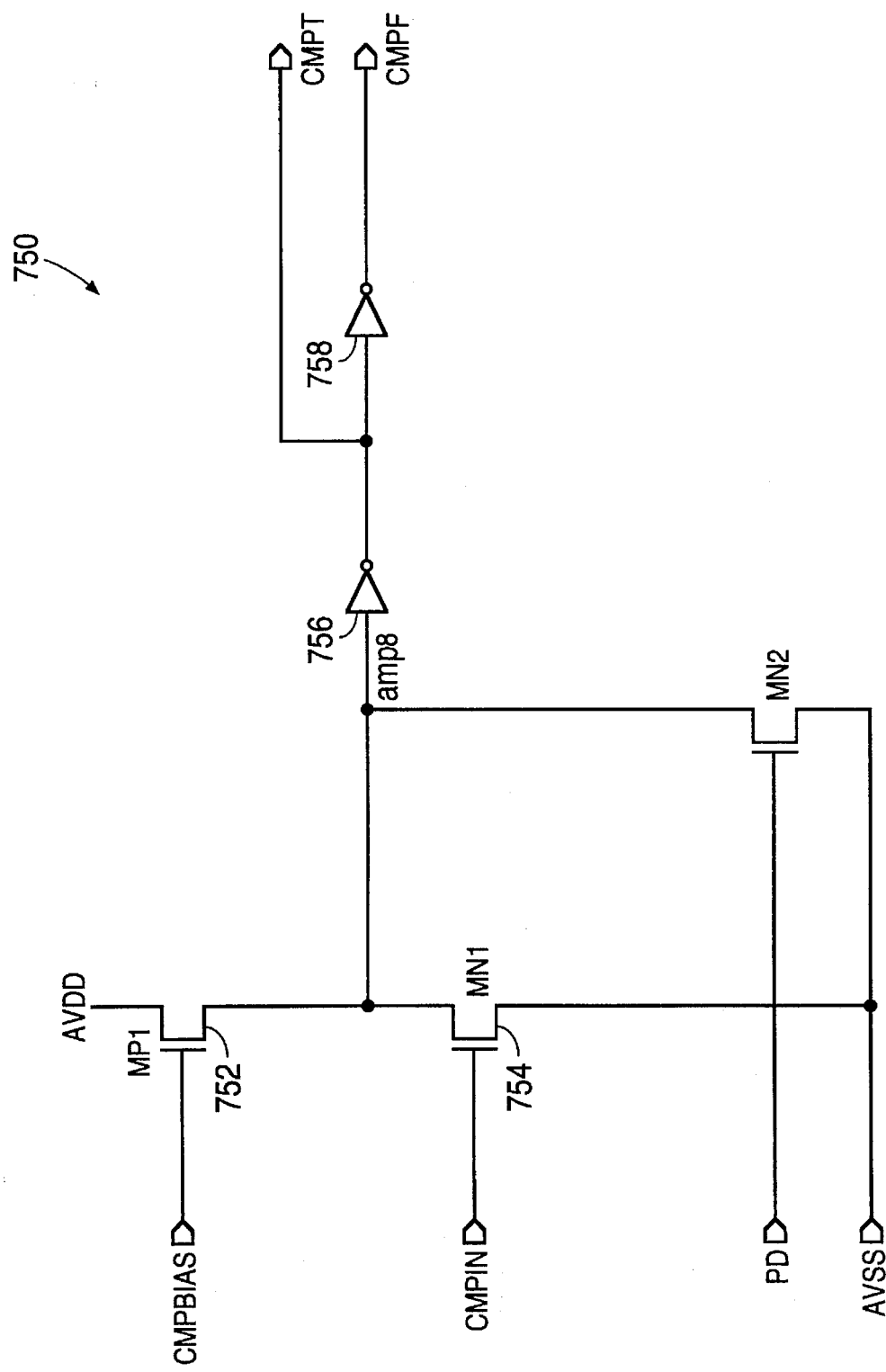

Referring to FIG. 6(f), a comparator 750 includes a P-channel MOS transistor (MP1) 752 and an N-channel MOS transistor (MN1) 754, which are connected at their drain terminals between the power supply source VDD and a ground reference VSS. The gate of the P-channel MOS transistor (MP1) 752 is controlled by a comparator bias signal on CMPBIAS line from the low voltage bias circuit 710. The drain terminals of the transistors (MP1) 752 and (MN1) 754 are connected to a first inverter 756 which is further connected to a second inverter 758 to generate a comparator true signal on a CMPT line and a complementary comparator false signal on a CMPF line.

The switching threshold voltage of transistors (MN1) 754 and (MP1) 752 is set by the comparator bias current on the CMPBIAS line from the low voltage bias circuit 710. In low voltage bias circuit 710, the switching threshold of N-channel MOS transistor (MN3) 718 and P-channel MOS transistor (MP3) 716 is a voltage which is sufficient to sink the current coming from P-channel MOS transistor (MP3) 716. The drain of transistor (MN3) 718 is connected to the drain of transistor (MP3) 716 and the gate terminal of transistor (MP3) 716 connected to the CMPBIAS line. As such, N-channel MOS transistor (MN3) 718 has a gate to source voltage that is established by the current across resistor RCMP that is driving the current mirror of P-channel transistors (MP2) 715 and (MP3) 716. That same bias current also forms the current mirror reference, P-channel MOS transistor (MP1) 752, in the comparator 750. As such the switching threshold of the comparator 750 is nearly equal to the gate to source voltage of transistor (MN3) 718 in the bias circuit 710.

By ratioing, using multiple devices in the bias circuit 710, the current drawn by the comparator 750 is significantly less than the current of low voltage bias circuit 710 due to the ratioing of the current mirrors discussed with reference to the operation of the low voltage bias circuit 710.

The external resistor Rext is implemented in various resistances to specify an operating frequency between a minimum and maximum operating frequency for various applications of the RC oscillator 700. The magnitude of the current passing through the external resistor Rext depends on the implemented resistance of external resistor Rext. The low voltage bias circuit 710 provides flexibility in the current flowing through the external resistor Rext for determining the frequency of oscillation. However, low voltage bias circuit 710 also utilizes the resistor RCMP to set up a small bias current to drive all of the other circuits in digitally-tuned oscillator 702, allowing operation at a very low current and a very low voltage.

Figures 1, 6G:
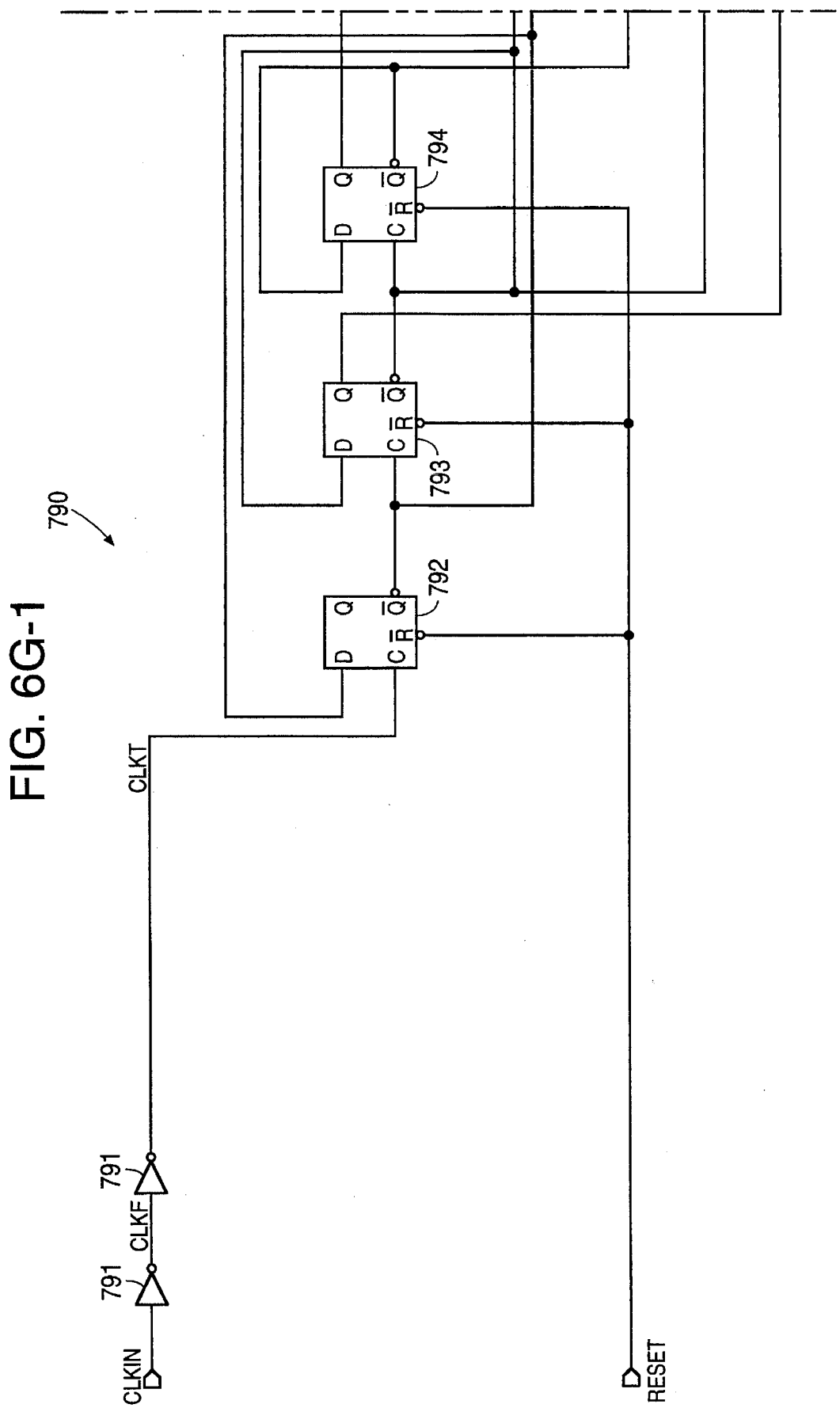
Figure 6G:
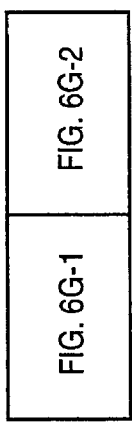
Figure 2:
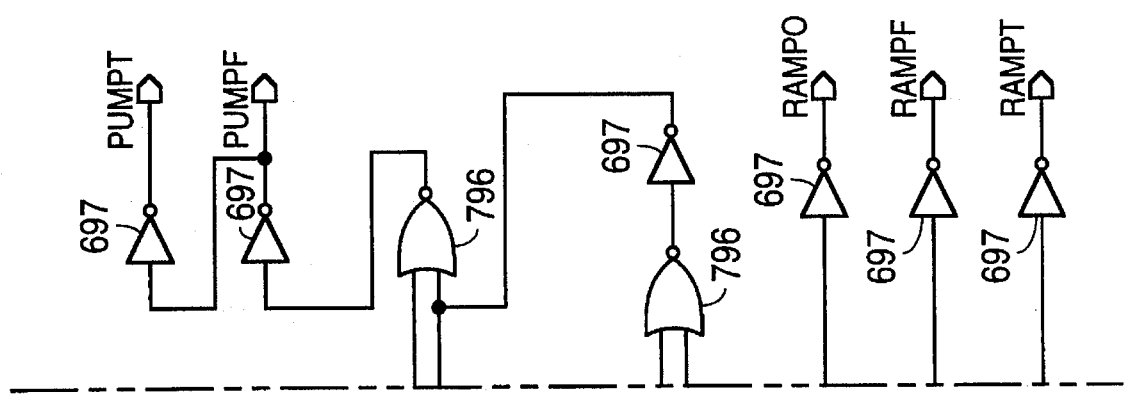

In FIG. 6(g), frequency counter 790 is an 8-count nonsynchronous (ripple) counter which includes two input inverters 791, three D-type flip-flops 792, 793 and 794, two two-input NOR gates 796, and six output inverters 697. Although the frequency counter 790 is shown as an 8-count counter, other embodiments may utilize other numbers of counts such as 4, 12, 16 and other multiples of four to improve oscillator performance at different oscillator frequencies.

The two two-input NOR gates each have only two input terminals for low voltage operation. The number of input terminals on any one logic gate is set to a minimum so that the circuit operates at a lower voltage. Thus, in any position at which a multiple-input NOR gate may be implemented, multiple two-input NOR gates are substituted to reduce the operating voltage specification of the frequency counter 790.

Frequency counter 790 is otherwise similar to the frequency counter 690 shown in FIG. 5(f), generating the same output signals. For example, a capacitor discharge signal on RAMP0 line is the inverse of the false output of the last stage D flip-flop 794 and the ramp false signal on RAMPF line and the ramp true signal on RAMPF line are buffered complementary outputs of the penultimate stage D flip-flop 793.

Referring to FIGS. 7(a) through 7(d), a schematic block diagram shows an RC oscillator circuit having a capability of detecting the absence of a resistor so that, if the resistor was no longer present or removed, the RC oscillator would no longer generate a clock signal for the rest of the chip. RC oscillator 800, shown in FIG. 7(a) includes a bias circuit 610, a ramp and hold circuit 630, a resistor detector 840, a comparator 850, a charge pump 670, an oscillator 680, a frequency counter 890 and P-channel MOS transistors (MP4) 602 and (MP3) 604. Bias circuit 610, ramp and hold circuit 630, charge pump 670, oscillator 680 and P-channel MOS transistors (MP4) 602 and (MP3) 604 are substantially the same as corresponding elements in the RC oscillator 600 illustrated in FIGS. 5(a) through 5(f). Comparator 850 and frequency counter 890 are structurally and functionally similar to the respective comparator 650 and frequency counter 690 elements of RC oscillator 600, but incorporate various modifications. The resistor detector 840 has no corresponding comparable element in the RC oscillator 600 or the digitally-tuned oscillator 702 shown in FIGS. 6(a) through 6(g).

Figures 1, 7A:
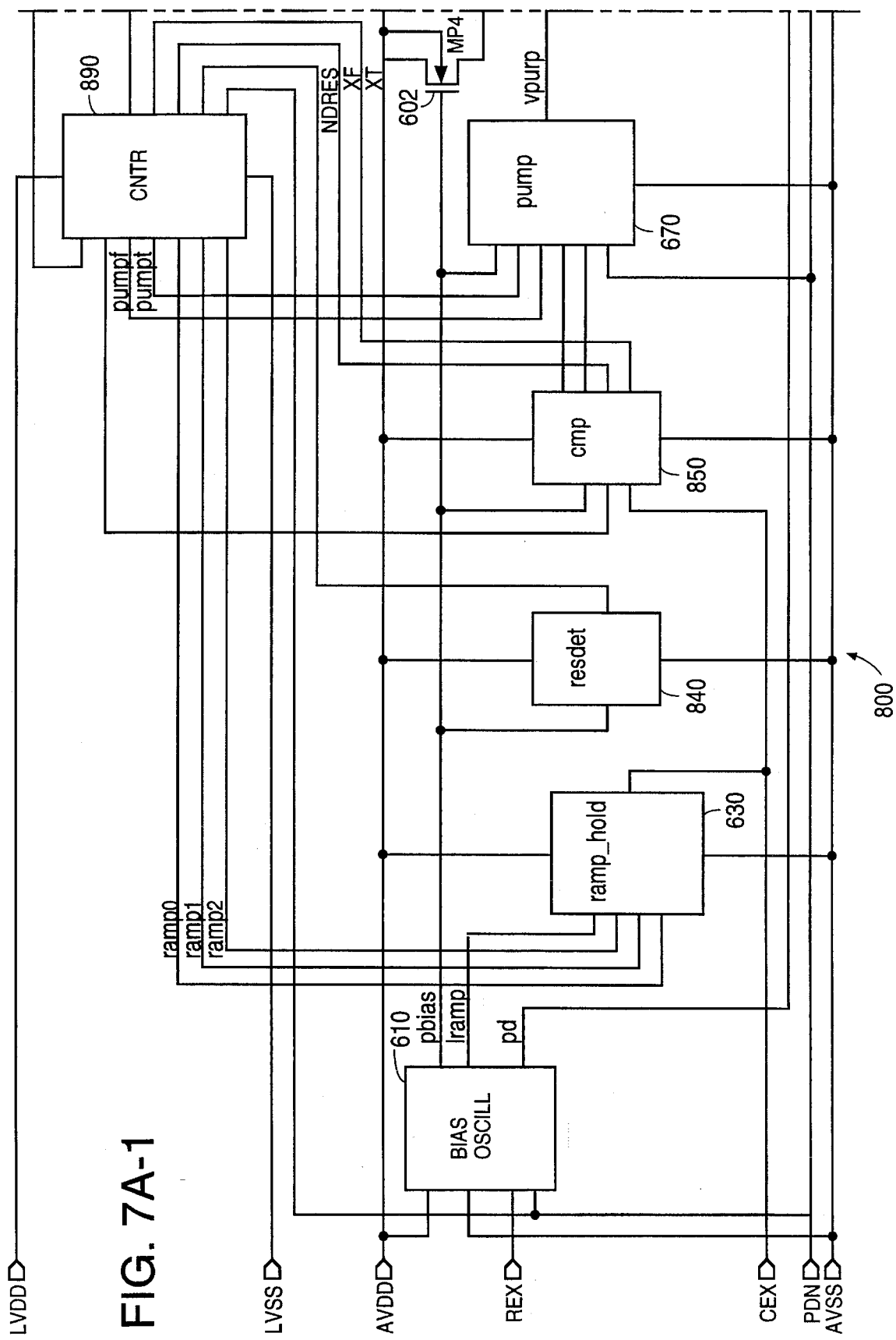
FIGS. 7(a) through 7(d) show a schematic block diagram of an RC oscillator circuit which includes a capability for detecting the absence of the resistor R or the capacitor C.
Figure 7A:
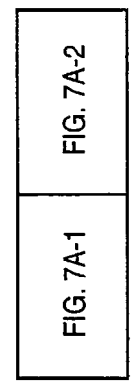
Figures 2, 7A:
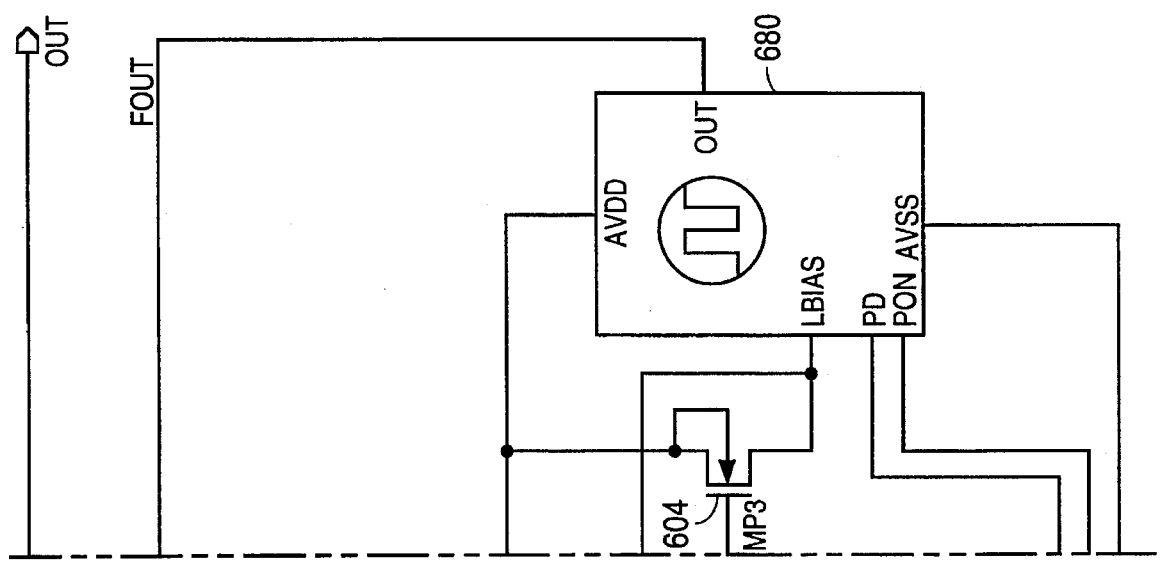
Figure 7B:
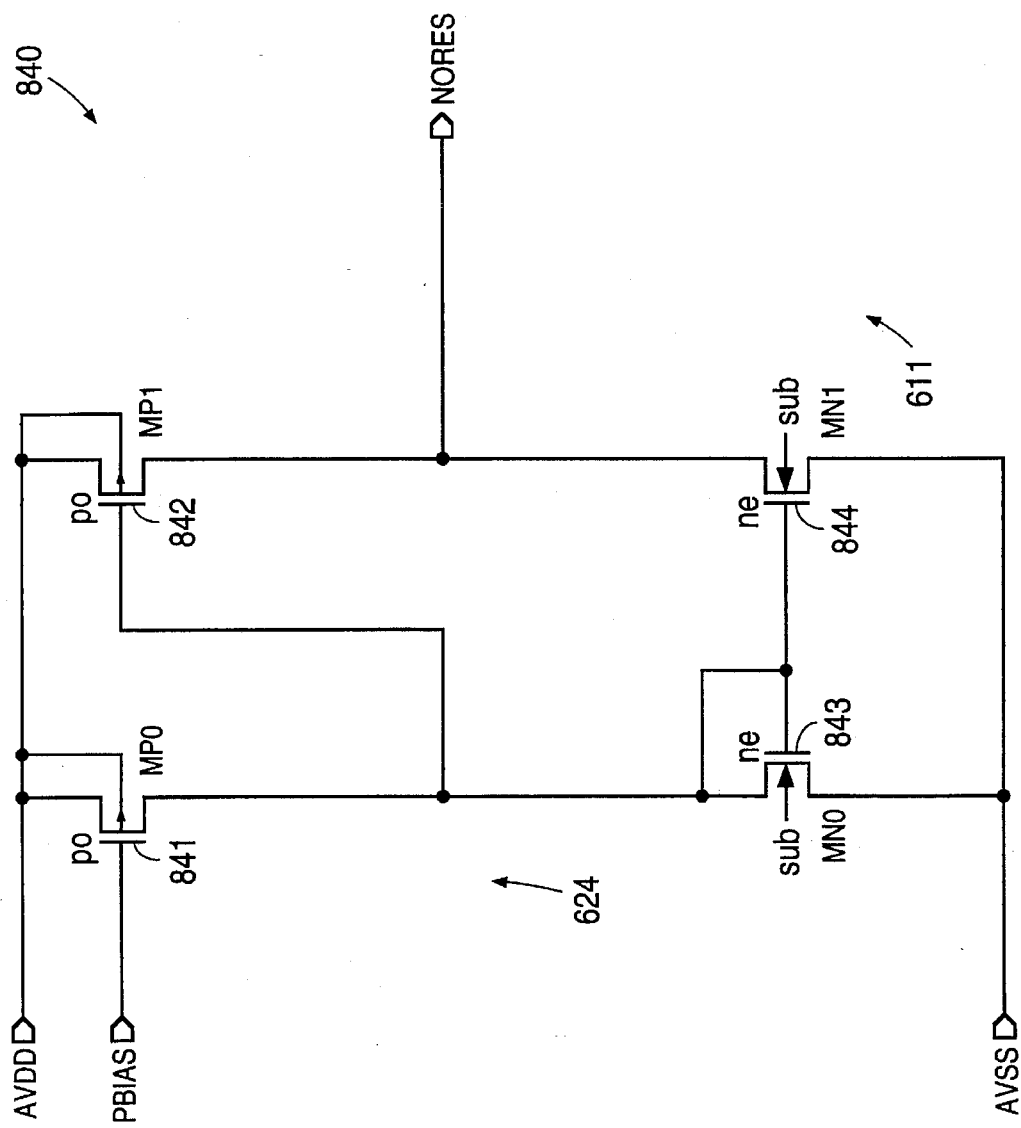

Referring to FIG. 7(b), the resistor detector 840 includes P-channel MOS transistors (MP0) 841 and (MP1) 842 and N-channel transistors (MN0) 843 and (MN1) 844. The P-bias signal on PBIAS line controls the gate terminal of P-channel MOS transistor (MP0) 841 and a signal on the connected drain terminals of transistors (MP0) 841 and (MN0) 843 controls the gate terminal of P-channel MOS transistor (MP1) 842. A signal on the connected drain terminals of transistors (MP1) 842 and (MN1) 844 controls the no resistor signal on NORES line.

The P-bias signal on PBIAS line from bias circuit 610 supplies a defined current for any MOS transistor that is connected to PBIAS line so that some defined drain current is supplied by the MOS transistor, when resistor Rext is connected.

When the external resistor Rext is removed, P-bias goes to an extremely small voltage relative to the power supply source VDD and the bias current is reduced to essentially zero current. The P-bias signal controls the gate terminal of P-channel MOS transistor (MP0) 841 so that essentially no current other than leakage current flows from the drain of transistor (MP0) 841. The drain current of P-channel MOS transistor (MP0) 841 flows to N-channel MOS transistor (MN0) 843 and is mirrored by the current mirror output transistor (MN1) 844. Accordingly, essentially nothing more than leakage current pulls down on the drain of N-channel MOS transistor (MN1) 844. Because of the low current flowing through N-channel MOS transistor (MN0) 843, the drain voltage of transistor (MN0) 843 approaches ground reference VSS, causing P-channel MOS transistor (MP1) 842 to turn on harder. As transistor (MP1) 842 turns on harder, the No Resistance signal is pulled up because N-channel MOS transistor (MN1) 844 generates essentially no pull-down current.

When the external resistor Rext is connected, P-bias goes to a voltage level approximately equal to threshold voltage plus a gate drive voltage. A defined current having a measurable magnitude is generated by P-channel MOS transistor (MP0) 841 which increases the gate voltage applied to N-channel MOS transistor (MN0) 843. This voltage exceeds the MOS threshold voltage applied to transistor (MN0) 843 and raises the voltage applied to the gate of P-channel MOS transistor (MP1) 842, decreasing the available drain current of transistor (MP1) 842 but not necessarily entirely deactivating this transistor. N-channel MOS transistor (MN1) 844 mirrors the current of N-channel MOS transistor (MN0) 843. If the pulldown current of N-channel MOS transistor (MN1) 844 exceeds the drain current of P-channel MOS transistor (MP1) 842, the NORES output terminal produces a logic 0 output voltage.

In summary, if some defined current is flowing in the resistor detector 840 due to the presence of an external resistor Rext, N-channel MOS transistor (MN1) 844 pulls down and P-channel MOS transistor (MP1) 842 tends to turn off, causing the no resistor signal on NORES line to go low. When external resistor Rext is not present, P-channel MOS transistor (MP1) 842 turns on and N-channel MOS transistor (MN1) 844 turns off, causing NORES line to go high. The NORES line is connected to the frequency counter 890 to gate off the internal clock signal of the RC oscillator 800.

Figure 7C:
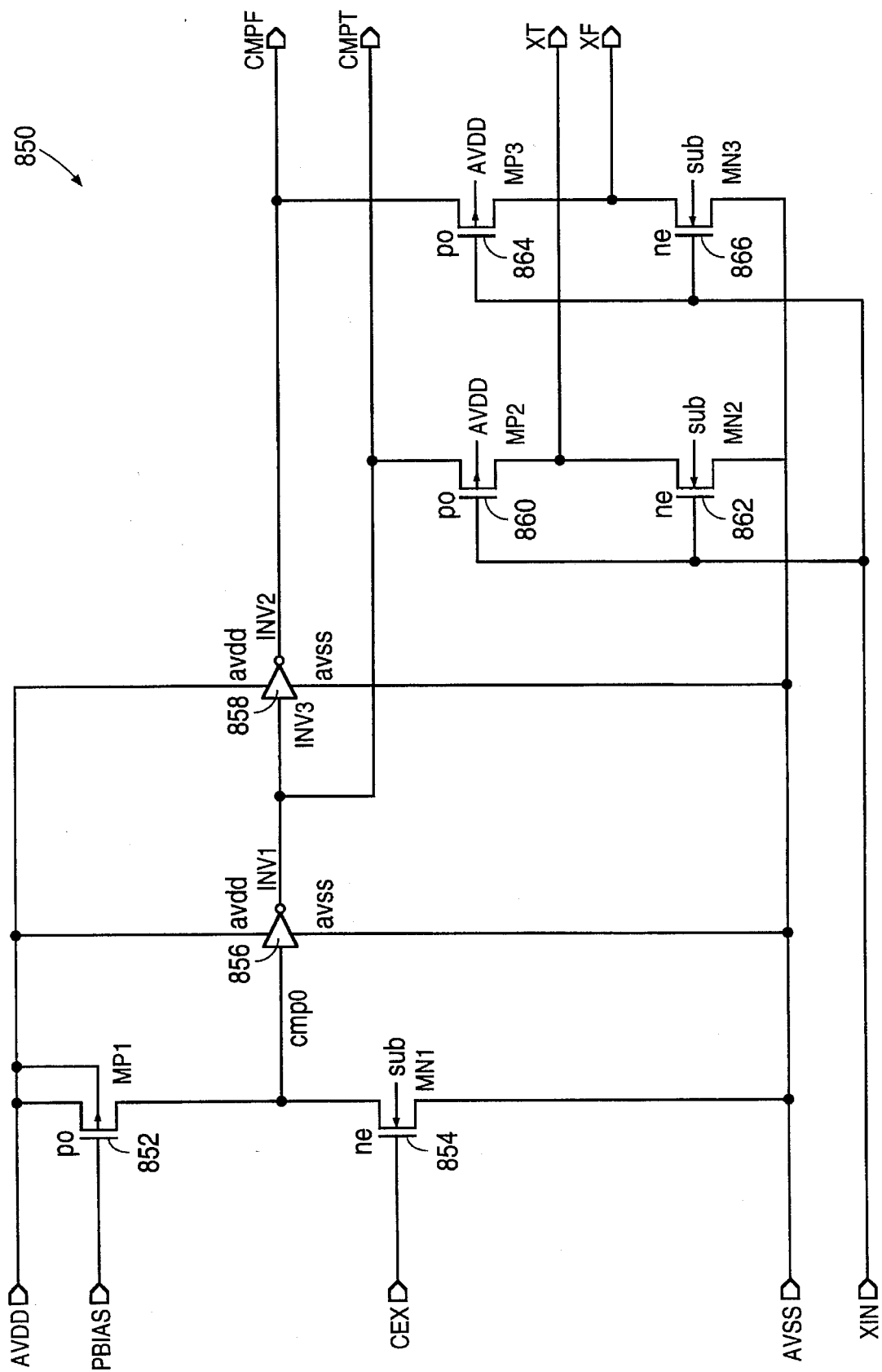

Referring to FIG. 7(c), a comparator 850 includes a P-channel MOS transistor (MP1) 852 and an N-channel MOS transistor (MN1) 854, which are connected at their drain terminals between the power supply source VDD and a ground reference VSS. The gate of the P-channel MOS transistor (MP1) 852 is controlled by a P-bias signal on PBIAS line from the bias circuit 610. The drain terminals of the transistors (MP1) 852 and (MN1) 854 are connected to a first inverter 856 which is further connected to a second inverter 858 to generate a comparator true signal on a CMPT line and a complementary comparator false signal on a CMPF line. These circuit elements are substantially similar to the circuit elements of the comparator 650 shown in FIG. 5(b).

In addition to detecting the absence of a resistor, RC oscillator 800 also is adapted to detect the absence of an external capacitor Cext. Comparator 850 is modified from the comparator 650 circuit embodiment to include four additional transistors for forming complementary control signals XT and XF, which are used to determine the absence of the external capacitor Cext. The additional four transistors include two P-channel MOS transistors (MP2) 860 and (MP3) 864 and two N-channel MOS transistors (MN2) 862 and (MN3) 866. Transistors are paired so that transistors (MP2) 860 and (MN2) 862 are connected at their drains to form a control signal line XT and are connected between comparator true CMPT line and ground reference VSS. Transistors (MP3) 864 and (MN3) 866 are connected at their drains to form control signal line XF and are connected between comparator false CMPF line and ground reference VSS. An input signal control line XIN from frequency counter 890 is connected to the gate terminal of each of transistors (MP2) 860, (MN2) 862, (MP3) 864 and (MN3) 866. Input signal control line XIN of comparator 850 is connected to control line XOUT of frequency counter 890, shown in FIG. 7(d).

When the external capacitor Cext is removed a somewhat unpredictable circuit behavior results. In some instances, removal of the external capacitor Cext causes the oscillator to simply stop producing an oscillating signal. In other instances, the RC oscillator 800 oscillates at an extremely high frequency. In many applications, high frequency oscillation is inappropriate or harmful. For example in a cardiac pacemaker, a very high frequency oscillating signal applied to the heart is a dangerous condition.

Comparator 850 generates complementary control signals XT and XF to detect the absence of the external capacitor Cext. Frequency counter 890 is also modified to respond to detection of a missing capacitor Cext.

A signal is generated on control line XIN when frequency counter 890 reaches a selected count in the counting cycle. The count is selected to occur at the beginning of the ramp and hold sequence of the timing cycle described hereinbefore with respect to the timing diagram shown in FIG. 3. In particular, the signal on control line XIN goes low at the beginning of interval T1 401 of the ramp and hold sequence such that P-channel MOS transistors (MP2) 860 and (MP3) 864 are turned on simultaneously. As P-channel MOS transistors (MP2) 860 and (MP3) 864 are simultaneously turned on, control signal true line XT is connected to comparator true line CMPT and control signal false line XF is connected to comparator false line CMPF, respectively. Therefore, at the beginning of the ramp and hold sequence, the control true and control false lines XT and XF indicate the state of the comparator. On a subsequent count of the frequency counter 890 and thereafter until the selected count is attained in the next cycle, the signal on control line XIN is high so that, any time after the first part of the ramp and hold cycle under normal conditions, P-channel MOS transistors (MP2) 860 and (MP3) 864 turn off and N-channel MOS transistors (MN2) 862 and (MN3) 866 turn on causing both the control true signal on line XT and the control false signal on line XF go low. Thus, the beginning of the ramp and hold cycle is the only time that the control true and control false signals are set for analysis. Frequency counter 890 includes circuits that read the control true and control false signals on control lines XT and XF to detect the presence or absence of the external capacitor Cext.

Figures 1, 7D:
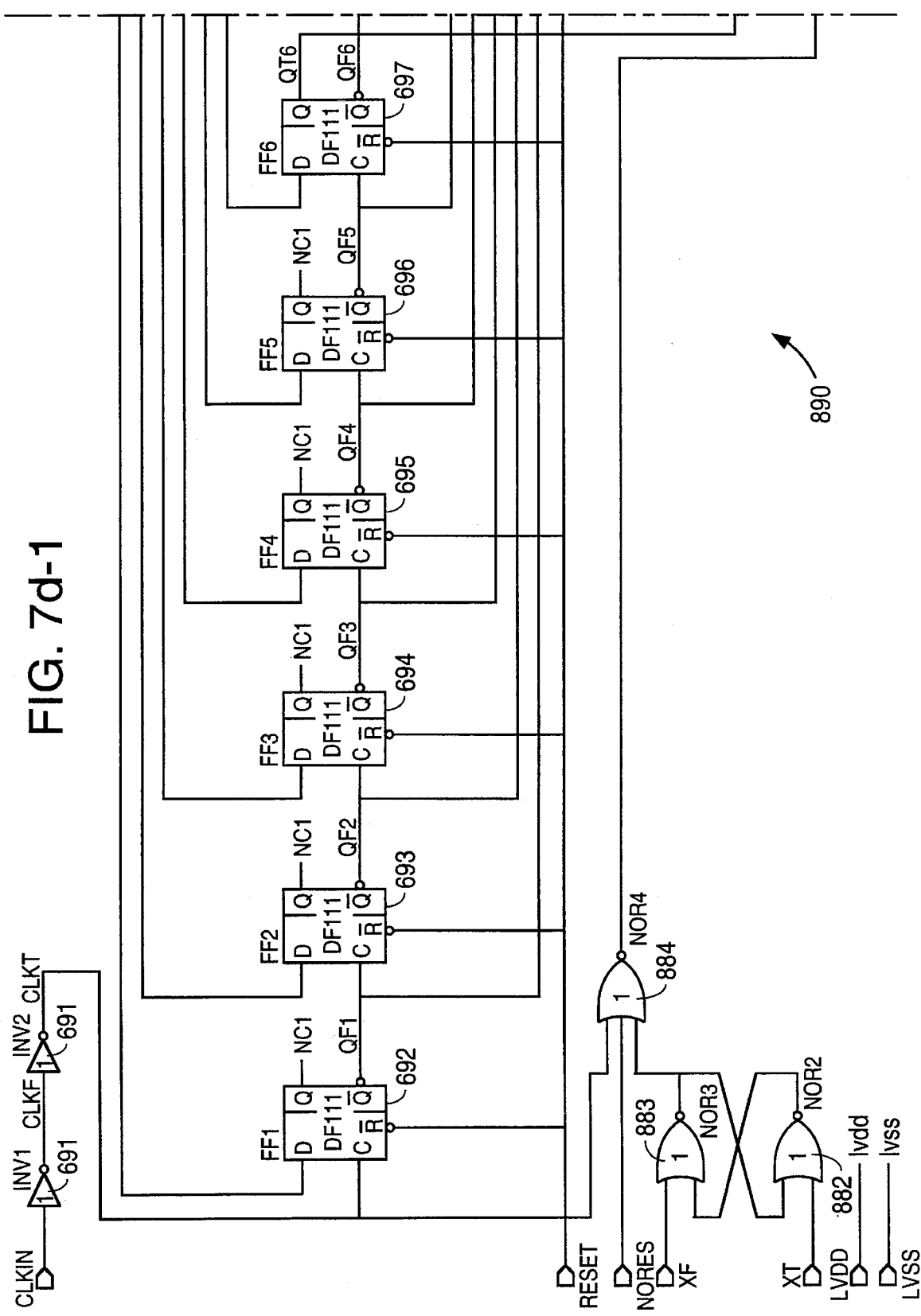
Figures 2, 7D:
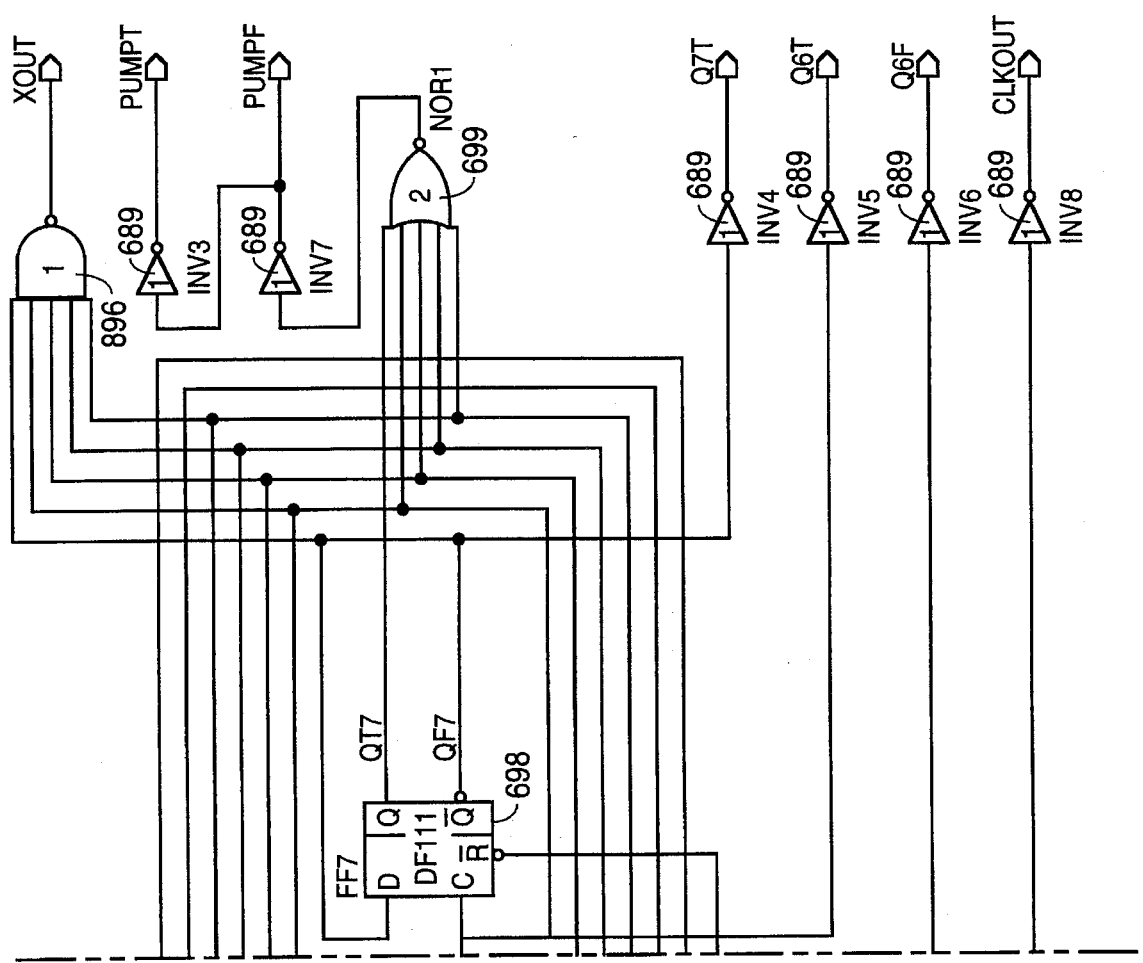

In FIG. 7(d), frequency counter 890 is a 128-count nonsynchronous (ripple) counter which includes two input inverters 691, seven D-type flip-flops 692, 693, 694, 695, 696, 697 and 698, a five-input NOR gate 699, and six output inverters 689. Generally, these circuit elements of frequency counter 890 are structurally and functionally the same as corresponding elements of the frequency counter 690 shown in FIG. 5(f) except that three additional D flip-flops are utilized to furnish additional counting resolution. The five-input NOR gate 699 receives $\overline{Q}$ output lines from D flip-flops 695, 696, 697 and 698 which are selected to decode the smallest interval which is practical for a particular counter application. Other embodiments of a frequency counter may utilize other decoding functions.

Frequency counter 890 also includes circuits elements for reading signals on NORKS, XT and XF lines and analyzing these signals to determine the presence or absence of external capacitor Cext and external resistor Rext. These circuit elements include two two-input NOR gates (NOR2) 882 and (NOR3) 883 and a three-input NOR gate (NOR4) 884. Frequency counter 890 also includes a five-input NAND gate 886 to furnish timing signals for capacitor detection. The five-input NAND gate 886 receives Q output lines from D flip-flops 695, 696, 697 and 698 and decodes the clock signals to activate a signal on the XOUT line at the beginning of the ramp and hold sequence.

In other embodiments, a clock signal is applied directly from the oscillator 680 to various circuit blocks. However, in RC oscillator 800, a clock signal is received by frequency counter 890 on clock input line CLKIN and gated by three-input NOR gate (NOR4) 884 to produce a modified clock signal on clock output line CLKOUT which is applied to the various circuit blocks. Other input lines to three-input NOR gate (NOR4) 884 are received from the NORES signal line from resistor detector 840 and from the output line of two-input NOR gate (NOR3) 883. If the signal on the NORES line goes high or if NOR gate (NOR3) 883 goes high, a high signal is applied to three-input NOR gate (NOR4) 884 which forces a low output signal and prevents the clock signal from passing.

The absence of external capacitor Cext is determined by examining the state of comparator 850 at the beginning of the ramp and hold period. Under normal operating conditions, a compare operation only occurs toward the end of the ramp and hold operation. If a premature ramp operation occurs at the beginning of the ramp and hold function, a control signal on the XT line goes high early and a control signal to the XF line goes low early. XT line applies one input signal to two-input NOR gate (NOR2) 882. XF line applies one input signal to two-input NOR gate (NOR3) 883 and the second input signal is received from the output line of two input NOR gate (NOR2) 882. The output line of NOR gate (NOR3) 883 is applied to the second input line of NOR gate (NOR2) 882 and to an input line of three-input NOR gate (NOR4) 884. Connected in this manner, NOR gates (NOR2) 882 and (NOR3) 883 form a latch which looks for the last occurrence of a logic high signal on the XT line or the XF line which deactivated the latch. Thus if the comparator 850 compares too early, a logic high signal is passed to three-input NOR gate (NOR4) 884, preventing the clock signal from passing.

RC oscillator 800 is fixed in this condition because for each ramp and hold timing cycle, the control signal on line XT goes high, activating the NOR gate (NOR4) 884. RC oscillator 800 is cleared from this condition by changing cycle timing so that a compare does not take place at the beginning of the ramp and hold period. This timing is changed, for example, by replacing the external capacitor Cext.

Figure 8A:
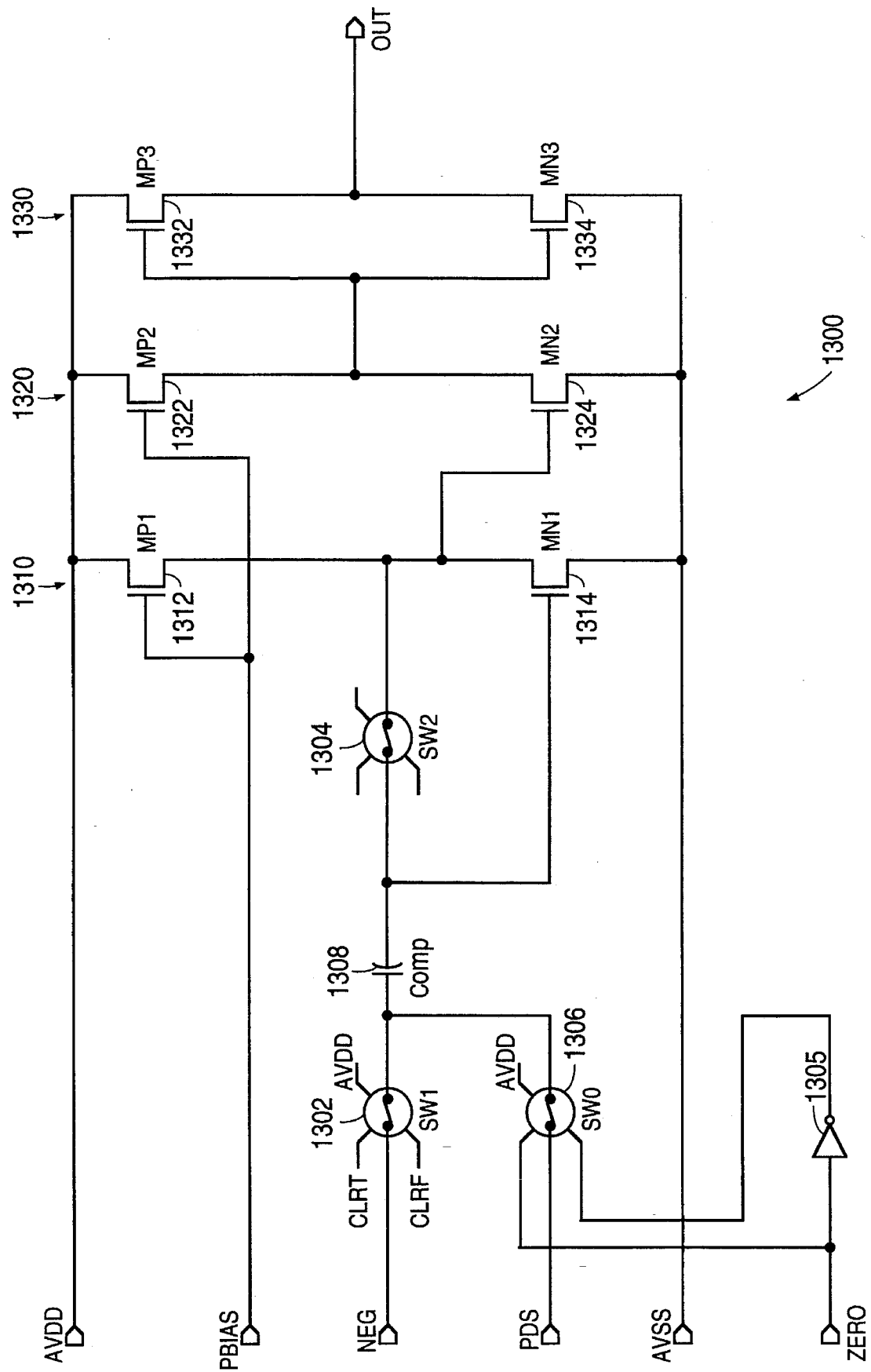
FIGS. 8(a) and 8(b) respectively illustrate a transistor-level schematic diagram of a clocked comparator circuit and a timing diagram showing the operation of the docked comparator circuit.

Referring to FIG. 8(a), there is shown a transistor-level schematic diagram of a clocked comparator circuit 1300 which has a quick response following a clock signal edge. In various embodiments of an RC oscillator, the clocked comparator circuit 1300 may be substituted for comparators such as comparator 650 shown in FIG. 5(a), comparator 750 shown in FIGS. 6(c) and 6(f), and comparator 850 shown in FIGS. 7(a) and 7(c).

Clocked comparator 1300 is a fully differential comparator having both a positive input terminal and a negative input terminal. However, in various embodiments clocked comparator 1300 is suitable for implementation in any application. For example, clocked comparator 1300 is used as a single-input comparator simply by tying either the positive input terminal or the negative input terminal to a reference voltage terminal. The reference terminal to which the input terminal is tied and the polarity of the input terminal tied to the reference terminal are determined by the desired polarity of the output signal of the comparator 1300.

The clocked comparator 1300 is controlled using two control signals from an external frequency counter. One control signal is a clock signal which activates the comparator 1300. A second control signal is a zero signal which generates a timing phase that precedes the clock signal.

Clocked comparator 1300 includes a first inverter stage 1310, a second inverter stage 1320 and a third inverter stage 1330. The first inverter stage 1310 includes a P-channel MOS transistor (MP1) 1312 and an N-channel MOS transistor (MN1) 1314, each having a source to drain pathway connected in series between the power supply terminal VDD and the ground reference terminal VSS. P-channel MOS transistor (MP1) 1312 has a gate connected to the pbias line. The second inverter stage 1320 includes a P-channel MOS transistor (MP2) 1322 and an N-channel MOS transistor (MN2) 1324 each having a source to drain pathway connected in series between the power supply terminal VDD and the ground reference terminal VSS. P-channel MOS transistor (MP2) 1322 has a gate connected to the pbias line. N-channel MOS transistor (MN2) 1324 has a gate connected to a node connecting the drain terminals of transistors (MP1) 1312 and (MN1) 1314. The third inverter stage 1330 includes a P-channel MOS transistor (MP3) 1332 and an N-channel MOS transistor (MN3) 1334 each having a source to drain pathway connected in series between the power supply terminal VDD and the ground reference terminal VSS. Both P-channel MOS transistor (MP3) 1332 and N-channel MOS transistor (MN3) 1334 have gates connected to the node connecting the drain terminals of transistors (MP2) 1322 and (MN2) 1324. An output terminal OUT is connected to a node between the drain terminals of transistors (MP3) 1332 and (MN3) 1334.

A negative differential input terminal NEG is connected to the input capacitor Ccmp 1308 by a first transfer gate switch (SW1) 1302. A positive differential input terminal POS is connected to capacitor Ccmp 1308 by a second transfer gate switch (SW0) 1306. The positive POS and negative NEG differential input terminals of clocked comparator 1300 are switchable by switching the polarity of the clock and $\overline{\text{clock}}$ signals of the transfer gate switches (SW1) 1302 and (SW0) 1306. A zero phase control terminal ZERO is connected to a first control terminal of second transfer gate switch (SW0) 1306 and is connected to an inverter 1305 to furnish an inverted zero signal to a second control terminal of second transfer gate switch (SW0) 1306. The output terminal of capacitor Ccmp 1308 is connected to the gate of N-channel transistor (MN1) 1314. A third switch (SW2) 1304, when activated, provides a conductive path between the gate and drain of N-channel transistor (MN1) 1314.

Figure 8B:
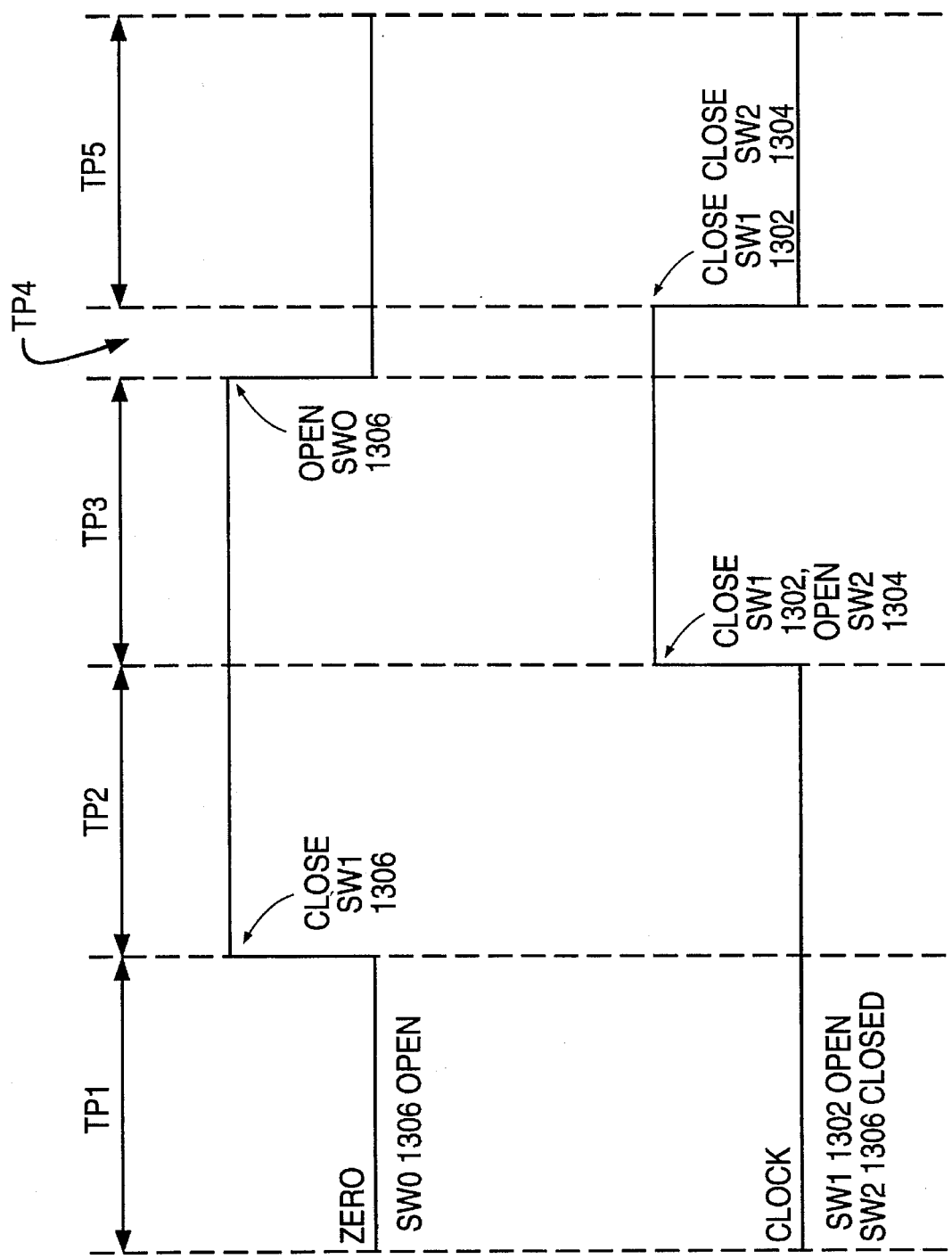

Referring to the timing diagram shown in FIG. 8(*b*), operation of the clocked comparator 1300 is described. In timing phase TP1, the signal on the zero phase control terminal ZERO is a logic 0, second transfer gate switch (SW0) 1306 is open so that the positive differential input terminal POS is isolated from the rest of the clocked comparator 1300. The clock and $\overline{\text{clock}}$ signals to the transfer gate switches (SW1) 1302 and (SW2) 1304 are configured so that transfer gate switch (SW1) 1302 is open and transfer gate switch (SW2) 1304, which is always complementary to transfer gate switch (SW1) 1302, is closed. In this configuration N-channel MOS transistor (MN1) 1314 is diode-connected so that any current that is mirrored from transistor (MP1) 1312 operates to self-bias transistor (MN1) 1314 to a level very close to the switching threshold voltage of the first invertor stage 1310 transistors (MP1) 1312 and (MN1) 1314. This switching threshold voltage is the same as the gate to source voltage of N-channel MOS transistor (MN1) 1314. Furthermore, the gate to source voltage $V_{GSN1}$ of N-channel MOS transistor (MN1) 1314 is essentially the same as the switching threshold voltage of second inverter stage 1320 transistors (MP2) 1322 and (MN2) 1324. Thus in timing phase TP1, the first and second inverter stages 1310 and 1320 have essentially equivalent operating conditions, having essentially the same switching threshold voltage. However, the second inverter stage 1320 has a relatively high gain while the first inverter stage 1310 has a small gain.

In timing phase TP2, the signal on the zero phase control terminal ZERO goes to a logic 1, causing inverter 1308 to have a logic 0 inverted zero phase signal. The logic 1 zero phase control signal ZERO and logic 0 inverted zero phase control applied to second transfer gate switch (SW0) 1306 close the second transfer gate switch (SW0) 1306, connecting the positive differential input at terminal POS to the gate of N-channel MOS transistor (MN1) 1314 and precharging the capacitor Ccmp.

In timing phase TP3, the clock and $\overline{\text{clock}}$ signals to the transfer gate switches (SW1) 1302 and (SW2) 1304 are switched so that transfer gate switch (SW1) 1302 is closed and transfer gate switch (SW2) 1304 is opened. The precharged capacitor Ccmp applies a voltage to the gate of N-channel MOS transistor (MN1) 1314 so that the gate to source voltage $V_{GSN1}$ of N-channel MOS transistor (MN1) 1314 substantially matches the switching threshold of the first and second inverter stages 1310 and 1320.

In timing phase TP4, the zero signal is changed to open the second transfer gate switch (SW0) 1306. With the first transfer gate switch (SW1) 1302 closed and the third transfer gate switch (SW2) 1304 open, the first inverter stage 1310 is in a condition to switch unless the signal applied to the negative differential input terminal NEG precisely matches the voltage on the capacitor Ccmp. A nearly instantaneous movement, either high or low, of the drain voltage of N-channel MOS transistor (MN1) 1314 results from this condition. The direction of the drain voltage movement depends on the balance of voltages applied to the gate of N-channel MOS transistor (MN1).

Accordingly, any potential difference between the signals on the positive and negative differential input terminals POS and NEG causes the bias point of N-channel MOS transistor (MN1) 1314 to change from its natural bias point, causing the first inverter stage 1310, then the second inverter stage 1320 and then the third inverter stage 1330 to switch.

Three inverter stages 1310, 1320 and 1330 are included in the clocked comparator circuit 1300. Each of the three stages has a gain in the range of approximately ten to fifty. Incorporation of three gain stages advantageously furnishes an exponential increase in gain for the circuit 1300. For example, for a gain of ten for each stage, the overall gain is 10 to the third power or 1000. For a gain of fifty for each stage, the overall gain is 50 to the third power or 125,000.

The clocked comparator circuit 1300 advantageously responds extremely quickly after invoking a clock edge. This quick response results because the drain voltage of N-channel MOS transistor (MN1) 1314 is extremely close to the switching threshold of the first and second inverter stages 1310 and 1320. As a result, a very small change in the input signal to the comparator circuit 1300, for example a fraction of a millivolt, causes the entire circuit to switch.

Advantageously, the clocked comparator 1300 is self-calibrating and does not have an input offset voltage. Accordingly, the clocked comparator 1300 is used in some embodiments for extremely low bias voltages.

The clocked comparator 1300 has no offset voltage because only a single transistor, N-channel MOS transistor (MN1) 1314 is used for comparison of input voltages. In contrast, other comparators compare the threshold voltage of one transistor to the threshold voltage of a second transistor.

The description of certain embodiments of this invention is intended to be illustrative and not limiting. Numerous other embodiments will be apparent to those skilled in the art, all of which are included within the broad scope of this invention. Although the illustrative component detector circuits are described in the context of an RC oscillator circuit, the circuits are also applicable to other applications such as Wilson current mirror circuits, threshold detecting bias circuits, operational amplifiers, comparators and, for example, a combined CMOS differential amplifier and comparator circuit. Specific illustrative embodiments of a component detector circuit in accordance with the invention include various CMOS implementations. Other technology embodiments including BiCMOS, bipolar, gallium arsenide (GaAs) and hybrid embodiments are also within the scope of the invention. In some of these embodiments, the frequency operation of timing circuits is extended to 10 GHz or higher. Furthermore, in other embodiments, low voltage operation of a circuit is obtained using a 2.5 V to 3.5 V submicron CMOS technology configuration.

APPENDIX

Figure 9A:
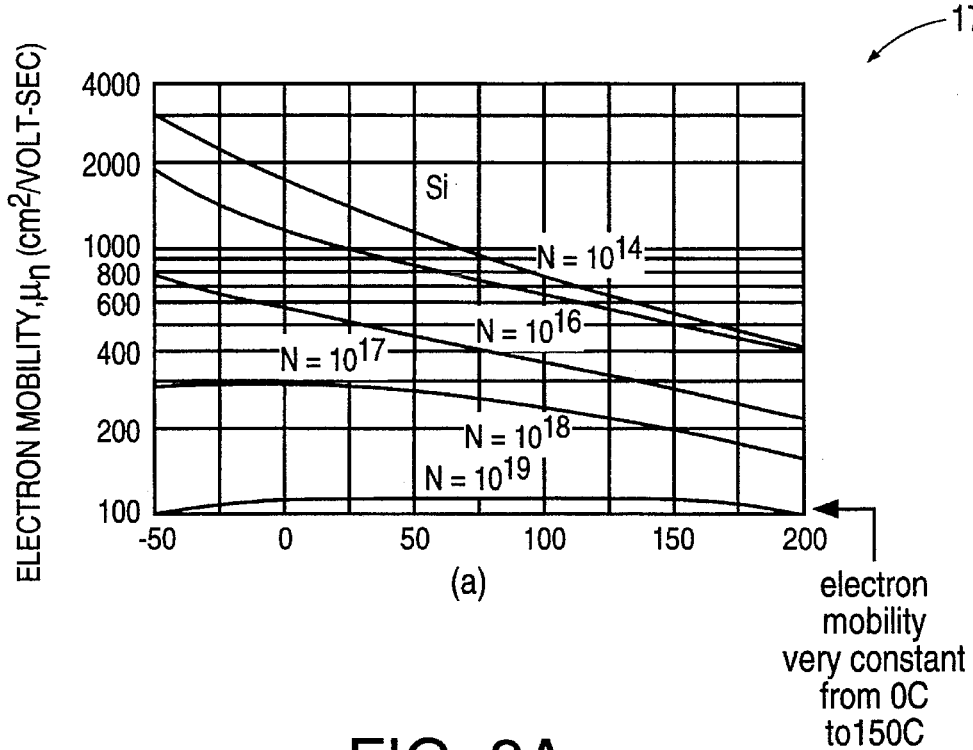
FIGS. 9(a) and 9(b) respectively are graphs that illustrate electron (N-type carrier) mobility and hole (P-type carrier) mobility.
Figure 9B:
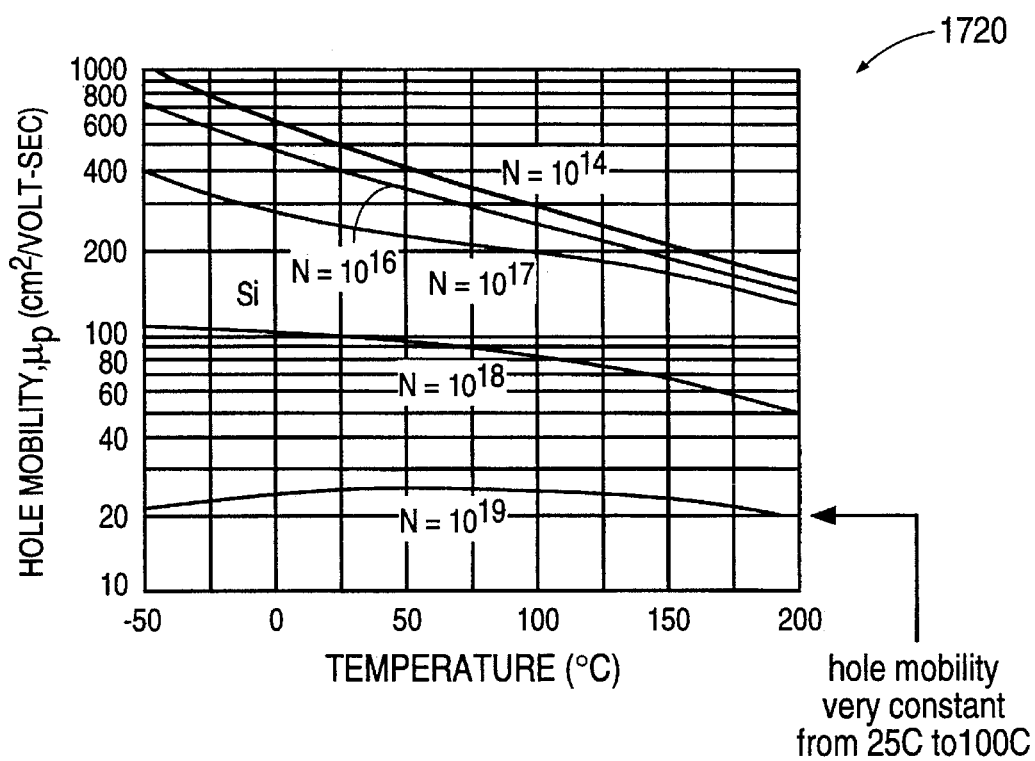

"Physics of Semiconductor Devices", First Edition, Sze, 1969, which is known in the electronics industry and semiconductor industry as a standard workbook describing the mathematical and physical models of semiconductor devices. FIGS. 9(a) and 9(b), which are reprinted from page 41 of Sze, respectively show a first graph 1710 of electron mobility or mobility of N type carriers in N type silicon and a second graph 1720 of hole mobility or mobility of P type carriers in P type silicon. In both graphs 1710 and 1720, the vertical axis shows mobility in $cm^2/V$-s and the horizontal axis shows temperature. Individual lines are shown for various carrier concentrations.

At a carrier concentration of approximately $10^{14}$ carriers/$cm^3$, mobility depends highly on temperature. As carrier concentration is increased, carrier mobility decreases. As carrier mobility decreases, temperature dependence decreases and substantially disappears at a concentration of approximately $10^{19}$ carriers/$cm^3$ for both electron and hole mobility. However, electron mobility is more uniform with a varying temperature, showing a substantially flat characteristic from 0° C. to 150° C. Hole mobility, in contrast, shows a very flat characteristic from about 25° C. to about 100° C.

In an integrated circuit, it is advantageous to utilize a diffused resistor having operating characteristics that do not vary with changes in temperature. Therefore, for an RC oscillator circuit that includes an on-chip resistor for the RC network, it is advantageous to use a resistor having a carrier concentration of approximately $10^{19}$ carriers/$cm^3$, whether the resistor is a diffusion, a diffused resistor or an on-chip polysilicon resistor.

What is claimed is:

1. A resistor detecting circuit comprising:

a biasing circuit coupled to the resistor, the biasing circuit generating a bias current;

a bias current threshold detector coupled to the biasing circuit; and means coupled to the bias current threshold detector for generating a signal indicative that the bias current is lower than threshold;

wherein the biasing circuit comprises:
   a first P-channel transistor having a source terminal coupled to a voltage source, a drain terminal coupled to the bias current threshold detector and a gate terminal coupled to the drain terminal;
   a second P-channel transistor coupled to the first P-channel transistor in a current mirror configuration having a source terminal coupled to the voltage source, a drain terminal and a gate terminal coupled to the gate terminal of the first P-channel transistor;
   a third P-channel transistor coupled to the first P-channel transistor in a current mirror configuration having a source terminal coupled to the voltage source, a drain terminal and a gate terminal coupled to the gate terminal of the first P-channel transistor;
   a first N-channel transistor having a drain terminal coupled to the drain terminal of the first P-channel transistor, a source terminal coupled to a resistor node and a gate terminal;
   a second N-channel transistor having a drain terminal coupled to the drain terminal of the second P-channel transistor, a source terminal and a gate terminal coupled to the drain terminal and to the gate terminal of the first N-channel transistor;
   a third N-channel transistor having a drain terminal coupled to the source terminal of the second N-channel transistor, a source terminal coupled to a ground reference and a gate terminal coupled to the drain terminal.

2. A circuit according to claim 1, wherein the signal generating means comprises:

means coupled to the bias current threshold detector for interrupting a system clock timing signal when the bias current is lower than threshold.

3. A circuit according to claim 1, wherein the resistor detecting circuit is an integrated circuit and the resistor is an external, nonintegrated circuit element.

4. A resistor detecting circuit comprising:

a biasing circuit coupled to the resistor, the biasing circuit generating a bias current;

a bias current threshold detector coupled to the biasing circuit; and means coupled to the bias current threshold detector for generating a signal indicative that the bias current is lower than threshold;

wherein the biasing circuit comprises:
   a first P-channel transistor having a source terminal coupled to a voltage source, a drain terminal and a gate terminal coupled to the drain terminal;
   a second P-channel transistor having a source terminal coupled to the voltage source, a drain terminal and a gate terminal coupled to the drain terminal;
   a third P-channel transistor coupled to the second P-channel transistor in a current mirror configuration having a source terminal coupled to the voltage source, a drain terminal and a gate terminal coupled to the gate terminal of the second P-channel transistor;
   a fourth P-channel transistor having a source terminal coupled to the voltage source, a drain terminal coupled to the bias current threshold detector and a gate terminal coupled to the drain terminal;
   a fifth P-channel transistor coupled to the fourth P-channel transistor in a current mirror configuration having a source terminal coupled to the voltage source, a drain terminal and a gate terminal coupled to the gate terminal of the fourth P-channel transistor;
   a first N-channel transistor having a drain terminal coupled to the drain terminal of the first P-channel transistor, a source terminal coupled to a ground reference and a gate terminal;
   a second N-channel transistor having a drain terminal coupled to the drain terminal of the second P-channel transistor, a source terminal coupled to the gate terminal of the first N-channel transistor and a gate terminal coupled to the drain terminals of the first P-channel transistor and the first N-channel transistor;
   a third N-channel transistor having a drain terminal coupled to the drain terminal of the third P-channel transistor, a source terminal coupled to a ground reference and a gate terminal;
   a fourth N-channel transistor having a drain terminal coupled to the drain terminal of the fourth P-channel transistor, a source terminal coupled to a resistor node, and a gate terminal coupled to the drain terminals of the third P-channel transistor and the third N-channel transistor.

5. A circuit according to claim 4, wherein the signal generating means comprises:

means coupled to the bias current threshold detector for interrupting a system clock timing signal when the bias current is lower than threshold.

6. A circuit according to claim 4, wherein the resistor detecting circuit is an integrated circuit and the resistor is an external, nonintegrated circuit element.

7. A resistor detecting circuit comprising:
a biasing circuit coupled to the resistor the biasing circuit generating a bias current;
a bias current threshold detector coupled to the biasing circuit; and
means coupled to the bias current threshold detector for generating a signal indicative that the bias current is lower than threshold;
   wherein the bias current threshold detector comprises:
      a first P-channel transistor having a source terminal coupled to a voltage source, a drain terminal and a gate terminal coupled to the biasing circuit;
      a first N-channel transistor having a source terminal coupled to a ground reference, and a drain terminal and a gate terminal which are intercoupled and coupled to the drain terminal of the first P-channel transistor;
      a second P-channel transistor having a source terminal coupled to the voltage source, a drain terminal and a gate terminal coupled to the coupled drain terminals of the first P-channel transistor and the first N-channel transistor;
      a second N-channel transistor having a source terminal coupled to the ground reference, a drain terminal coupled to the drain terminal of the second P-channel transistor and a gate terminal coupled to the gate terminal of the first N-channel transistor; and
      a threshold signal output terminal coupled to the drain terminals of the second P-channel transistor and the second N-channel transistor.

8. A circuit according to claim 7, wherein the signal generating means comprises:
   means coupled to the bias current threshold detector/br interrupting a system clock timing signal when the bias current is lower than threshold.

9. A circuit according to claim 7, wherein the resistor detecting circuit is an integrated circuit and the resistor is an external, nonintegrated circuit element.

10. A resistor detecting circuit comprising:
a biasing circuit coupled to the resistor, the biasing circuit generating a bias current;
a bias current threshold detector coupled to the biasing circuit; and
means coupled to the bias current threshold detector for generating a signal indicative that the bias current is lower than threshold;
   wherein the signal generating means comprises:
      a NOR gate having a first input terminal coupled to a system clock timing signal generator and a second input terminal coupled to the bias current threshold detector.

11. A capacitor detecting circuit comprising:
means coupled to a resistor and configured to be coupled to a capacitor for establishing a time constant proportional to an RC product of the resistor and capacitor;
means for determining whether the time constant is within a range of appropriate time constants; and
means coupled to the determining means for generating a signal indicative that the time constant is outside the range of appropriate time constants, which indicates that the capacitor is disconnected from the establishing means.

12. A circuit according to claim 11, further comprising:
an oscillator coupled to the establishing means, the oscillator generating a timing signal having a period of oscillation established by a control signal;
a counter coupled to the oscillator, the counter for counting periods of the timing signal;
a comparator coupled to the establishing means and the oscillator, the comparator comparing an integer multiple of periods of the timing signal to the time constant; and
means coupled to the oscillator and responsive to the comparator for updating the control signal so that the period of oscillation of the timing signal is adjusted toward the time constant.

13. A circuit according to claim 12, wherein:
the establishing means includes:
   a bias circuit coupled to the resistor and configured to be coupled to the capacitor, the bias circuit for generating a bias current; and
the comparator includes:
   a P-channel transistor having a source terminal coupled to a voltage source, a drain terminal and a gate terminal coupled to the bias circuit to receive the bias current;
   an N-channel transistor having a source terminal coupled to a ground reference, a drain terminal coupled to the P-channel transistor drain terminal and a gate terminal configured to be coupled to the capacitor;
   a first inverter having an input terminal coupled to a node at the drain terminals of the P-channel transistor and the N-channel transistor and having an output terminal coupled to a comparator true output signal line; and
   a second inverter having an input terminal coupled to the output terminal of the first inverter and having an output terminal coupled to a comparator false output signal line.

14. A circuit according to claim 13, wherein the determining means comprises:
a sampling circuit coupled to the comparator including:
   a first sampling circuit P-channel transistor having a source terminal coupled to the comparator true line, a drain terminal, and a gate terminal coupled to a sampling signal line;
   a first sampling circuit N-channel transistor having a source terminal coupled to the ground reference, a drain terminal coupled to the drain terminal of the first sampling circuit P-channel transistor, and a gate terminal coupled to the sampling signal line;
   a second sampling circuit P-channel transistor having a source terminal coupled to the comparator false line, a drain terminal, and a gate terminal coupled to the sampling signal line;
   a second sampling circuit N-channel transistor having a source terminal coupled to the ground reference, a drain terminal coupled to the drain terminal of the second sampling P-channel transistor, and a gate terminal coupled to the sampling signal line;
   a sampling circuit signal true output line coupled to a node at the drain terminals of the first sampling circuit P-channel and N-channel transistors; and
   a sampling circuit signal false output line coupled to a node at the drain terminals of the second sampling circuit P-channel and N-channel transistors.

15. A circuit according to claim 14, wherein the determining means comprises:
a first NOR gate having a first input terminal coupled to the sampling circuit signal true output line, a second input terminal and an output terminal;

a second NOR gate having a first input terminal coupled to the sampling circuit signal false output line, a second input terminal coupled to the output terminal of the first NOR gate, and an output terminal coupled to the first NOR gate second input terminal;

a third NOR gate having a first input terminal coupled to a system clock timing signal generator and a second input terminal coupled to one output terminal selected from the output terminals of the first and second NOR gates.

16. A circuit according to claim 12, wherein the determining means comprises:

means coupled to the counter for deriving a sampling signal indicative of a selected count;

a sampling circuit coupled to the comparator to receive a result of the comparison of the timing signal and time constant and coupled to the deriving means to receive the sampling signal.

17. A circuit according to claim 11, wherein the generating means comprises:

a NOR gate having a first input terminal coupled to a system clock timing signal generator and a second input terminal coupled to the determining means.

18. A circuit according to claim 11, wherein the capacitor detecting circuit is an integrated circuit and the capacitor is an external, nonintegrated circuit element.

19. An RC oscillator having a component detecting circuit comprising:

a bias circuit having an input terminal coupled to an RC network resistor, a first output terminal coupled to a ramp line and a second output terminal coupled to a bias line;

a ramp and hold circuit having an input terminal coupled to the ramp line, a control terminal and an output terminal coupled to an RC network capacitor and a hold line;

a comparator having a first input terminal coupled to the bias line, a second input terminal coupled to the hold line and an output terminal;

a charge pump having an input terminal coupled to the comparator output terminal, a control terminal and an output terminal coupled to a pump line;

a core oscillator having an input terminal coupled to the pump line and an output terminal;

a frequency counter having an input terminal coupled to the core oscillator output terminal, a first control terminal coupled to the ramp and hold circuit control terminal, and a second control terminal coupled to the charge pump control terminal; and a component detect circuit having an input terminal coupled to the bias circuit and an output terminal coupled to the frequency counter.

20. An RC oscillator according to claim 19 wherein the component detect circuit is a resistor detecting circuit comprising:

a bias current threshold detector coupled to the bias circuit to receive a bias current; and means coupled to the bias current threshold detector for generating a signal indicative that the bias current is lower than threshold.

21. A circuit according to claim 20, wherein the bias current threshold detector comprises:

a first P-channel transistor having a source terminal coupled to a voltage source, a drain terminal and a gate terminal coupled to the biasing circuit;

a first N-channel transistor having a source terminal coupled to a ground reference, and a drain terminal and a gate terminal which are intercoupled and coupled to the drain terminal of the first P-channel transistor;

a second P-channel transistor having a source terminal coupled to the voltage source, a drain terminal and a gate terminal coupled to the coupled drain terminals of the first P-channel transistor and the first N-channel transistor;

a second N-channel transistor having a source terminal coupled to the ground reference, a drain terminal coupled to the drain terminal of the second P-channel transistor and a gate terminal coupled to the gate terminal of the first N-channel transistor; and a threshold signal output terminal coupled to the drain terminals of the second P-channel transistor and the second N-channel transistor.

22. A circuit according to claim 20, wherein the signal generating means comprises:

means coupled to the bias current threshold detector for interrupting a system clock timing signal when the bias current is lower than threshold.

23. An RC oscillator according to claim 19 wherein the component detect circuit is a capacitor detecting circuit comprising:

means coupled to the RC circuit resistor and configured to be coupled to the RC circuit capacitor for establishing a time constant proportional to an RC product of the resistor and capacitor;

means for determining whether the time constant is within a range of appropriate time constants; and means coupled to the determining means for generating a signal indicative that the time constant is outside the range of appropriate time constants, which indicates that the capacitor is disconnected from the establishing means.

24. A circuit according to claim 23, wherein:

the establishing means is coupled to the core oscillator, the core oscillator generating a timing signal having a period of oscillation established by a control signal;

the frequency counter coupled to the oscillator counts periods of the timing signal;

the comparator coupled to the establishing means and the oscillator compares an integer multiple of periods of the timing signal to the time constant the circuit further comprising:

means coupled to the oscillator and responsive to the comparator for updating the control signal so that the period of oscillation of the timing signal is adjusted toward the time constant.

25. A circuit according to claim 24, wherein:

the establishing means includes:

a bias circuit coupled to the resistor and configured to be coupled to the capacitor, the bias circuit for generating a bias current; and the comparator includes:

a P-channel transistor having a source terminal coupled to a voltage source, a drain terminal and a gate terminal coupled to the bias circuit to receive the bias current;

an N-channel transistor having a source terminal coupled to a ground reference, a drain terminal coupled to the P-channel transistor drain terminal and a gate terminal configured to be coupled to the capacitor;

a first inverter having an input terminal coupled to a node at the drain terminals of the P-channel transistor and the N-channel transistor and having an output terminal coupled to a comparator true output signal line; and a second inverter having an input terminal coupled to the output terminal of the first inverter and having an output terminal coupled to a comparator false output signal line.

26. A circuit according to claim 25, wherein the determining means comprises:

a sampling circuit coupled to the comparator including:

a first sampling circuit P-channel transistor having a source terminal coupled to the comparator true line, a drain terminal, and a gate terminal coupled to a sampling signal line;

a first sampling circuit N-channel transistor having a source terminal coupled to the ground reference, a drain terminal coupled to the drain terminal of the first sampling circuit P-channel transistor, and a gate terminal coupled to the sampling signal line;

a second sampling circuit P-channel transistor having a source terminal coupled to the comparator false line, a drain terminal, and a gate terminal coupled to the sampling signal line;

a second sampling circuit N-channel transistor having a source terminal coupled to the ground reference, a drain terminal coupled to the drain terminal of the second sampling P-channel transistor, and a gate terminal coupled to the sampling signal line;

a sampling circuit signal true output line coupled to a node at the drain terminals of the first sampling circuit P-channel and N-channel transistors; and a sampling circuit signal false output line coupled to a node at the drain terminals of the second sampling circuit P-channel and N-channel transistors.

27. A circuit according to claim 26, wherein the determining means comprises:

a first NOR gate having a first input terminal coupled to the sampling circuit signal true output line, a second input terminal and an output terminal;

a second NOR gate having a first input terminal coupled to the sampling circuit signal false output line, a second input terminal coupled to the output terminal of the first NOR gate, and an output terminal coupled to the first NOR gate second input terminal;

a third NOR gate having a first input terminal coupled to a system clock timing signal generator and a second input terminal coupled to one output terminal selected from the output terminals of the first and second NOR gates.

28. A circuit according to claim 24, wherein the determining means comprises:

means coupled to the counter for deriving a sampling signal indicative of a selected count;

a sampling circuit coupled to the comparator to receive a result of the comparison of the timing signal and time constant and coupled to the deriving means to receive the sampling signal.

29. A circuit according to claim 23, wherein the generating means comprises:

a NOR gate having a first input terminal coupled to a system clock timing signal generator and a second input terminal coupled to the determining means.

30. A circuit according to claim 23, wherein the capacitor detecting circuit is an integrated circuit and the capacitor is an external, nonintegrated circuit element.

* * * * *

UNITED STATES PATENT AND TRADEMARK OFFICE
CERTIFICATE OF CORRECTION

PATENT NO.    : 5,589,802
DATED         : December 31, 1996
INVENTOR(S)   : Timothy G. O'Shaughnessy and David G. Brown It is certified that error appears in the above-identified patent and that said Letters Patent is hereby corrected as shown below:

Col. 4, line 50 (Equation 2), delete "Rose" and insert --Rosc--;

Col. 4, line 52 (Equation 4), delete "Rose" and insert --Rosc--;

Col. 9, line 45, delete "))" and insert --)--;

Col. 13, line 33, after "signal" insert --on--;

Col. 20, line 25, delete "(MN2)" and insert --(MN4)--; and

Col. 31, line 33, delete "/br". and insert -- for --.

Signed and Sealed this

Twenty-seventh Day of January, 1998

Attest:

BRUCE LEHMAN

*Attesting Officer*    *Commissioner of Patents and Trademarks*